United States Patent [19]
Fujita et al.

[11] Patent Number: 5,282,175
[45] Date of Patent: Jan. 25, 1994

[54] SEMICONDUCTOR MEMORY DEVICE OF DIVIDED WORD LINE

[75] Inventors: Koreaki Fujita; Shuji Murakami; Kenji Anami, all of Hyogo, Japan

[73] Assignee: Mitsubishi Denki Kabushiki Kaisha, Tokyo, Japan

[21] Appl. No.: 705,817

[22] Filed: May 24, 1991

[30] Foreign Application Priority Data

Jun. 5, 1990 [JP] Japan .................................. 2-148218
May 1, 1991 [JP] Japan .................................. 3-100075

[51] Int. Cl.$^5$ .......................................... G11C 11/407
[52] U.S. Cl. .............................. 365/230.06; 365/204; 307/449
[58] Field of Search ................... 365/204, 230.06, 233, 365/185; 307/449

[56] References Cited

U.S. PATENT DOCUMENTS

| | | | |
|---|---|---|---|
| 32,993 | 7/1889 | Anami et al. | 365/230.03 |
| 4,086,500 | 4/1978 | Suzuki et al. | 307/449 |
| 4,429,374 | 1/1984 | Tanimura | 365/230.06 |
| 4,514,829 | 4/1985 | Chao | 365/230.06 |
| 4,554,646 | 11/1985 | Yoshimoto et al. | 365/189 |
| 4,723,229 | 2/1988 | Hartgring et al. | 365/230.03 |
| 4,843,261 | 6/1989 | Chappell et al. | 365/230.06 |
| 4,905,197 | 2/1990 | Urai | 365/204 |

OTHER PUBLICATIONS

Aizaki et al., "A 15 ns 4 Mb CSMO SRAM", IEEE ISSCC Digest of Technical Papers, Thursday, Feb. 15, 1990, pp. 126–127.
Tran et al., "An 8 ns BiCMOS 1 Mb ECL SRAM with a Configurable Memory Array Size", IEEE ISSCC Digest of Technical Papers, Wednesday, Feb. 15, 1989, pp. 36–37.
Kohno et al., "A 14-ns 1-Mbit CMOS SRAM with Variable Bit Organization", IEEE Journal of Solid-State Circuits, vol. 23, No. 5, Oct. 1988, pp. 1060–1066.

Primary Examiner—John S. Heyman
Attorney, Agent, or Firm—Lowe, Price, LeBlanc & Becker

[57] ABSTRACT

In a SRAM of a selected word line structure, each local decoder is connected to a corresponding main word line and a corresponding Z decoder signal line. Each local decoder includes a circuit including two MOS transistors connected in series to each other which circuit has one end grounded. The corresponding local word line is connected to a node between these two transistors. Out of the corresponding main word line and the corresponding Z decoder signal line, one is connected to the gates of these transistors and the other is connected to the other end of said circuit, which the other end is not grounded. The potential on the corresponding local word line attains a high level only when the potential on the signal line connected to the gate of these two transistors, is at a logical level at which the transistor can be turned on and the potential on said one signal line is at a high level. Theoretically, therefore, each local word line is controlled to be activated or inactivated by the operations of two elements in the corresponding local decoder.

62 Claims, 28 Drawing Sheets

FIG. 3
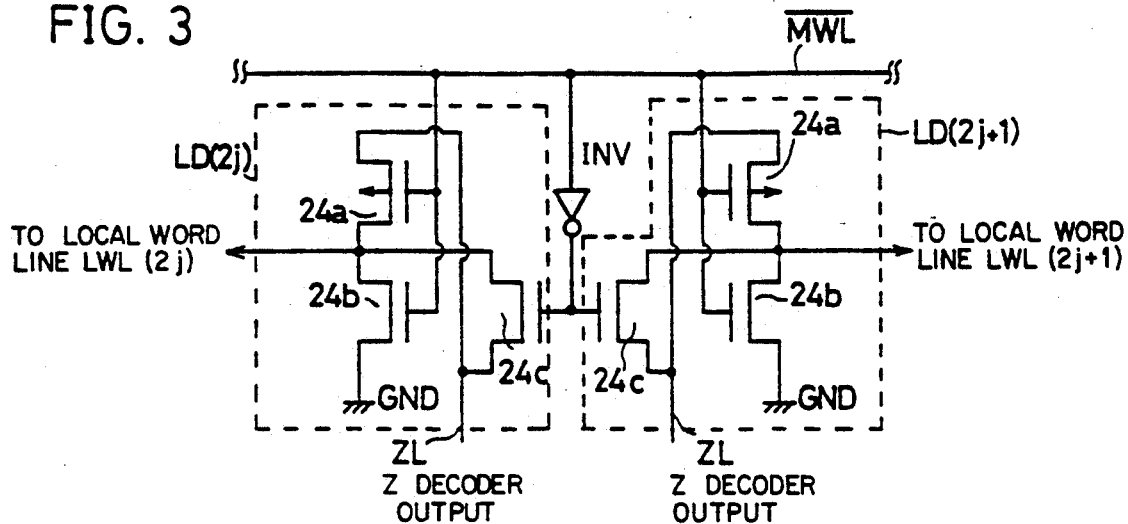
FIG. 4
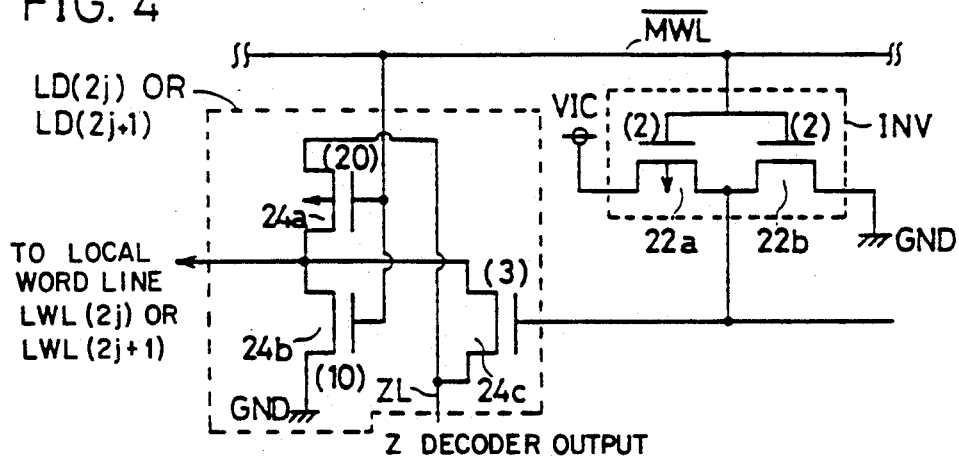
FIG. 5
| POTENTIAL ON THE CORRESPONDING MAIN WORD LINE $\overline{MWL}$ | L | L | H | H |
|---|---|---|---|---|
| POTENTIAL ON THE CORRESPONDING Z DECODER LINE ZL | L | H | L | H |
| POTENTIAL ON THE CORRESPONDING LOCAL WORD LINE LWL(2j)/LWL(2j+1) | L | H | L | L |

FIG.12

| COLUMN ADDRESS ($Z_0$-$Z_4$, $Y_0$~$Y_5$) | | | ROW ADDRESS ($X_0$~$X_8$) | |
|---|---|---|---|---|
| BLOCK ADDRESS | COLUMN ADDRESS IN BLOCK | | HIGHER BITS | LOWER BITS |
| $Z_4$---$Z_1$ | $Z_0$ | $Y_5$---$Y_1$,$Y_0$ | $X_8$ ------ $X_3$,$X_2$ | $X_1$, $X_0$ |
| INPUT TO Z DECODER | INPUT TO ROW DECODER | INPUT TO COLUMN DECODER | INPUT TO ROW DECODER | INPUT TO Z DECODER |

FIG. 31 PRIOR ART

| COLUMN ADDRESS (Z0~Z4, Y0~Y5) | | (X0~X8) | |
|---|---|---|---|
| BLOCK ADDRESS | COLUMN ADDRESS IN BLOCK | HIGHER BITS | LOWER BITS |
| Z4 · · · Z1, Z0 | Y5 · · · Y1, Y0 | X8 · · · · · X3, X2 | X1, X0 |
| INPUT TO Z DECODER | INPUT TO COLUMN DECODER | INPUT TO ROW DECODER | INPUT TO Z DECODER |

FIG. 32
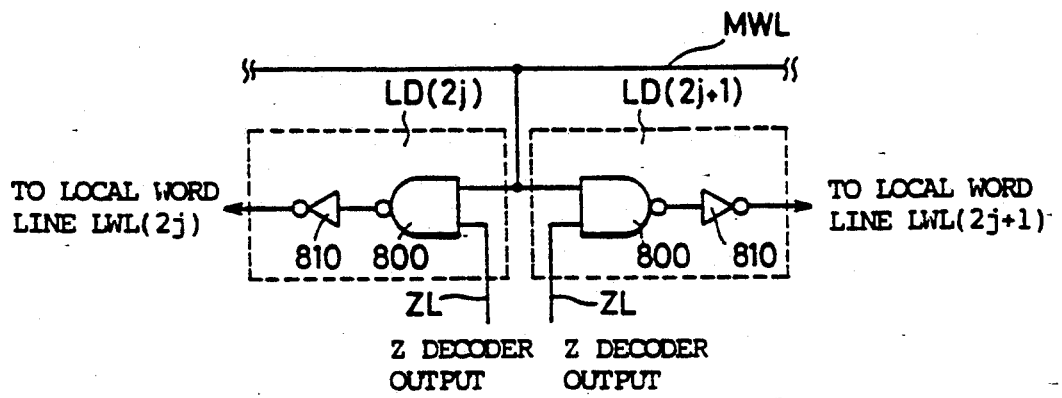
FIG. 33
| POTENTIAL ON THE CORRESPONDING MAIN WORD LINE MWL | L | L | H | H |
| --- | --- | --- | --- | --- |
| POTENTIAL ON THE CORRESPONDING Z DECODER SIGNAL LINE ZL | L | H | L | H |
| POTENTIAL ON THE CORRESPONDING LOCAL WORD LINE LWL(2j), LWL(2j+1) | L | L | L | H |
FIG. 34
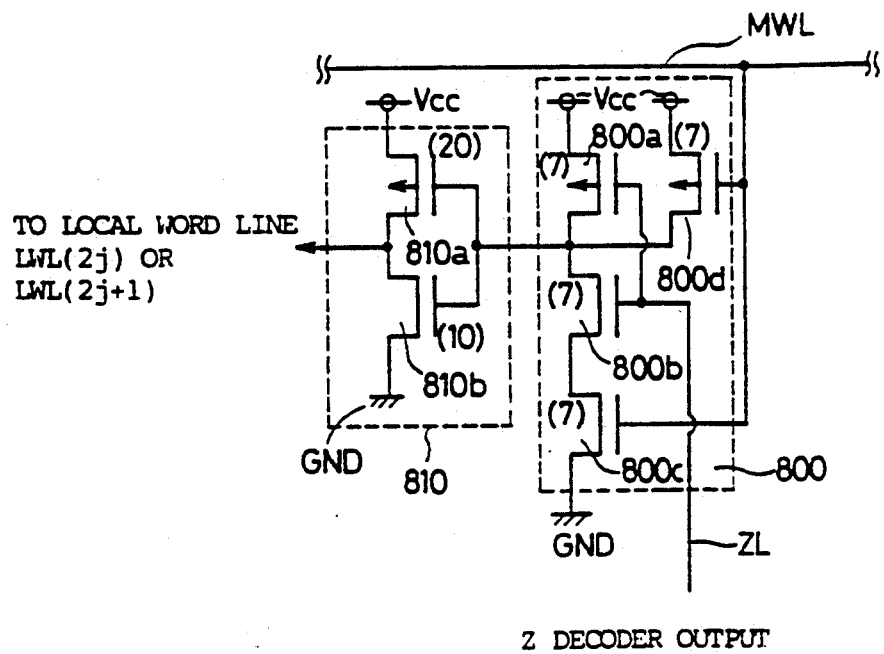

SEMICONDUCTOR MEMORY DEVICE OF DIVIDED WORD LINE

BACKGROUND OF THE INVENTION

1. Field of the Invention

The present invention relates generally to semiconductor memory devices, and more particularly, to semiconductor memory devices of a divided word line structure.

2. Description of the Background Art

A SRAM (Static Random Access Memory) is a semiconductor memory device whose storage data is not lost unless power is turned off. With a recent increase in capacity of a semiconductor memory device, the number of memory cells connected to each word line in such SRAM has been increased.

FIG. 26 is a schematic block diagram of a function of the entire structure of a SRAM and includes only a minimum function block necessary for describing a basic operation of the SRAM, that is, a reading and writing operation. In FIG. 26, a memory cell array 102 includes a circuit structure of a memory cell illustrated as a representative. In practice, memory cell array 102 comprises memory cells each having a shown circuit structure arranged in a matrix of a plurality of rows and columns. A word line WL is provided for each of the plurality of rows and a bit line pair of BitL and BitR is provided for each of the plurality of columns. Each memory cell is connected to a word line WL and a bit line pair of BitL and BitR respectively corresponding to the row and the column in which the memory cell is disposed.

A basic operation of the SRAM will be described with reference to FIG. 26.

In writing data to a memory cell 200, an external address signal is applied to an address signal input circuit 104, the signal indicative of a location (address) of the memory cell 200 to which data is to be written in memory cell array 102. Address signal input circuit 104 charges a voltage amplitude of the external signal to a voltage amplitude suitable for an internal circuit of this SRAM. For example, if the external signal has a TTL level with its H level (logical high) being 2.2 V and its L level (logical low) being 0.8 V, the voltage amplitude thereof is 1.4 V. If a signal of the internal circuit of the SRAM has an MOS level with its H level being 5 V and its L level being 0 V, its voltage amplitude is 5 V. In such a case, therefore, address signal input circuit 104 changes the voltage amplitude 1.4 V of the external signal to 5 V.

The address signal (hereinafter referred to as an internal address signal) which level has been changed by address signal input circuit 104 is converted into a word line select signal and a bit line pair select signal by an address signal decoding circuit 106.

Memory cell 200 is selected by a word line WL connected thereto attaining a high level potential and a bit line pair of BitL and BitR connected thereto being electrically connected to an internal data bus (not shown) referred to as an I/0 line. The above-described word line select signal and bit line pair select signal are a signal bringing only the potential on the word line WL connected to memory cell 200 to high and a signal electrically connecting the bit line pair of BitL and BitR connected to memory cell 200 with the I/0 line, respectively.

After the selection of memory cell 200 by the word line select signal and the bit line pair select signal, data to be written to memory cell 200 is transferred from the I/O line to the bit lines. The data to be written is supplied to a data signal input circuit 108 as an external signal. Data signal input circuit 108 changes the voltage amplitude of the external data signal to that of the MOS level and applies the level converted signal to a data write circuit 100.

Data write circuit 100 transfers the converted data signal to the I/O line by using a transistor (not shown) with a current drivability enabling a drive of the bit line pair of BitL and BitR. As a result, the bit line pair of BitL and BitR receives the data signal as complementary potentials.

Meanwhile, N channel MOS transistors 210 and 220 are turned on in memory cell 200 in response to a high level potential on the word line WL. Therefore, when the potentials on the bit lines BitL and BitR are at a high level and a low level, respectively, an N channel MOS transistor 240 is rendered conductive in response to a potential increase of a node N1 caused by the high level potential on the bit line BitL and conversely, an N channel MOS transistor 230 is rendered non-conductive in response to a potential drop of a node N2 caused by the low level potential on the bit line BitR. As a result, the potentials transmitted from the I/O line onto the bit lines BitL and BitR are held at nodes N1 and N2. In other words, even after the potential on the word line WL attaining a low level to render transistors 210 and 220 non-conductive, the non-conductive transistor 230 causes the potential at node N1 to remain a high potential (logic high level) transmitted from a power supply Vcc through a resistance element 250, while the conductive transistor 240 causes the potential at node N2 to remain a low potential ($\approx 0$ V: logic low level) determined by a ratio of a resistance value of a resistance element 260 to an ON resistance value of transistor 240.

The foregoing operation completes data writing in memory cell 200.

In reading data from memory cell 200, an external address signal corresponding to memory cell 200 from which data is to be read is supplied to address signal input circuit 104 as is done in data writing. As a result, the potential on the word line WL connected to memory cell 200 attains a high level to electrically connect the bit line pair BitL and BitR connected to memory cell 200 with the I/O line. The potential increase of the word line WL renders transistors 210 and 220 conductive. As a result, when the potentials at nodes N1 and N2 are respectively at a high level and a low level, for example, the potential on the bit line BitR drops because of current flow from the bit line BitR to ground GND through transistors 210 and 240. Conversely, the potential on the bit line BitL om ,aomtaomed at the high potential at node N1 because no current is generated flowing from bit line BitL to ground GND. That is, complementary potential changes corresponding to the storage data (the potentials maintained at nodes N1 and N2) of the memory cell 200 appear on the bit lines BitL and BitR, respectively.

Differently from data writing, the I/O line is electrically connected to a data amplification circuit 112 in data reading. Therefore, the storage data of memory cell 200 is transferred to data amplification circuit 112 after appearing on the bit lines BitL and BitR.

Data amplification circuit 112 amplifies the potential changes of the bit lines BitL and BitR by amplifying a difference voltage between the potentials on the bit lines BitL and BitR to convert the level of the data signal read from memory cell 200 into a signal level (ordinarily an MOS level) for use in the internal circuit of this SRAM. The level converted data signal is externally output through a transistor (not shown) having a current drivability enabling drive of an external data bus (not shown) and provided in a data signal output circuit 114.

The foregoing operation completes data reading from memory cell 200.

A write control signal input circuit 111 controls data write circuit 100 and data amplification circuit 112 to operate in such a manner as described above. The circuit arrangement of the memory cell shown in FIG. 26 is generally-called high resistive load type, which uses resistance elements 250 and 260 having a large resistance value as loads.

Since in data reading, the potentials on the bit lines BitL and BitR should be fully changed in response to the potentials at nodes N1 and N2, respectively, it is preferable that resistances and capacitances of the bit line pair of BitL and BitR are small.

For example, when high level and low level potentials are maintained at nodes N1 and N2, respectively, the potential on the bit line BitR drops more rapidly in data reading with more current flowing from the bit line BitR to ground GND through transistors 210 and 240. Conversely, when low level and high level potentials are maintained at nodes N1 and N2, respectively, the potential on the bit line BitL drops more rapidly with more current flowing from the bit line BitL to ground GND through transistors 220 and 230. That is, transistors 230 and 240 in the memory cell drive the bit lines BitL and BitR, respectively, in data reading.

Therefore, in order to read out the storage data of memory cell 200 onto the bit line pair of BitL and BitR rapidly and reliably, it is desirable that currents are large, the current which can be drawn by transistor 230 from one bit line BitL to ground GND through transistor 220 and the current which can be drawn by transistor 240 from one bit line BitR to ground GND through transistor 210. However, each transistor size in a memory cell is very small. On the other hand, each bit line length is very large relative to such transistor size. Therefore, resistances and capacitances of the bit lines BitL and BitR are preferably small to allow transistors 230 and 240 in memory cell 200 to rapidly draw some amount of current from the bit lines BitL and BitR, respectively.

Then, the bit line pair of BitL and BitR is formed of metal to have sufficiently small resistances and capacitances.

On the other hand, the word line WL is connected to the gates of transistors 210 and 220 of memory cell 200. In general, a gate of an MOS transistor is formed of a material such as polysilicon having a resistance value larger than that of metal. Therefore, a word line WL formed of metal requires a contact hole for connecting a polysilicon layer constituting the gates of transistors 210 and 220 with a metal layer serving as a word line WL. Such contact hole, however, in general, prevents a semiconductor integrated circuit from being highly integrated and makes a manufacturing process complicated. Then, the word line WL is formed of such a material as polysilicon having a large resistance value than that of metal to be contiguous to the gates of transistors 210 and 220.

However, with a recent increase in capacity of a SRAM, the number of memory cells arranged in each row is increased, which is followed by an increase in length of each word line WL. As a result, a resistance and a capacitance of each word line WL are significantly increased, whereby address signal decoding circuit 106 requires more time to change the potential on the word line WL to a high level.

Transistors 210 and 220 do not rapidly become conductive in memory cell 200 when the word line WL does not rapidly attain a high level potential. As a result, more time is required for the potentials on the bit lines BitL and BitR to be changed in response to the storage data of memory cell 200 in data reading and for the potentials at nodes N1 and N2 to be forced to a level corresponding to external data in data writing. Therefore, such increase in a length of the word line WL increases a time period, i.e. an access time, from a supply of an external address signal to address signal input circuit 104 to data reading from or data writing in a memory cell 200 corresponding to the address signal.

While such problem can be avoided to a certain degree by increasing a size of transistors in address signal decoding circuit to increase a drivability of address signal decoding circuit 106 with respect to the word line WL, it is not possible to increase a size of elements in a semiconductor integrated circuit device without limit. Therefore, the word line WL should be driven by the elements of a limited size provided in address signal decoding circuit 106 irrespective of an increase of the word line length. The problem cannot be resolved in this manner.

As a conventional technique for avoiding such problem as described above, each word line WL is divided into a plurality of sections each section being provided with a decoding circuit for driving the section, which technique is referred to as a divided-word line structure. Such divided-word line technique is disclosed in U.S. Pat. Nos. RE32993 and 4,554,646, for example.

FIG. 27 is a schematic diagram showing the principle of such word line division in a SRAM. The principle of the word line division will be briefly described with reference to FIG. 27.

As shown in FIG. 27(a), a memory cell array 102 is divided into a plurality of blocks in the direction of a row. As shown in FIG. 27(b), each row includes a word line which is divided into individual blocks. Hereinafter, these individually provided word lines are referred to as local word lines. That is, a plurality of local word lines provided corresponding to each row constitutes one word line group in memory cell array 102. Local word line selection is carried out by generating a signal for selecting one local word line in one word line group (hereinafter, referred to as a local word line signal) as shown in FIG. 27(c) by obtaining a logical product of a signal for selecting one block among the plurality of blocks constituting memory cell array 102 (hereinafter referred to also as a Z decoder signal) and a signal for selecting one group among the plurality of word line groups included in memory cell array 102 (hereinafter referred to also as a main word line signal).

As shown in FIG. 27(d), in memory cell array 102, bit line pairs of the corresponding columns of blocks constitute one bit line pair group. One bit line pair is selected from each block by a signal selecting one group among the plurality of bit line pair groups in memory cell array 102.

As shown in FIG. 27(e), out of the memory cells connected to the plurality of the bit line pairs included in the selected one bit line pair group, one memory cell connected to the selected one local word line is selected through such local wide line selection and bit line pair selection. As described above, an address of a memory cell from and in which data is to be read and written is determined by a block address indicative of n-th block to be selected among the plurality of blocks, a row address indicative of an n-th row word line group to be selected among the plurality of word line groups, and a column address indicative of an n-th column bit line pair group of each block to be selected among the plurality of bit line pair groups.

Then, a SRAM of a divided-word line structure includes circuits for generating a local word line signal (hereinafter referred to as a local decoder) by obtaining a logical product of the Z decoder signal and the main word line signal, which circuit is provided for each block.

FIG. 28 is a schematic diagram showing an arrangement of the vicinity of the memory cell array, including a local decoder of the SRAM having a divided-word line structure.

In a memory cell array as shown in FIG. 28, divided n blocks BL0-BL (n−1) are provided with local decoder, groups DEC0-DEC (n−1), respectively. These blocks BL0-BL (n−1) include the same number of local word lines LWL0-LWL (n−1), respectively. Local decoder groups DEC0 -DEC (n−1) include, as local decoders LD0-LD (n−1), logical gates provided corresponding to the local word lines LWL0-LWL (n−1) included in the corresponding blocks BL0-BL (n−1), respectively.

A row decoder 6 is provided for supplying main word line signals to the local decoder groups DEC0--DEC (n−1). A Z decoder 18 is provided for supplying Z decoder signals to the local decoder groups DEC0--DEC (n−1). Row decoder 6 has output signal lines MWL each provided for each row. The signal lines MWL are referred to as main word lines. Z decoder 18 has output signal lines ZL each provided corresponding to each of the local decoder groups DEC0-DEC (n−1). The signal lines ZL are referred to as Z decoder signal lines.

Each of the local decoders LD0-LD (n−1) receives a signal on the corresponding Z decoder signal line ZL and a signal on the main word line MWL of the corresponding row as inputs to selectively generate, onto the corresponding one of the local word lines LWL0-LWL (n−1), a local word line signal for selecting the corresponding local word line.

Row decoder 6 includes logical gate circuits 40 each provided corresponding to each main word line MWL, for example. Upon reception of an external address signal indicative of a row address, one of the logical gate circuits 40 in row decoder 6 outputs, onto the corresponding main word line MWL, a main word line signal for activating the main word line MWL.

Z decoder 18 outputs, onto one of the signal lines ZL, a Z decoder signal for activating the signal line ZL in response to an external address signal indicative of a block address. At this time, both of the potentials on the activated Z decoder signal line and the activated main word line MWL are at a high level. Therefore, with 2-input AND gates being used as the local decoders LD0-LD (n−1), only one local word line connected to one local decoder receiving the potential on the activated main word line MWL and the potential on the activated Z decoder signal line ZL as inputs is brought to a high level. That is, only one local word line receives a local word line signal for activating the local word line.

For the purpose of simplicity, neither bit line pair nor memory cell is shown in FIG. 28.

FIG. 29 shows an actual layout of local decoder groups and divided memory cell array blocks on a semiconductor substrate in such SRAM of a divided-word line structure.

In practice as shown in FIG. 29, n (n is an even number) divided divisional blocks BL0-BL (n-1) of a memory cell array fall into n/2 groups each group including two blocks in view of layout. Then, in each of these n/2 groups, an even-numbered local decoder group provided corresponding to the even-numbered block and an odd-numbered local decoder group provided corresponding to an odd-numbered block located adjacent to the even numbered block are disposed between these two blocks.

Recently proposed in "S. Aizaki et al, IE³ ISSCC Digest of Technical Papers, pp. 126-127, 1990" and the like is a further division of the row direction divided blocks BL0-BL (n−1) into a plurality of blocks divided in a column direction. FIG. 30 is a circuit diagram showing a schematic arrangement of a main part of a SRAM wherein a memory cell array is divided into 32 blocks of BL0-BL31 in a row direction, each block further divided into 128 sub-blocks of SBL0-SBL127 in a column direction. Each of the blocks BL0-BL31 includes the same number of memory cell columns. Similarly, each of the sub-blocks SBL0-SBL127 includes the same number of memory cell rows.

When each block is further divided into a plurality of sub-blocks in a column direction, row decoder 6 has 128 output signal lines, i.e. 128 main word lines MWL provided corresponding to the sub-block groups SBL0-SBL127. Row decoder 6 includes logical gate circuits 40 provided corresponding to the main word lines MWL, for example. Upon reception of an external address signal indicative of a row address, one of these logical gates 40 applies, to the corresponding main word line MWL, a potential (high level) activating the main word line.

Z decoder 18 has output signal lines, i.e. Z decoder signal lines ZL provided in the same number (m) of the local word lines included in one sub-block for each of the 32 blocks BL0-BL31. Therefore, the plurality of Z decoder signal lines provided corresponding to each of the blocks BL0-BL31 constitute one signal line group ZLG. In response to an external address signal indicative of a block address and an external address signal indicative of a row address, Z decoder 18 supplies, to only one of all the signal lines ZL included in these signal line groups ZLG, a high level potential for activating the one signal line ZL.

Local decoder groups DEC0-DEC31 are provided corresponding to the blocks BL0-BL31, respectively. More specifically, located between each of the odd-numbered blocks BL1, BL3, . . . BL31 and each of the even-numbered blocks BL0, BL2, . . . BL30 adjacent thereto are two local decoder groups corresponding to these two blocks as described above.

The local decoder groups DEC0-DEC31 include logical gate circuits LD0-LD31 as local decoders, respectively, which logical gate circuits are provided for the respective local word lines LWL0–LWL31 included in the corresponding blocks BL0–BL31.

A signal on each main word line MWL is applied in common to all the local decoders LD0–LD31 provided corresponding to the 32 sub-blocks (any of SBL0–SBL127) corresponding to this main word line MWL. A plurality of signal lines included in each Z decoder signal line group ZLG are provided corresponding to a plurality of local word lines in the corresponding block (any of BL0–BL31). Then, the plurality of lines included in each signal line group ZLG are connected in common to 128 local decoders provided corresponding to 128 local word lines corresponding to 128 sub-blocks SBL0–SBL127 included in the corresponding one block.

Therefore, each of the local decoders LD0–LD31 comprises a two-input AND gate, only one local decoder connected to an activated main word line MWL and an activated Z decoder signal line ZL activates the corresponding one local word line. That is, only one local decoder outputs a local word line select signal.

As described above, when a plurality of row direction divided blocks are further divided in a column direction, local word line selection is carried out by row decoder 6 outputting a signal indicating that an n-staged one, out of the sub-blocks, from the top of the drawing including one local word line to be selected and Z decoder 18 outputting a signal indicating an n-numbered block from the left of the drawing including the one local word line to be selected and an n-numbered sub-block from the top including the local word line.

FIG. 31 is a table showing how external address signals are divisionally supplied to row decoder 6 and Z decoder 18 of FIG. 30 in a case of a memory cell array including memory cells arranged in a matrix of 512 rows and 2048 columns. With reference to FIGS. 31 and 30, out of the external address signals indicative of a column direction address of a memory cell to be selected, 5-bit signals Z0–Z4 indicative of block addresses are input to Z decoder 18 and 6-bit signals Y0–Y5 indicative of column addresses in a block are input to a column decoder (not shown in FIG. 30). Out of the external address signals indicative of a row direction address of a memory cell to be selected, more significant 7-bit signals X2–X8 are input to row decoder 6 and less significant 2-bit signals X0 and X1 are input to Z decoder 18.

In such a case, row decoder 6 decodes the 7-bit signals X2–X8 to output $2^7$-bit (=128) signals X0–X127 one of which signals being at a high level. As a result, only one of the 128 main word lines MWL is activated. Z decoder 18 decodes a total of 7-bit signals including 5-bit block address signals Z0–Z4 and two-bit row address signals X0 and X1 to output 2-bit (=32×4) X decoder signals ZX0–ZX127 only one of which signals being at a high level.

In case of a memory cell array including 512 memory cell rows, each of the sub-blocks SBL0–SBL127 includes four local word lines. Therefore, output of the above-described 128-bit signals ZX0–ZX127 by Z decoder 18 activates one of four signal lines ZL included in one of the 32 signal line groups ZLG provided corresponding to 32 blocks BL0–BL31.

The column decoder decodes the 6-bit signals Y0–Y6 to output $2^6$-bit (=64) signals one of which signals is at a high level. In case of a memory cell array including 2048 memory cell columns, each of the blocks BL0–BL31 includes 64 bit line pairs and therefore, each of the 64-bit signals selects one bit line pair in each of the blocks BL0–BL31.

FIG. 32 is a logical circuit diagram showing an example of an actual arrangement of a local decoder. An arrangement of a conventional local decoder will be described with reference to FIG. 32.

In the following description, in n blocks BL0–BL (n−1) obtained by dividing the memory cell array in a row direction, local word lines included in even-numbered blocks and local word lines included in odd-numbered blocks are represented as LWL (2j) and LWL (2j+1), respectively (j=0, 1, ..., (n−2)/2). Similarly, local decoders provided corresponding to the odd-numbered blocks and local decoders provided corresponding to the even-numbered blocks are represented as LD (2j) and LD (2j+1), respectively.

FIG. 32 shows, as a representative, two local decoders LD (2j) and LD (2j+1) arranged adjacent to each other in actual layout.

Each of the conventional local decoders LD (2j) and LD (2j+1) includes, for example, a two-input NAND gate 800 receiving a signal on the corresponding main word line MWL and a signal on the corresponding Z decoder signal line ZL and an inverter 810 for inverting the output of NAND gate 800. The output signal from inverter 810 is supplied to the corresponding local word line LWL (2j) or LWL (2j+1).

Operation of the local decoders shown in FIG. 32 will be described with reference to FIG. 33. FIG. 33 is a table of truth values of the logical circuit shown in FIG. 32.

As can be seen from FIG. 33, in each of the local decoders LD (2j) and LD (2j+1), the output potential (that is, the potentials on the corresponding local word lines LWL (2j) and LWL (2j+1)) of inverter 810 attains a high level in response to NAND gate 800 attaining a low level output potential only when both of the potentials on the corresponding main word line MWL and the corresponding Z decoder signal line ZL are at a high level. However, when at least one of the potentials on the corresponding main word line MWL and the corresponding Z decoder signal line ZL is at a low level, the output potential of NAND gate 800 is fixed to a high level, whereby the output potential of inverter 810 is at a low level. Therefore, the corresponding local word lines LWL (2j) and LWL (2j+1) are not activated unless both of the potentials on the corresponding main word line MWL and Z decoder signal line ZL attain a high level.

FIG. 34 is a circuit diagram showing a specific circuit arrangement of NAND gate 800 and inverter 810 of FIG. 32 relative to a single local decoder. Now, an arrangement of a conventional local decoder will be described in more detail with reference to FIG. 34.

In each local decoder, NAND gate 800 includes a P channel MOS transistor 800a and N channel MOS transistors 800b and 800c connected in series to each other between power supply Vcc and ground GND and a P channel MOS transistor 800d provided between power supply Vcc and a node between transistors 800a and 800b. The gates of transistors 800a and 800b are connected to the Z decoder signal line ZL and the gates of transistors 800c and 800d are connected to the main word line MWL. Inverter 810 includes a P channel MOS transistor 810a and an N channel MOS transistor 810b connected in series to each other between power supply Vcc and ground GND. The node between transistors 810a and 810b is connected to the local word line LWL (2j) or LWL (2j+1).

The gates of transistors 810a and 810b are connected to the node between transistors 800a and 800b.

When the potential on the main word line MWL is at a low level, while transistor 800d is turned on, transistor 800c is turned off, so that the gate potential of transistors 810a and 810b attains a high level irrespective of ON/-OFF states of transistors 800a and 800b. Therefore, when the potential on the main word line MWL is at a low level, the local word line LWL (2j) or LWL (2j+1) connected to inverter 810 attains a low level, that is, it is activated irrespective of the potential level of the signal line ZL.

Conversely, when the potential on the main word line MWL is at a high level, transistor 800c is turned on, while transistor 800d is turned off, whereby the gate potential of transistors 810a and 810b is changed according to ON/OFF states of transistors 800a and 800b. That is, when transistor 800a is rendered conductive in response to a low level potential on the signal line ZL, the gate potential of transistors 810a and 810b attains a high level. Conversely, when transistor 800b is rendered conductive in response to a high level potential on the signal line ZL, the gate potential of transistors 810a and 810b attains a low level. Therefore, in case of the main word line MWL attaining a high level potential, the potential on the local word line LWL (2j) or LWL (2j+1) connected to inverter 810 attains a high level, that is, it is activated only when the potential on the Z decoder signal line ZL is at a high level.

In FIG. 34, a numeral in parenthesis put beside each element represents a gate width of the element in $\mu$m.

As described above, each local decoder for use in a semiconductor memory device of a divided-word line structure is arranged as shown in FIG. 34 in order to obtain the logical product of a signal on the corresponding main word line and a signal on the corresponding Z decoder signal line. More specifically, each local decoder requires a total of 6 elements including two transistors constituting an inverter and four transistors constituting an NAND gate.

As can be seen from FIG. 28 and FIG. 30, the semiconductor memory device of a divided-word line structure requires the same number of local decoders as that of local word lines. For example, in a case where each of the sub-blocks SBL0–SBL127 includes four local word lines in FIG. 30, $2^{14}$ (=4 lines$\times$128 sub-blocks$\times$32 blocks) local decoders are required to make the total area of the local decoders equivalent to the total area of as many as $6\times 2^{14}$ MOS transistors.

As described in the foregoing, local decoders occupying a large area of a semiconductor memory device of a divided-word line structure make it difficult to reduce a chip area of a semiconductor memory device and to increase a memory capacity of the same.

In other words, in order to increase a storage capacity of a semiconductor memory device without increasing a chip area, more area of a semiconductor substrate available for use for a memory cell array is required by reducing an area occupied by other circuits than the memory cell array, thereby increasing the number of memory cells arranged on one chip. However, it is difficult to reduce an area of such peripheral circuits because even a single local decoder includes six elements. This fact makes a local decoder of a conventional arrangement another factor preventing an increase of a capacity of a semiconductor memory device.

In addition, as shown in FIGS. 28 and 30, the Z decoder signal line is formed extending in a column direction of a memory cell array also on a semiconductor substrate. Therefore, in a memory cell array divided both in a row direction and a column direction as shown in FIG. 30, a large number of Z decoder signal lines are arranged in a column direction between the respective odd-numbered blocks BL1, BL3, . . . BL31 and the even-numbered blocks BL0, BL2, . . . BL30 disposed adjacent thereto. For example, in FIG. 32, wherein each of the sub-blocks SBL0–SBL127 includes four local word lines, a total of 8 Z decoder signal lines are arranged in a column direction between an even-numbered block and an odd-numbered block adjacent to each other. As a result, the total of a row direction width of wiring layers forming the Z decoder signal lines reaches a high sum, resulting in an increase in the total width of the local decoders and the Z decoder signal lines provided corresponding thereto on the semiconductor substrate. Thus, a conventional semiconductor memory device of a divided-word line structure has an increased row direction width of other circuits than a memory cell array.

As described above, conventional semiconductor memory device of a divided-word line structure involves difficulty in increasing a capacity of a semiconductor memory device and reducing a chip area because of not only the number of elements of each local decoder but also the number of Z decoder signal lines.

SUMMARY OF THE INVENTION

An object of the present invention is to provide a semiconductor memory device with a reduced access time.

Another object of the present invention is to provide a semiconductor memory device which storage capacity can be increased.

A further object of the present invention is to provide a semiconductor memory device which chip area can be reduced.

Still another object of the present invention is to provide a semiconductor memory device of a divided-word line structure which storage capacity can be increased and which chip area can be reduced.

A still further object of the present invention is to provide a semiconductor memory device of a divided-word line structure including local decoders each having the reduced number of elements.

A still further object of the present invention is to provide a semiconductor memory device of a divided-word line structure wherein the total width of peripheral circuits of a memory cell array on a semiconductor substrate is small in a row direction of memory cells.

A still further object of the present invention is to provide a semiconductor memory device of a divided word line structure including the reduced number of Z decoder signal lines.

In order to achieve the above-described objects, in a semiconductor memory device according to the present invention, each local decoder includes a first switch element responsive to first and second signals for activating or inactivating a predetermined local word line, which element is rendered conductive when the first signal is activated to apply the second signal to the predetermined local word line, and a second switch element coupled between the predetermined local word line and a potential corresponding to an inactivated state and being rendered conductive when the first signal is inactivated.

In accordance with a first aspect of the present invention, a semiconductor memory device includes a plurality of memory cell array blocks, main word line pairs provided in common for the plurality of memory cell array blocks, and a first selection circuit supplying signals complementary to each other to the main word line pairs as first select signals. Each of the plurality of memory cell array blocks includes a plurality of memory cells and a plurality of local word lines arranged in a plurality of rows. The semiconductor memory device further includes a plurality of select line groups provided corresponding to the plurality of memory cell array blocks and a second selection circuit for supplying a second select signal to any of the plurality of select lines included in the plurality of select line groups. Each of the plurality of select line groups includes a plurality of select lines corresponding to the plurality of local word lines in the corresponding memory cell array block. The semiconductor memory device further includes a plurality of decoder groups provided corresponding to the plurality of memory cell array blocks. Each of the plurality of decoder groups includes a plurality of decoder circuits corresponding to the plurality of local word lines in the corresponding memory cell array block. Each of the plurality of decoder circuits includes a local decoder of the above-described arrangement in order to activate the corresponding local word line in response to a first select signal applied to a main word line pair and a second select signal applied to the corresponding select line.

According to a second aspect of the present invention, the semiconductor memory device includes first and second memory cell array blocks each including a plurality of memory cells and a plurality of local word lines arranged in a plurality of rows, first and second main word lines provided corresponding to the first memory cell array block and the second memory cell array block, respectively, and a first selection circuit for applying a first select signal to either the first or the second main word line. The plurality of local word lines in the first memory cell array block and the second local word lines in the second memory cell array block correspond to each other to constitute a plurality of local word line pairs. The semiconductor memory device further includes a plurality of select lines provided corresponding to the plurality of local word line pairs, a second selection circuit for applying a second select signal to any of the plurality of select lines, a plurality of first decoder circuits provided corresponding to the plurality of local word lines in the first memory array block and a plurality of second decoder circuits provided corresponding to the plurality of local word lines in the second memory array block. Each of the plurality of first decoder circuits includes a local decoder of the above-described arrangement responsive to a first select signal applied to the first main word line and a second select signal applied to the corresponding select line for activating the corresponding local word line in the first memory array block. Similarly, each of the plurality of second decoder circuits includes a local decoder of the above-described arrangement responsive to a first select signal applied to the second main word line and a second select signal applied to the corresponding select line for activating the corresponding local word line in the second memory cell array block.

As described above, in each local decoder contained in the semiconductor memory device according to the present invention, a signal supplied to one of the two types of signal lines connected to the local decoder is used for controlling ON/OFF of the first and the second switch elements, and a signal supplied to the other signal line is coupled to the corresponding local word line through the first switch element. Therefore, only when both of the signal supplied to one signal line and the signal supplied to the other signal line are activated, the corresponding local word line is activated. As a result, only one local word line is activated in response to the outputs of the first and the second selection circuits in the same manner as in a conventional device.

In order to more reliably inactivate a local word line which is supposed to be at an inactivated state, in addition to the above-described arrangement, each local decoder preferably includes an element for forcing the potential on the corresponding local word line to the potential indicating an inactivated state when at least one of the first and the second signals is inactivated, or the semiconductor memory device includes a signal generation circuit for generating a signal capable of once rendering all the second switch circuits included in the respective local decoders prior to an operation of the local decoders. Used for the forcing element are, for example, a forcing switch element controlled by either a first select signal or a second select signal and coupled between the corresponding local word line and the first signal or the second signal, a resistance element and an MOS transistor remaining conductive at all times which are coupled between the corresponding local word line and a potential indicating an inactivated state.

In a case where first and second MOS transistors of the same polarity are used as the first and the second switch elements in the device according to a first aspect, signals on the first and the second main word lines constituting a main word line pair are used as first signals for controlling the first switch element and the second switch element, respectively. The signal on the corresponding select line is applied to the first switch element as a second signal. In such a case, any of the above-described methods can be used for reliably inactivating a local word line which is to be at an inactivated state.

In a case where first and second MOS transistors of opposite polarities are used as the first and the second switch elements, such forcing switch element as described above can be used as a forcing element. In such a case, a signal on the first main word line and a signal on the second main word line are used as the first signals for controlling the first and the second switch elements and controlling the forcing switch element and a signal on the corresponding select line is applied to the first switch element as a second signal. Meanwhile the signal on the corresponding select line is used as a first signal for controlling the first and the second switch elements, and the signal on the first main word line and the signal on the second main word line may be applied, as a second signals, to the first switch element and the forcing switch element, respectively.

When first and second MOS transistors of the same polarity are used as the first and the second switch elements and third and fourth MOS transistors of the same polarity are used as third and fourth switch elements in the device according to a second aspect, a first select signal includes two signals complementary to each other and a first main word line includes a first signal line receiving one of these two signals and a second signal line receiving the other signal. Similarly, a second main word line includes a third signal line receiving one of these two signals and a fourth signal line receiving the other signal. In the first decoder circuit, while the signals on the first signal line and the second signal line are used as first signals for controlling the first switch element and the second switch element, respectively, the signal on the corresponding select line is applied as a second signal to the first switch element. Similarly, in the second decoder circuit, the signal on the third signal line and the signal on the fourth signal line are used as first signals for controlling the third and the fourth switch elements, respectively, the signal on the corresponding select line is applied as a second signal to the third switch element. In such a case, any of the above-described methods can be used for reliably inactivating a local word line which is to be at an inactivated state.

On the other hand, when first and second MOS transistors of opposite polarities are used as the first and the second switch elements and third and fourth MOS transistors of the opposite polarities are used as the third and the fourth switch elements, such forcing switching element as described above can be used as a forcing element. In such a case, in the first decoder circuit, the signal on the first signal line and the signal on the second signal line are used as first signals for controlling the first and the second switches and the forcing switch element, while the signal on the corresponding select line is applied as a second signal to the first switch element. Similarly, in the second decoder circuit, the signal on the third signal line and the signal on the fourth signal line are used as first signals for controlling the third and the fourth switches and the forcing switch element, and the signal on the corresponding select line is applied as a second signal to the third switch element. In the first decoder circuit, the signal on the corresponding select line is used as a first signal for controlling the first and the second switch elements, and the signal on the first signal line and the signal on the second signal line may be applied as second signals to the first switch element and the forcing switch element. In this case, in the second decoder circuit, while the signal on the corresponding select line is used as a first signal for controlling the third and the fourth switches, the signal on the third signal line and the signal on the fourth signal line are applied as second signals to the third switch element and the forcing switch element, respectively.

In a case where first and second MOS transistors of opposite polarities are used as the first and the second switch elements and third and fourth MOS transistors of opposite polarities are used as the third and the fourth switch elements, if such forcing switch element as described above is not used as a forcing element, each of the first and the second main word lines should be constituted by a single signal line.

For example, an N channel MOS transistor is used as a forcing switching element. An ATD circuit, for example, is used as a signal generation circuit.

In a case where first and second MOS transistors of the same polarity are used as the first and the second switch elements in the device according to a first aspect, if a forcing switch element is used, the forcing switch element should be controlled by the signals on the first or second main word line.

Similarly, in a case where first and second MOS transistors of the same polarity are used as the first and the second switch elements and third and fourth MOS transistors of same polarity are used as the third and the fourth switch elements, if a forcing switching element is employed, the forcing switch element should be controlled by the signal on the first or the second signal line in the first decoder circuit and it should be controlled by the signal on the third or fourth signal line in the second decoder circuit.

According to a further aspect of the present invention, the semiconductor memory device includes a decoder operating to activate or inactivate a predetermined select line in response to first and second select signals. The decoder includes first and second decoder circuits and the predetermined select line includes first and second select lines. In a case where the first select signal includes first and second sub-select signals, the first decoder circuit includes a first switch element being rendered conductive when the first sub-select signal is activated, thereby applying the second select signal to the first select line and a second switch element coupled between the first select line and the potential indicating an inactivated state and being rendered conductive when the first sub-select signal is inactivated. The second decoder circuit includes a third switch element being rendered conductive when the second sub-select signal is activated, thereby applying the second select signal to the second select line and a fourth switch element coupled between the second select line and the potential indicating the inactivated state and being rendered conductive when the second sub-select signal is inactivated.

In a case where the second select signal includes first and second sub-select signals, the first decoder circuit includes a first switch element being rendered conductive when the first select signal is activated, thereby applying the first sub-select signal to the first select line, and the second switch element coupled between the first select line and the potential indicating an non-selected state and being rendered conductive when the first select signal is inactivated. The second decoder circuit includes a third switch element being rendered conductive when the first select signal is activated, thereby applying the second sub-select signal to the second select line, and a fourth switch element coupled between the second select line and the potential indicating an inactivated state and being rendered conductive when the first select signal is inactivated.

In order to more reliably inactivate a select line which is to be at an inactivated state, in addition to the above-described arrangement, each of the first and the second local decoders preferably includes an element for forcing the potential on the corresponding select line to the potential indicating the inactivated state when at least one of the first and the second select signals is inactivated, or the semiconductor memory device includes a signal generation circuit for generating a signal capable of once simultaneously rendering the second and the fourth switch elements included in the first and the second decoder circuits, respectively, prior to an operation of the first and the second decoder circuits.

Thus, the semiconductor memory device of a divided-word line structure according to the present invention enables a reduction of the number of elements of a local decoder for selecting a local word line, an acceleration of a local word line selection speed and reduction of power consumption in local word line selection. Furthermore, out of input signal lines to a local decoder, the number of signal lines provided in a column direction of the memory cell array can be reduced, resulting in a reduction in width and area of the local decoder portion occupying on the semiconductor substrate to enable scale-down of the semiconductor memory device and an increase in capacity thereof.

BRIEF DESCRIPTION OF THE DRAWINGS

FIG. 3 is a circuit diagram showing an arrangement of a local decoder shown in FIG. 1.

FIG. 4 is a circuit diagram showing the more detailed arrangement of the local decoder of FIG. 1.

FIG. 5 is a table of truth values showing an operation of the local decoder shown in FIGS. 3 and 4.

FIG. 12 is a table showing one example of distribution of row address signals and column address signals to Z decoders and row decoders according to the embodiments shown in FIGS. 11, 17, 19 and 21.

FIG. 31 is a table showing distribution of external address signals to row decoders and Z decoders in the SRAM shown in FIG. 30.

FIG. 32 is a logical circuit diagram showing an example of an arrangement of a local decoder for use in a conventional SRAM of a divided-word line structure.

FIG. 33 is a table showing truth values indicative of operations of the local decoder shown in FIG. 32.

FIG. 34 is a circuit diagram showing the more detailed arrangement of the local decoder shown in FIG. 32.

DESCRIPTION OF THE PREFERRED EMBODIMENTS

Figure 1:
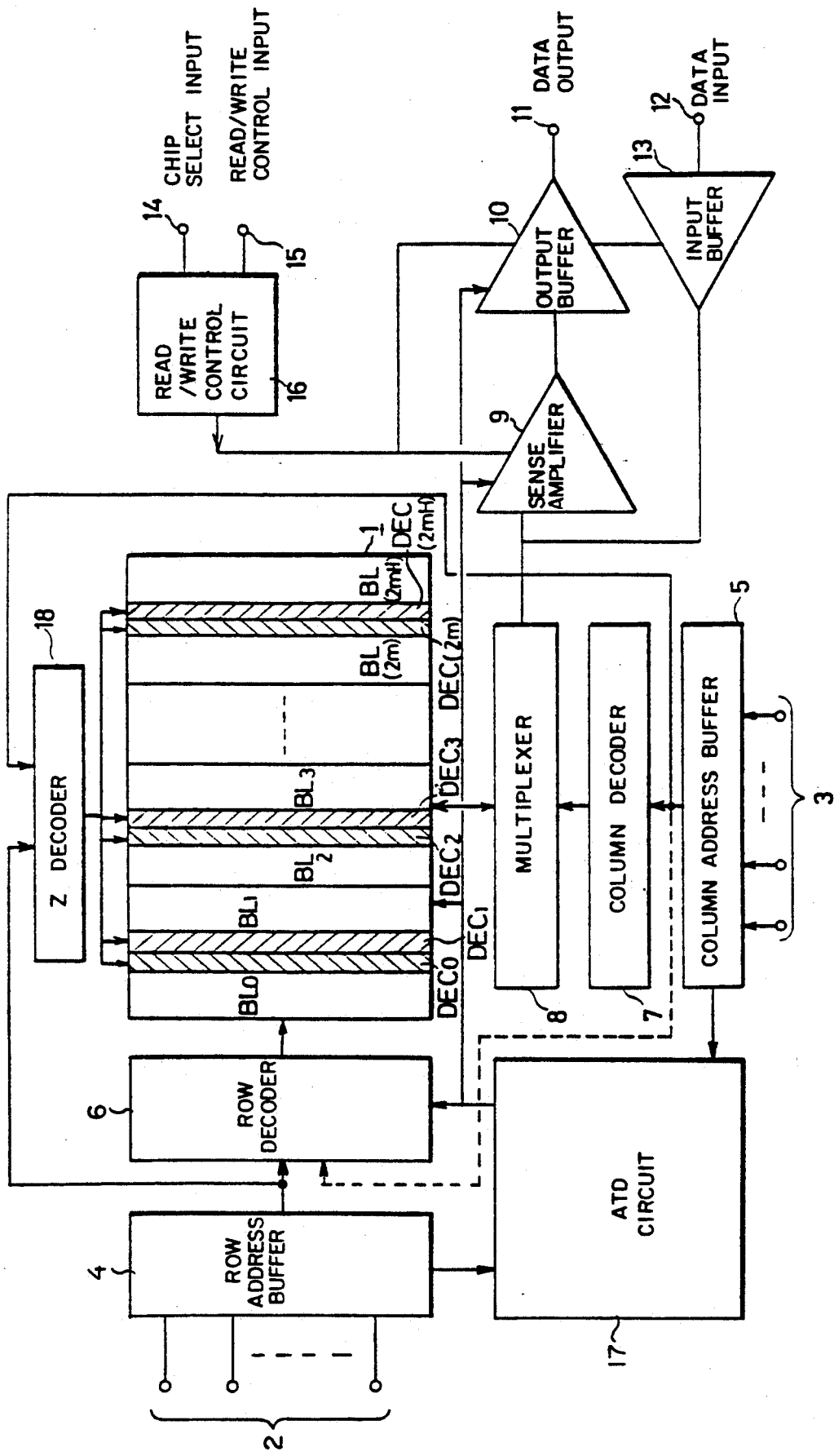
FIG. 1 is a schematic block diagram showing an entire arrangement of a SRAM according to one embodiment of the present invention.

FIG. 1 is a schematic block diagram showing an entire arrangement of a SRAM of a divided-word line structure according to one embodiment of the present invention. With reference to FIG. 1, the arrangement and basic operation of this SRAM will be described.

A memory cell array 1 is divided into n blocks BL0-BL $(2m+1)$ in a row direction $(m=(n-2)/2)$. Each of these n blocks BL0-BL $(2m+1)$ includes memory cells arranged in a plurality of rows and columns. In each block, memory cells in the same row are connected to one local word line (not shown) and memory cells in the same column are connected to the same bit line pair (not shown).

n local decoder groups DEC0-DEC $(2m+1)$ are provided to correspond to these n blocks BL0-BL $(2m+1)$. On this SRAM chip, local decoder groups are arranged each between the corresponding one of the even-numbered blocks BL0, BL2, ... BL $(2m)$ and the corresponding one of the odd-numbered blocks BL1, BL3, ... BL $(2m+1)$ adjacent thereto.

A row address input terminal 2 receives an external row address signal indicative of a row direction address of a memory cell to be selected. A column address input terminal 3 receives an external address signal indicative of a column direction address of a memory cell to be selected.

A row address buffer 4 buffers the row address signal supplied to row address input terminal 2 and applies the same to a row decoder 6, an ATD (address transition detector) circuit 17 and a Z decoder 18.

A column address buffer 5 buffers the column address signal supplied to column address input terminal 3 and applies the same to a column decoder 7, ATD circuit 17 and Z decoder 18.

Row decoder 6 decodes the row address signal from row address buffer 4 to output a main word line signal for selecting one of the main word lines in memory cell array 1.

Z decoder 18 decodes the row address signal from row address buffer 4 and the column address signal from column address buffer 5 to output a Z decoder signal for selecting one of the blocks BL0–BL (2m+1) constituting memory cell array 1.

Each of the local decoder groups DEC0–DEC (2m+1) decodes the main word line signal from row decoder 6 and the Z decoder signal from Z decoder 18 to selectively activate one of the local word lines in the corresponding block.

Column decoder 7 decodes the column address signal from column address buffer 5 and applies the decoded signal to a multiplexer 8.

Multiplexer 8 is controlled by the output of column decoder 7 to electrically connect only the bit line pair connected to the memory cell to be selected with a sense amplifier 9 in data reading and with an input buffer 13 in data writing.

Sense amplifier 9 senses and amplifiers the signal voltage on the bit line pair connected thereto by multiplexer 8 in data reading.

An output buffer 10 further amplifies the signal voltage sensed and amplified by sense amplifier 9 and supplies the further amplified signal voltage to a data output terminal 11 as read data.

A data input terminal 12 receives an external data signal to be written in a selected memory cell in data writing. In data writing, input buffer 13 amplifies the data signal supplied to data input terminal 12 and supplies the amplified data signal to the bit line pair connected by multiplexer 8.

As a result, storage data of one memory cell connected to one activated local word line and to one bit line pair electrically connected to sense amplifier 9 appears at data output terminal 11 in data reading. On the other hand, in data writing, the external data applied to data input terminal 12 is written in one memory cell connected to the activated one local word line and to one bit line pair electrically connected to input buffer 13.

A chip select input terminal 14 receives an external chip select signal indicating whether the SRAM chip is at a selected state or non-selected state. A read/write control input terminal 15 receives an external read/write control signal for designating data reading or data writing to be carried out for memory cell array 1.

A read/write control circuit 16 controls sense amplifier 9, output buffer 10 and input buffer 13 in response to the chip select signal applied to chip select input terminal 14 and the read/write control signal applied to read/write control input terminal 15 to set the SRAM chip to operate in a reading state or writing state.

ATD circuit 17 detects changes of the row address signal from row address buffer 4 and in the column address signal from column address buffer 5 to apply various internal synchronization signals to memory cell array 1, row decoder 6, sense amplifier 9 and output buffer 10 or the like for controlling the same.

In general, while a SRAM is a semiconductor memory device capable of writing and reading data, which is its original function, without receiving an internal synchronization signal, the SRAM can include an internal synchronization circuit referred to as ATD circuit 17 for achieving higher performance.

Figure 2:
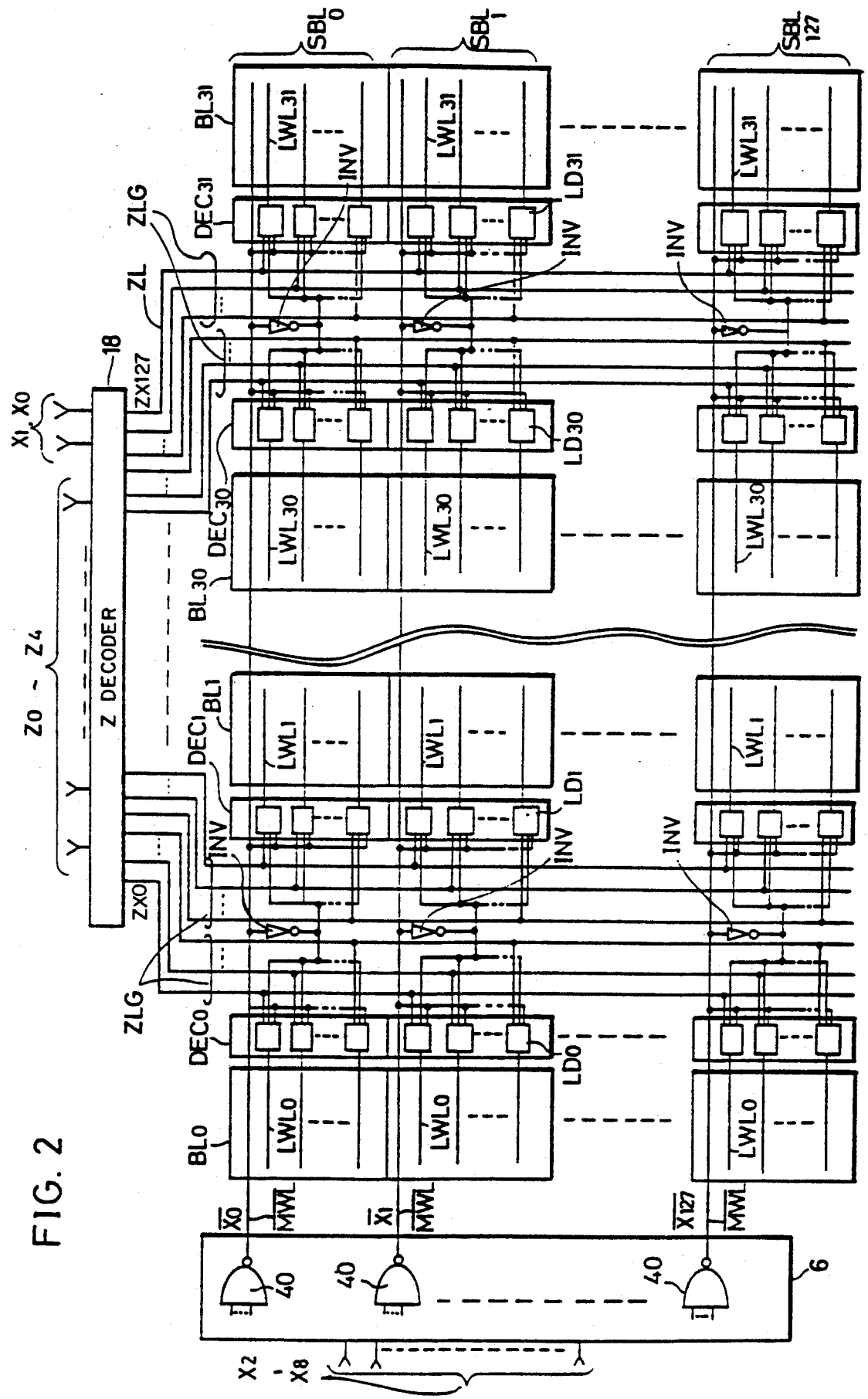
FIG. 2 is a circuit diagram showing one example of an arrangement of a main part of the SRAM shown in FIG. 1.

FIG. 2 is a circuit diagram showing one example of an arrangement of a main part of the SRAM including the blocks BL0–BL (2m+1) and the local decoder groups DEC0–DEC (2m+1) of FIG. 1.

With reference to FIG. 2, memory cell array 1 is divided into 32 blocks BL0–BL31 (n=32, m=15) in a column direction, each of which 32 blocks is further divided into 128 sub-blocks SBL0–SBL127 each including four memory cell rows in a row direction in this embodiment.

Each of the 32 local decoder groups DEC0–DEC31 provided corresponding to the 32 blocks BL0–BL31 includes a plurality of local decoders LD (2j) or LD (2j+1) provided corresponding to a plurality of local word lines LWL (2j) or LWL (2j+1) included in the corresponding block as in a conventional arrangement.

Furthermore, like in a conventional arrangement, 32 Z decoder signal line groups ZLG are provided to correspond the 32 blocks BL0–BL31 and 128 main word lines /MWL are provided corresponding to the 128 sub-block groups SBL0–SBL127. In this embodiment, any of the output signals /X0 –/X127 of row decoder 6 is assumed to be an inactive signal. Hereinafter in the specification, "/" is allotted before the symbols indicative of an inactive signal and a signal line for transmitting such signal. In the drawing, "-" is put above each symbol in place of "/".

Unlike a conventional memory cell array, each of the output signals /X0–/X127 from row decoder 6 is converted into a complementary signal pair which is input to the corresponding one of the local decoder groups DEC0–DEC31 in this embodiment.

More specifically, each main word line /MWL is connected to (16) inverters INV, half the number of the blocks (32). These 16 inverters INV are provided corresponding to 16 pairs of blocks each constituted by each of the even-numbered blocks BL0, BL2, . . . BL30 and each of the odd-numbered blocks BL1, BL3, . . . BL31 adjacent thereto. The output of each inverter INV is applied in common to local decoders LD (2j) and LD (2j+1) respectively connected to an even-numbered local word line LWL (2j) included in the corresponding even-numbered block and an odd-numbered local word line LWL (2j+1) included in the corresponding odd-numbered block in one of the subblock groups SBL0–SBL127 corresponding to the main word line /MWL connected to the inverter INV.

FIG. 3 is a circuit diagram showing an arrangement of the local decoders LD (2j) and LD (2j+1) shown in FIG. 2. FIG. 3 shows the adjacent two local decoders LD (2j) and LD (2j+1) of FIG. 2 as a representative.

With reference to FIG. 3, each of the local decoders LD (2j) and LD (2j+1) includes a P channel MOS transistor 24a and an N channel MOS transistor 24b connected in series between the corresponding Z decoder signal line ZL and ground GND, and an N channel MOS transistor 24c provided between the corresponding Z decoder signal line ZL and its corresponding local word line LWL (2*j*) or LWL (2*j*+1). The gates of transistors 24*a* and 24*b* receive a signal on the corresponding main word line /MWL and the gate of transistor 24*c* receives an output signal of the corresponding inverter INV.

FIG. 4 is a circuit diagram showing the detailed arrangement of the inverter INV shown in FIG. 3. In FIG. 4, the local decoder represents the local decoder LD (2*j*) (2*j*+1) of FIG. 3 and the numerals in the parentheses beside the respective elements show the gate widths of the respective elements in μm.

As shown in FIG. 4, the inverter INV includes a P channel MOS transistor 22*a* and an N channel MOS transistor 22*b* connected in series between power supply Vcc and ground GND. The gates of transistors 22*a* and 22*b* are connected to the corresponding main word line /MWL. The node between transistors 22*a* and 22*b* is connected to the gate of transistor 24*c*.

With reference to FIGS. 4 and 5, operation of the local decoder according to the present embodiment will be described. FIG. 5 is a table of truth values showing a relation between the input potential and the output potential of the local decoder according to the present embodiment.

First, when the main word line /MWL is at a high level, transistor 24*b* is turned on, so that the potential at the node between transistors 24*a* and 24*b* attains a low level irrespective of an ON/OFF state of transistor 24*c*. As shown in FIG. 5, therefore, when the potential on the main word line /MWL is at a high level, the local word line LWL (2*j*) or LWL (2*j*+1) connected to the node between transistors 24*a* and 24*b* attains a low level to be non-activated.

Conversely, when the potential on the main word line /MWL is at a low level, both of transistors 24*a* and 22*a* are turned on to turn on transistor 24*c*. Thus, the potential at the node between transistors 24*a* and 24*b* is determined by the potential level of the Z decoder signal line ZL. Therefore, the local word line LWL (2*j*) or LWL (2*j*+1) is activated only when the potential on the Z decoder signal line ZL is at a high level, with the potential on the main word line /MWL attaining a low level.

When the main word line /MWL is at a low level, the potential on the Z decoder signal line ZL is transmitted to the node between transistors 24*a* and 24*b* through both of transistors 24*a* and 24*c*. As a result, when both the potentials on the main word line /MWL and the Z decoder signal line ZL are at a low level, the potential on the local word line LWL (2*j*) or LWL (2*j*+1) is reliably forced to the original potential regarded as being at a low level, that is, to 0 V. Function of transistor 24*c* will now be described.

It is first assumed that the potential on the Z decoder signal line ZL and the potential on the local word line LWL (2*j*) or LWL (2*j*+1) are at a low level and a high level, respectively, the potential on the main word line /MWL changes from a high level to a low level and transistor 24*c* is not provided. In such a case, the potential at the node between transistors 24*a* and 24*b* starts dropping from a high level potential toward a low level potential in response to the conduction of transistor 24*a*. However, being a P channel transistor, transistor 24*a* is turned off when the difference between its gate potential and its source potential or drain potential reaches the threshold voltage Vth. Meanwhile, the gate potential and the source potential of transistor 24*a* are fixed to 0 V in response to the potential on the main word line /MWL and the potential on the Z decoder signal line ZL, respectively. Therefore, transistor 24*a* is turned off at a time point when the drain potential of transistor 24*a* lowers to a potential (>0) higher than 0 V by the threshold voltage Vth. At the same time, transistor 24*b* is turned off, so that no electric charge is discharged from transistor 24*a* hereinafter. As a result, the drain potential of transistor 24*a* is hereinafter maintained at a potential slightly higher than the original potential regarded as being at a low level. In other words, the local word line LWL (2*j*) or LWL (2*j*+1) connected to the drain of transistor 24*a* is not completely inactivated.

If transistor 24*c* is provided, however, the drain of transistor 24*a* and the Z decoder signal line ZL are electrically connected to each other through transistor 24*c* when the main word line /MWL is at a low level. As a result, even if transistor 24*a* is turned off, the drain potential of transistor 24*a* is lowered to the same potential as that of the Z decoder signal line ZL, that is, to 0 V because transistor 24*c* is N channel type.

As described in the foregoing, the provision of transistor 24*c* allows the local word line LWL (2*j*) or LWL (2*j*+1) to be completely inactivated unless the main word line /MWL and the Z decoder signal line ZL are at a low level and a high level, respectively.

As described above, each local decoder comprises three MOS transistors in the present embodiment. Therefore, the number of elements is reduced to approximately half that of a conventional device, which elements include transistors constituting the circuits arranged between the respective odd-numbered blocks BL1, BL3, . . . BL31 and the even-numbered blocks BL0, BL2, . . . BL30 adjacent thereto and two transistors constituting each inverter INV provided corresponding to these circuits.

In addition, the present embodiment reduces the time for selecting a local word line by row decoder 6 and Z decoder 18 and current consumption for the selection.

It is assumed, for example, that a 4-Mbit SRAM includes a memory cell array divided into 32 blocks in a row direction. In such a case, in each of local decoder LD (2*j*) and LD (2*j*+1) having the conventional circuit arrangement as shown in FIG. 34, connected to one Z decoder signal line ZL are the gates of transistors 800*a* and 800*b*, which transistor gates constitute a common gate. Therefore, assuming that a gate capacitance of a P channel MOS transistor per unit gate width (=1μm) is $2.44 \times 10^{-3}$pF and a gate capacitance of an N channel MOS transistor per unit gate width is $2.18 \times 10^{-3}$pF, the total of parasitic capacitance of one Z decoder signal line ZL will be expressed by the following equation.

$$(2.44 \times 10^{-3} + 2.18 \times 10^{-3}) \times 7 \times 256 = 8.28 pF$$

In the above-expressed equation, 7 denotes a numerical value showing a gate width indicated in a parenthesis of FIG. 34 and 256 denotes the number of local decoders connected to one Z decoder signal line ZL.

Similarly, connected to one main word line MWL in each of the local decoders LD (2*j*) and LD (2*j*+1) are the gates of transistors 800*c* and 800*d*, which gates constitute a common gate. Therefore, the total parasitic capacitance of one main word line MWL will be expressed by the following equation.

$$(2.44 \times 10^{-3} + 2.18 \times 10^{-3}) \times 7 \times = 1.04 pF$$

In the above-expressed equation, 7 denotes a numerical value in a parenthesis of FIG. 34 and 32 denotes the number of blocks, that is, the number of local decoders connected to one main word line MWL.

Consideration will be now given to a case where the circuit arrangement shown in FIGS. 3 and 4 is used for each of the local decoders LD (2j) and LD (2j+1). In such a case, one Z decoder signal line is connected to the sources of transistors 24a and 24c in each of the local decoders LD (2j) and LD (2j+1). Therefore, assuming that a junction capacitance of a P channel MOS transistor per unit gate width is $8\times10^{-4}$ pF and a junction capacitance of an N channel MOS transistor per unit gate width is $6\times10^{-4}$ pF, the parasitic capacitance of one Z decoder signal line ZL will be obtained by the following equation.

$$(8\times10^{-4}\times20 + 6\times10^{-4}\times3)\times256+0.5=5.06\text{pF}$$

In the above-expressed equation, 20 and 3 denote the gate widths of transistors 24a and 24c indicated in the parentheses, respectively, shown in FIG. 4, 256 denotes the number of local decoders connected to one Z decoder signal line ZL and 0.5 denotes a parasitic capacitance of one local word line. In this embodiment, the signal on the Z decoder signal line ZL drives the corresponding local word line MWL (2j) or MWL (2j+1) when transistor 24c is turned on. Therefore, the parasitic capacitance of the local word line should be included as the parasitic capacitance of the Z decoder signal line.

Similarly, one main word line /MWL is connected to the gates of transistors 24a and 24b in each of the local decoders LD (2j) and LD (2j+1) Therefore, the total parasitic capacitance of one main word line /MWL will be obtained by the following equation in consideration of the gate capacitance of transistors 22a and 22b constituting the inverter INV connected to the main word line /MWL.

$$(2.44\times10^{-3}\times22+2.18\times10^{-3}\times12)\times32=2.56\text{pF}$$

In the above-expressed equation, 22 denotes a sum of the gate width (20) of transistor 24a and the gate width (2) of transistor 22a shown in the parentheses in FIG. 4, 12 denotes a sum of the gate width (10) of transistor 24b and the gate width (2) of transistor 22b shown in FIG. 4 and 32 denotes the number of local decoders connected to one main word line /MWL.

As is clear from the foregoing description, a load capacitance (5.06pF) per one Z decoder signal line in the present embodiment is much small than that (8.28pF) of a conventional SRAM. In addition, while a load capacitance (2.56pF) per one main word line in the present embodiment is slightly larger than that (1.04pF) of the conventional SRAM, the amount of the increase is smaller than said amount of decrease.

The Z decoder signal line and the main word line having the reduced amount of parasitic capacitance requires a shorter time for charging/discharging these signal lines at the time of local word line selection, which fact enables rapid activation of the local word line. Therefore, a parasitic capacitance of these signal lines is preferably small from a view point of an increase in a local word line selecting speed. According to the present embodiment, a local word line is selected by Z decoder 18 and row decoder 6 at a high speed. In addition, reduced current is consumed for charging and discharging the load capacitances of the Z decoder signal line ZL and the main word line /MWL, thereby reducing current consumed by row decoder 6 and Z decoder 18 for selecting a local word line.

In this embodiment as described above, since one of two types of signal lines connected to each of the local decoders LD (2j) and LD (2j+1), that is, one of the main word line /MWL and the Z decoder signal line ZL is connected not to the gate of the MOS transistor but to a drain (source) with small parasitic capacitance, a load capacitance of a signal line driving each of the local decoders LD (2j) and LD (2j+1) is reduced to increase a local word line selection speed and reduce a current consumption in the local word line selection.

Figure 6:
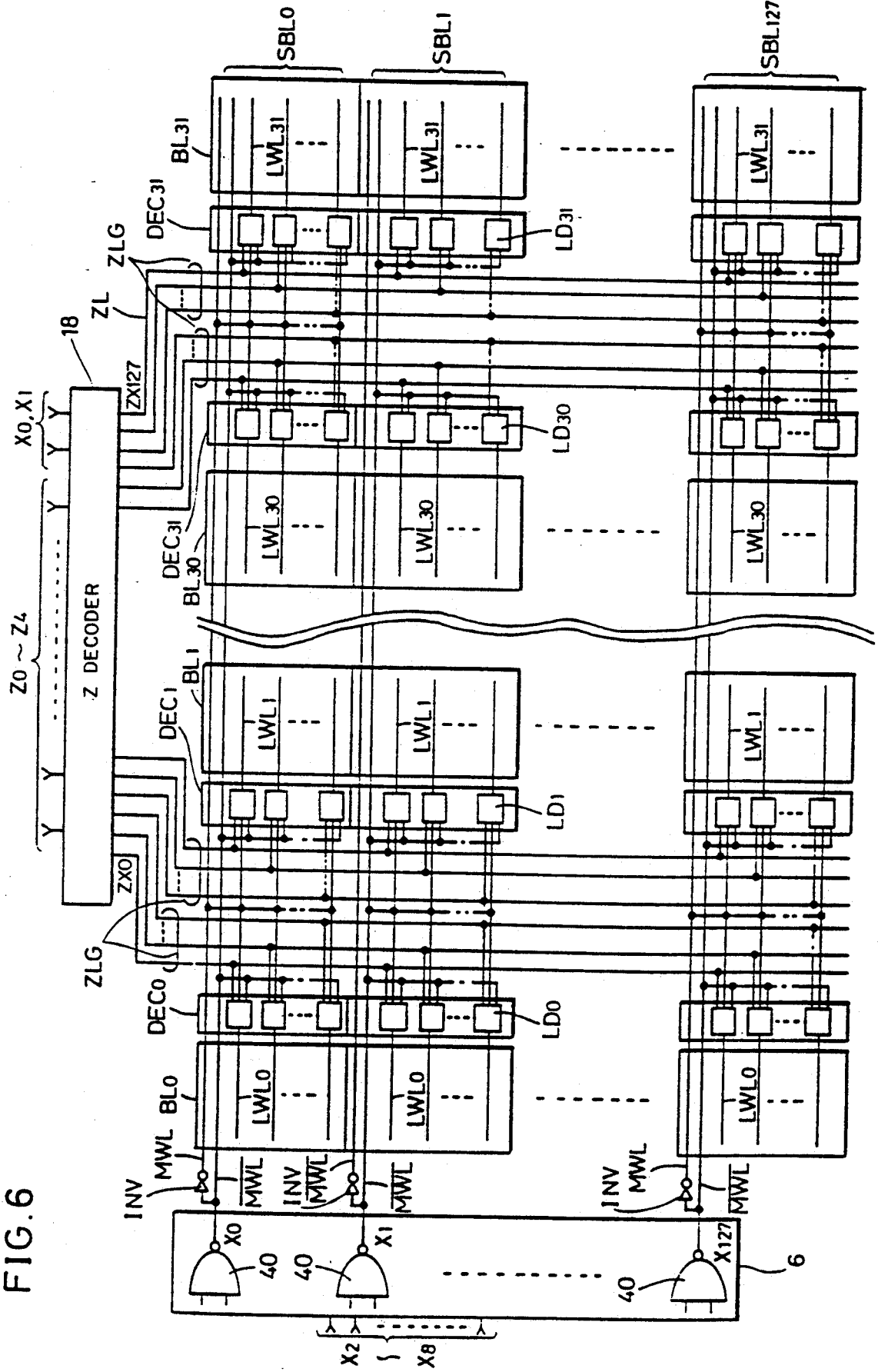
FIG. 6 is a circuit diagram showing another example of an arrangement of a main part of the SRAM of FIG. 1.

FIG. 6 is a circuit diagram showing another example of an arrangement of a main part of the SRAM shown in FIG. 1 according to another embodiment of the present invention. While in the above-described embodiment, a plurality of inverters INV for inverting the output signals /X0-/X127 from row decoder 6 are provided corresponding to each main word line /MWL, such inverters can be provided one for each main word line /MWL as shown in FIG. 6. In such a case, the output signal from each inverter INV may be applied in common to all the local decoders LD (2j) and LD (2j+1) connected to the corresponding main word line /MWL. That is, each output signal line of row decoder 4 provided corresponding to each of the sub-block groups SBL0-SBL127 and an output signal line of the corresponding inverter INV constitute a complementary signal line pair of /MWL and MWL in FIG. 6.

Figure 7:
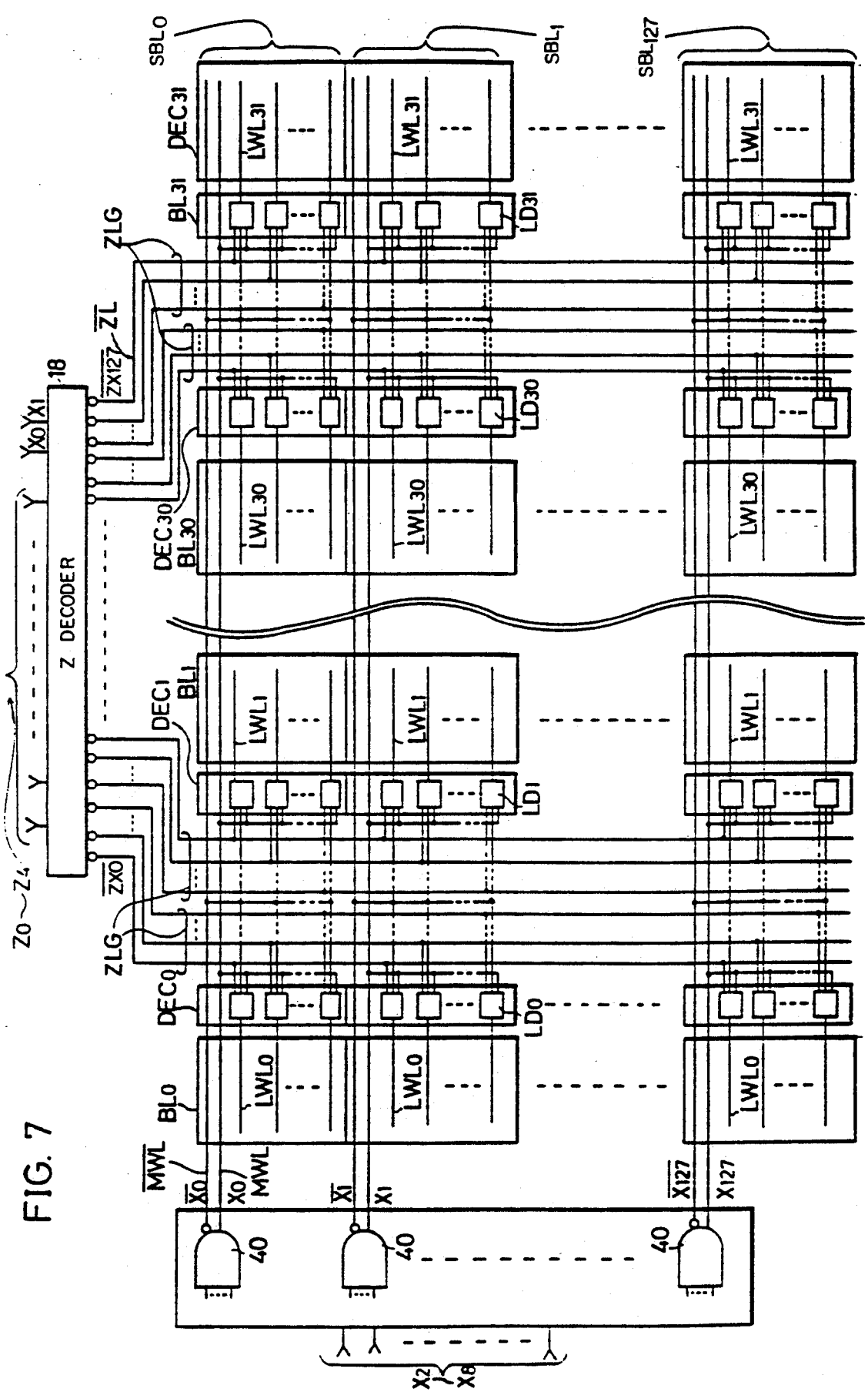
FIG. 7 is a circuit diagram showing a further example of an arrangement of the main part of the SRAM of FIG. 1.

FIG. 7 is a circuit diagram showing a further example of an arrangement of a main part of the SRAM shown in FIG. 1 according to still further embodiment of the present invention.

It is assumed in FIG. 7 that all the output signals from Z decoder 18 are inactive signals /ZX0-/ZX127. Similar to the embodiment shown in FIG. 6, a pair of complementary main word line pair of /MWL and MWL is provided corresponding to each of the sub-block groups SBL0-SBL127. Row decoder 6 outputs 128 inactive signals X0 -/X127 and 128 signals X0-X127 complementary to these 128 signals /X0-/X127. Each complementary main word line pair of /MWL and MWL receives the corresponding one of 128 pairs of complementary signals output by row decoder 6. An arrangement of the other part shown in FIG. 7 is the same as that of the embodiment shown in FIG. 6. Unlike in the previous embodiment, therefore, each of the local decoders LD (2a) and LD (2a+1) receives an inactive signal from Z decoder 18.

Figure 8:
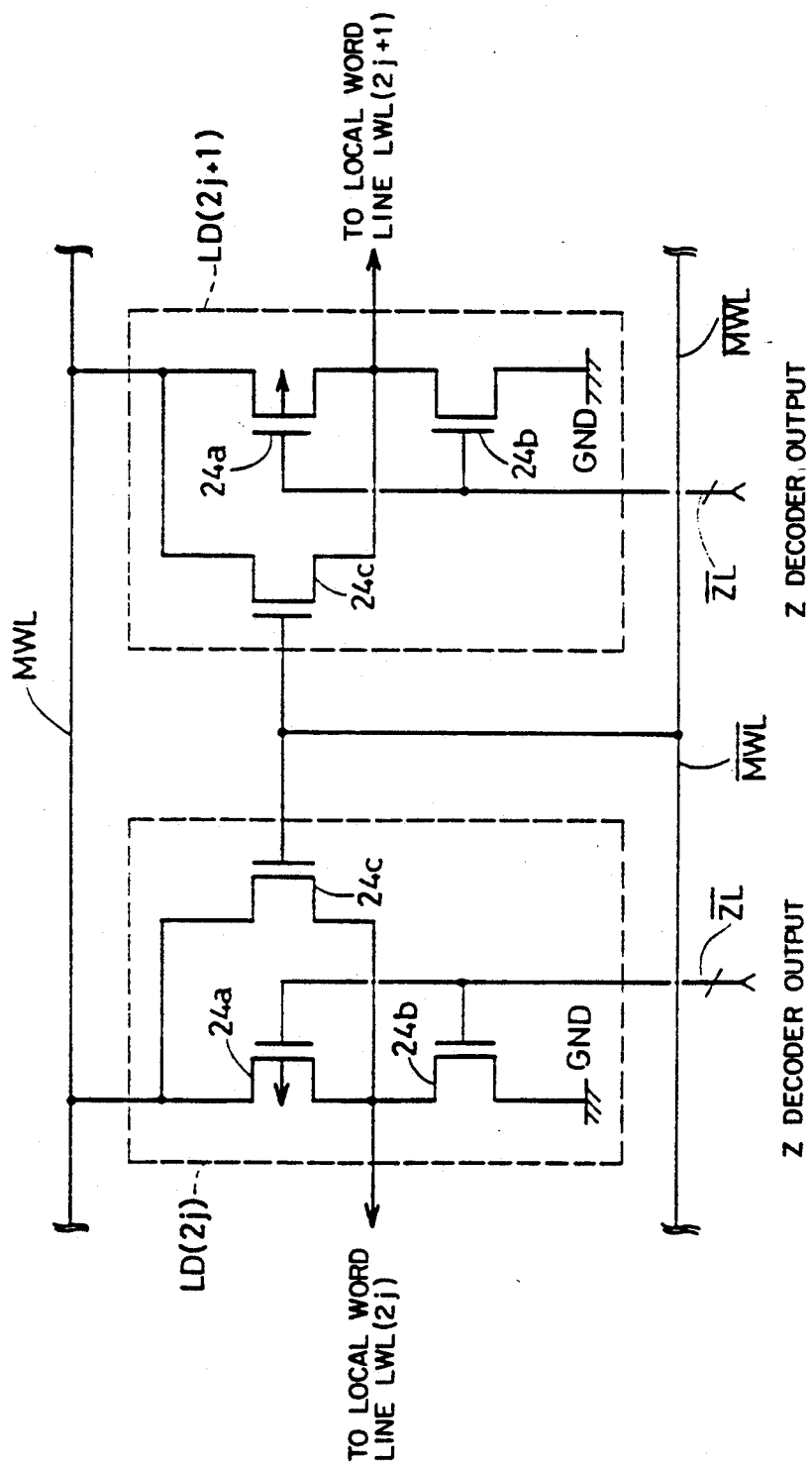
FIG. 8 is a circuit diagram showing one example of an arrangement of a local decoder shown in FIG. 7.

FIG. 8 is a circuit diagram showing an arrangement of local decoders LD (2j) and LD (2j+1) of FIG. 7. Arbitrary two local decoders LD (2j) and LD (2j+1) adjacent to each other are illustrated in FIG. 8 as a representative. An arrangement and operation of each local decoder according to the present embodiment will be described with reference to FIG. 8.

As can be seen from the comparison between FIG. 8 and FIG. 3, the local decoders LD (2j) and LD (2j+1) of the present embodiment are obtained by exchanging a signal on the main word line for a signal on the Z decoder signal line of FIG. 3. That is, P channel MOS transistor 24a and N channel MOS transistor 24b are connected to each other in series between the corresponding main word line MWL and ground GND with the gates thereof connected to the corresponding Z decoder signal line /ZL, in the present embodiment. The node between transistors 24a and 24b is connected to the corresponding local word line LWL (2a) or LWL (2a+1). As in the previous embodiment, the gate of transistor 24c is connected to the corresponding main word line /MWL.

In each of the local decoders LD (2j) and LD (2j+1), when a Z decoder signal line /ZL is at a high level transistor 24b is turned on and transistor 24a is turned off, whereby the corresponding local word line LWL (2j) or LWL (2j+1) is inactivated irrespective of the potential level of the main word line MWL.

Conversely, in each of the local decoders LD (2j) and LD (2j+1), when the Z decoder signal line/ZL is at a low level, transistor 24b is turned OFF and transistor 24a is turned ON, whereby the corresponding local word line LWL (2j) or LWL (2j+1) is inactivated only when the potential on the main word line MWL is at a high level (when the potential on the main word line /MWL is at a low level).

As described above, also in the present embodiment, each of the local word lines LWL (2j) and LWL (2j+1) is activated only when the corresponding main word line and the corresponding Z decoder signal line attain a potential indicating an activated state.

In addition, transistor 24c functions, also in this embodiment, to reliably force the potential on the corresponding local word line LWL (2j) or LWL (2j+1) to the potential (0 V) indicating an inactivated state in all the cases where at least one of the corresponding main word line and the corresponding Z decoder signal line attains a potential indicating an inactivated state.

That is, in FIG. 8, with the potential at the node between transistors 24a and 24b attaining a high level when both the potentials on the main word line MWL and the corresponding Z decoder signal line /ZL attain a low level, transistor 24a is turned off at a time point when the potential at its node lowers to the threshold voltage Vth of the MOS transistor, however, the transistor 24c is turned on in response to the high level potential on the main word line /MWL, so that the electric charge stored at the node is pulled out onto the main word line MWL through transistor 24c. As a result, the local word line MWL totally inactivated state.

As can be seen from FIG. 8, the main word line MWL is connected in common to the sources of the respective transistors 24a of the adjacent local decoders LD (2j) and LD (2j+1) according to the present embodiment. This arrangement reduces a gate width of the P channel transistor in the local decoder. Such a effect obtained by the present embodiment will be described in detail with reference to FIGS. 9 and 10.

Figure 10:
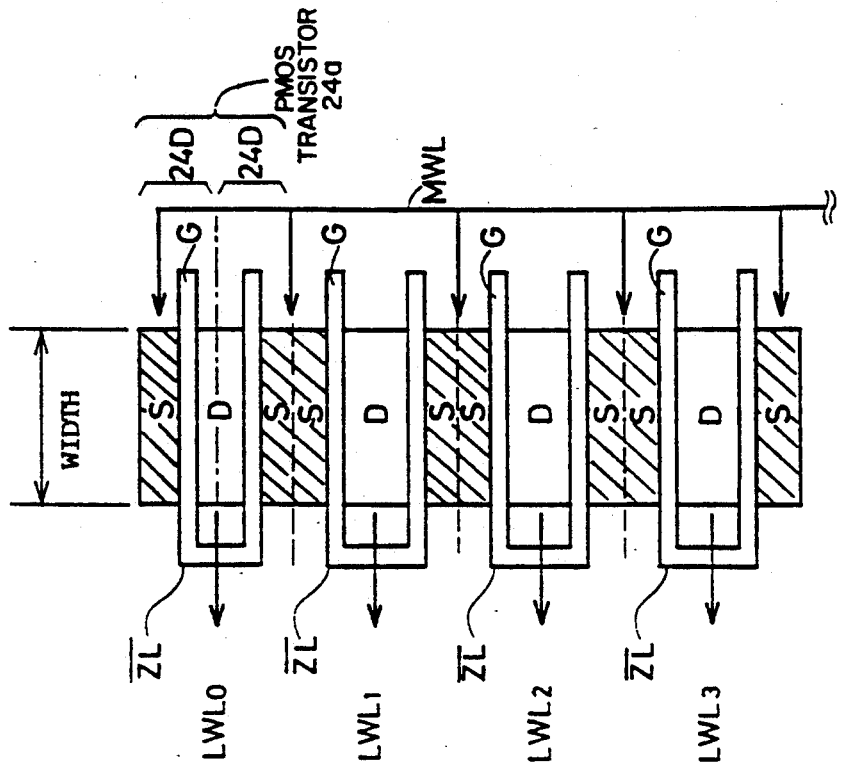
FIG. 10 is a plan view showing an example of a layout, on a semiconductor substrate, of P channel transistors in a plurality of local decoders each having the arrangement shown in FIG. 8 which are provided in the same row.
Figure 9:
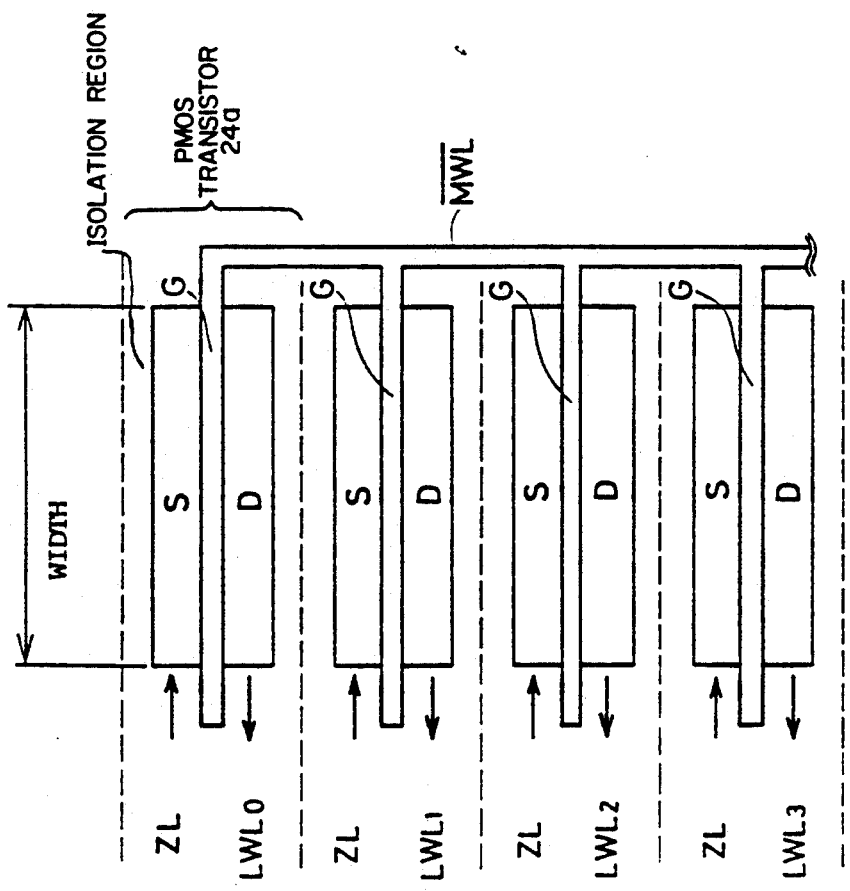
FIG. 9 is a plane view showing an example of a layout, on a semiconductor substrate, of P channel transistors in a plurality of local decoders each having the arrangement as shown in FIG. 3 which are provided in the same row.

FIGS. 9 and 10 are plan views showing arrangements of P channel transistors on the semiconductor substrate in a plurality of local transistors arranged corresponding to the same row, FIG. 9 showing a case where a local decoder is structured as shown in FIG. 3 and FIG. 10 showing a case where a local decoder is structured as shown in FIG. 8.

With reference to FIGS. 2, 3 and 9, different Z decoder signal lines ZL are connected to the respective sources of 32 P channel transistors 24a included in the column decoders LD0-LD31 provided in the same row, respectively. Accordingly, the respective sources of these transistors 24a should be formed independently.

As shown in FIG. 9, these transistors 24a are formed on the semiconductor substrate with isolation regions provided therebetween. That is, each transistor 24a includes a source region S to be connected to the corresponding Z decoder signal line ZL, a drain region D to be connected to the corresponding local word line LWL (2j) or LWL (2j+1) and a gate region G formed spanning the source region S and the drain region D. The gates of these transistors 24a are connected to the same main word line /MWL and the gate region G is used in common by these transistors 24a.

On the other hand, as can be seen from FIGS. 7 and 8, the sources of the P channel transistors 24a in the local decoders LD (2j) and LD (2j+1) provided in the corresponding row are connected to the same main word line MWL in the present embodiment. Accordingly, these transistors 24a can share the same source.

Then, transistors 24a included in the arbitrary local decoders LD (2j) and LD (2j+1) adjacent to each other are formed to have the common source on the semiconductor substrate. More specifically, as shown in FIG. 10, the P channel transistor 24a in each of the local decoders LD (2j) and LD (2j+1) includes two source regions S formed to be shared as the source regions of the P channel transistors 24a in its adjacent local decoders, a drain region D formed between these two source regions S and an independent gate region G. The gate region G is provided spanning the drain region D and the two source regions S. As a result, each transistor 24a of FIG. 8 is formed as two P channel transistors 240 connected in parallel to each other on the semiconductor substrate in practice. All the source regions S are connected to the same main word line MWL and each drain region D is connected to the corresponding local word line LWL (2j) or LWL (2j+1). All the gate regions G are connected to the different Z decoder signal lines /ZL.

As described above, according to the present embodiment, since no provision of an isolation region is required for forming, on the semiconductor substrate, the P channel transistors 24a of the local decoders provided in the same row occupy less area on the semiconductor substrate as compared with the previous embodiment. Furthermore, current drivability of each transistor 24a is equal to that of a circuit connected in parallel between two transistors 240. Therefore, in order to obtain a transistor 24a, according to the layout shown in FIG. 10, the transistor having the same current drivability as that of the transistor 24a obtained according to the layout shown in FIG. 9, the transistor 240 requires half the width of transistor 24a of FIG. 9. As a result of the foregoing, the present embodiment enables a significant reduction in area necessary for forming the P channel transistors 24a in local decoders, which fact allows a further reduction of the local decoder area.

In any of the embodiments shown in FIGS. 2, 6, and 7, when memory cell array 1 includes memory cells arranged in a matrix of $2^9$ (=512) rows $\times 2^{11}$ (=2048) columns, for example, row address signals and column address signals are distributed and applied to row decoder 6, column decoder 7 and Z decoder 18 as shown in the table of FIG. 31.

Figure 11:
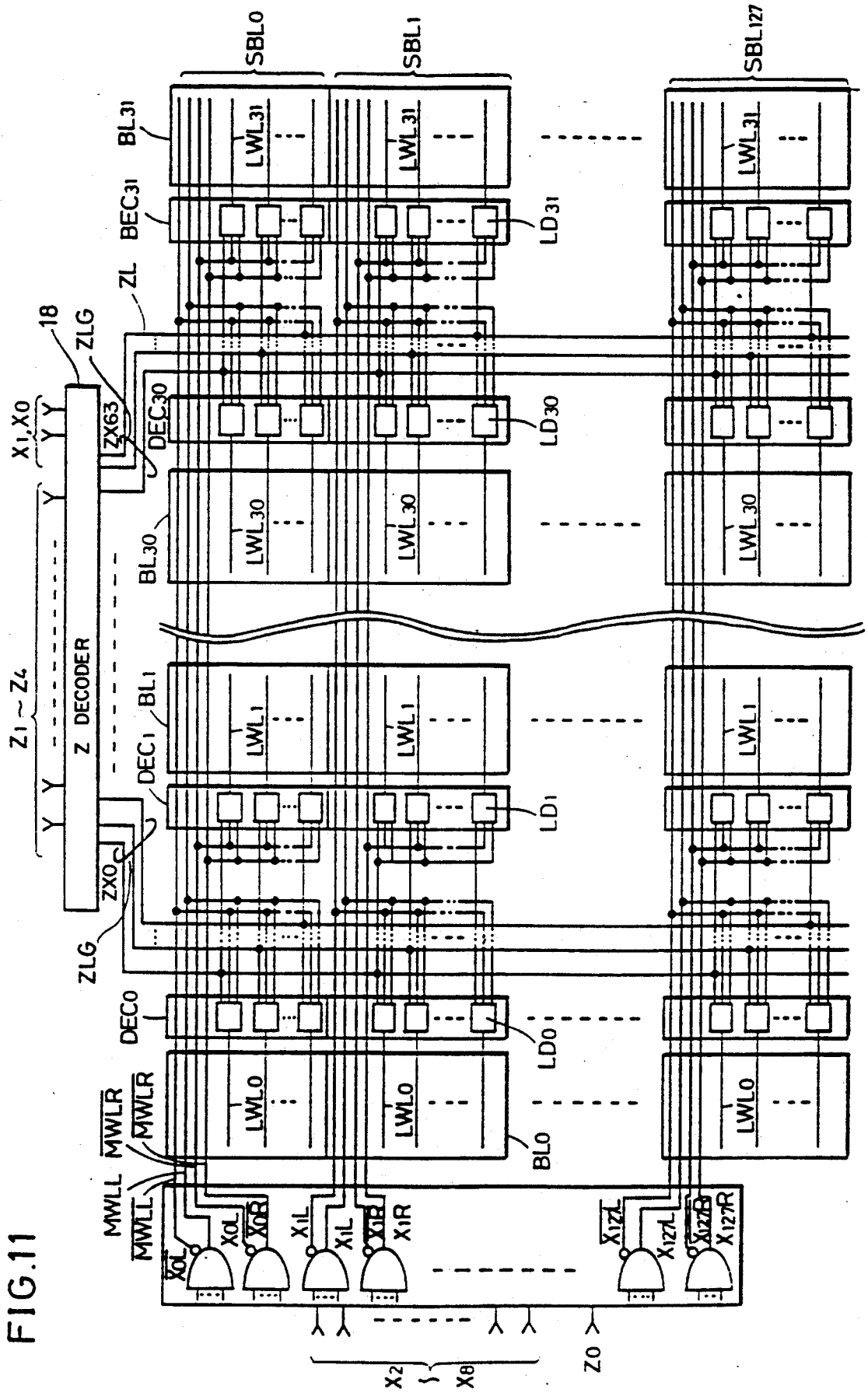
FIG. 11 is a circuit diagram showing a further example of an arrangement of the main part of the SRAM shown in FIG. 1.

FIG. 11 is a circuit diagram showing a still further example of an arrangement of the main part of the SRAM of FIG. 1 according to a still further embodiment of the present invention.

With reference to FIG. 11, in the present embodiment, two pairs of complementary main word lines /MWLL and MWLL, and /MWLR and MWLR are provided for each of the sub-block groups SBL0-SBL127 and one Z decoder signal line group ZLG is provided in common for each even-numbered block BL (2j) and the odd-numbered block BL (2j+1) adjacent thereto. That is, unlike the embodiment shown in FIG. 7, the same Z decoder signal line ZL is connected to two local decoders LD (2j) and LD (2j+1) respectively provided in the even-numbered BL (2j) and the odd-numbered block BL (2j+1) adjacent thereto in the same row. Therefore, half the number of 32 blocks, that is, 16 Z decoder signal line groups ZLG are provided. On the other hand, twice the 128 sub-block groups, that is, 256 pairs of complementary main word lines are provided.

Out of all the local decoders LD0, LD2, ..., LD30 provided corresponding to all the even-numbered blocks BL0, BL2, ... BL30, one complementary main word line pair of /MWLL and MWLL (hereinafter referred to as an even-numbered complementary main word line pair) is connected in common to the local decoders which are provided corresponding to the sub-block groups SBL0-SBL127, and out of all the local decoders LD1, LD3, ... LD31 provided corresponding to all the odd-numbered blocks BL1, BL3, BL31, the other pair of /MWLR and MWLR (hereinafter referred to as an odd-numbered main word line pair) is connected in common to the local decoders provided corresponding to the sub-block groups SBL0-SBL127.

Z decoder 18 decodes a one bit fewer address signal than that of the above-described embodiment to activate one of the plurality of Z decoder signal lines ZL included in one of the 16 Z decoder signal line groups ZLG. Row decoder 6 decodes a one bit more address signal than that of the above-described embodiment to activate only one of the 256 complementary main word line pairs /MWLL and MWLL, and /MWLR and MWLR.

In the present embodiment, a part of the output signals from row address buffer 5 is applied to row decoder 6 as shown by the broken line in FIG. 1. When the memory cell array includes memory cells arranged in a matrix of 512 rows x 2048 columns, for example, the row address signals and column address signals should be distributed and applied to row decoder 6 and Z decoder 18 as shown in the table of FIG. 12. FIG. 12 is a table showing the address signals to be input to row decoder 6 and Z decoder 18 in a case of a memory cell array including memory cells arranged in 512 rows and 2048 columns according to the present embodiment.

Comparing FIG. 12 with FIG. 31, unlike any of the above-described embodiments, out of the block address signals Z0-Z4 included in a column address signal, the least significant bit signal Z0 is input to row decoder 6, and four-bit signals Z1-Z4 of the block address signal other than the least significant bit signal Z0 are input to Z decoder 18 in the present embodiment. The row address signal is distributed and applied to row decoder 6 and Z decoder 18 as in the above-described embodiments. As a result, as shown in FIG. 11, row decoder 6 outputs complementary signal pairs /x0L, x0L, /x0R, x0R, /x1L, x1L, /x1R, x1R, ..., /x127L, x127L, /x127R and x127R twice those of the above-described embodiments and Z decoder 18 outputs signals zx0-zx63 half the number of those of the above-described embodiments.

Figure 13:
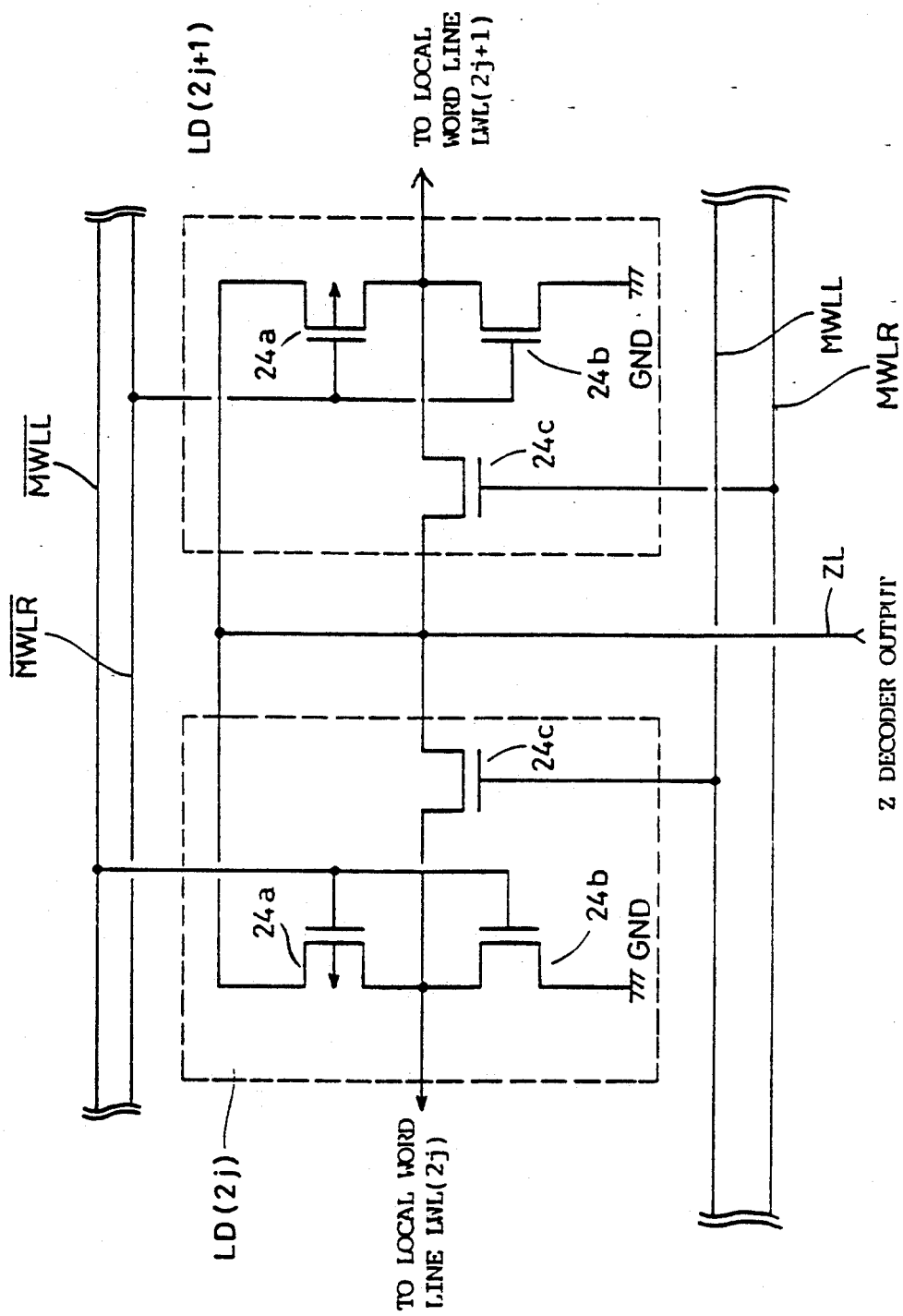
FIG. 13 is a circuit diagram showing one example of an arrangement of the local decoder shown in FIG. 11.

FIG. 13 is a circuit diagram showing an arrangement of local decoders LD (2j) and LD (2j+1) according to the present embodiment. FIG. 13 shows, as a representative, arbitrary adjacent local decoders LD (2j) and LD (2j+1) provided in the same row as shown in FIG. 11.

With reference to FIG. 13, each of the local decoders LD (2j) and LD (2j+1) has the same arrangement as those of the embodiments shown in FIGS. 2 and 6, with a difference being that the gates of transistors 24a-24c in a local decoder LD (2j) provided corresponding to each even-numbered block and the gates of transistors 24a-24c in a local decoder LD (2j+1) provided corresponding to each odd-numbered block are connected to different main word line pairs /MWLR and MWLR, and /MWLL and MWLL, respectively. The sources of transistors 24a and 24c in a local decoder LD (2j) and the sources of transistors 24a and 24c in a local decoder LD (2j+1) ar connected to the same Z decoder signal line ZL.

The local word line LWL (2j) connected to the even-numbered local decoder LD (2j) therefore becomes activated only when the corresponding even-numbered main word line /MWL and the corresponding Z decoder signal line ZL attain a low level and a high level, respectively. Similarly, the local word line LWL (2j+1) connected to the odd-numbered local decoder LD (2j+1) becomes activated only when the corresponding odd-numbered main word line /MWLR and the corresponding Z decoder signal line ZL attain a low level and a high level, respectively. In the present embodiment, one Z decoder signal line ZL attaining a high level signifies that one of the two types of input signals to the respective two decoders LD (2j) and LD (2j+1) are activated at the same time. However, it is not possible for both of the potential on the even-numbered complementary main word line pair of /MWLR and MWLR which potential is the other input signal to the local decoder LD (2j) and the potential on the odd-numbered complementary main word line pair of /MWLL and MWLL which potential is the other input signal to the local decoder LD (2j+1) to attain the potential indicating an activated state at the same time. This eliminates a possibility that one local word line LWL (2j) and one local word line LWL (2j+1) are activated at the same time.

As described above, it is not the output of Z decoder 18 but the output of row decoder 6 in the present embodiment that determines which is to be activated, a local word line LWL (2j) included in an even-numbered block BL (2j) or a local word line LWL (2j+1) included in an odd-numbered block BL (2j+1). As a result, as shown in FIG. 11, only a single local word line can be selected by using Z decoder signal lines half the number required in a conventional device, thereby enabling a reduction in the number of elements of each local decoder as well as a reduction in the number of signal lines provided in a column direction.

Figure 14:
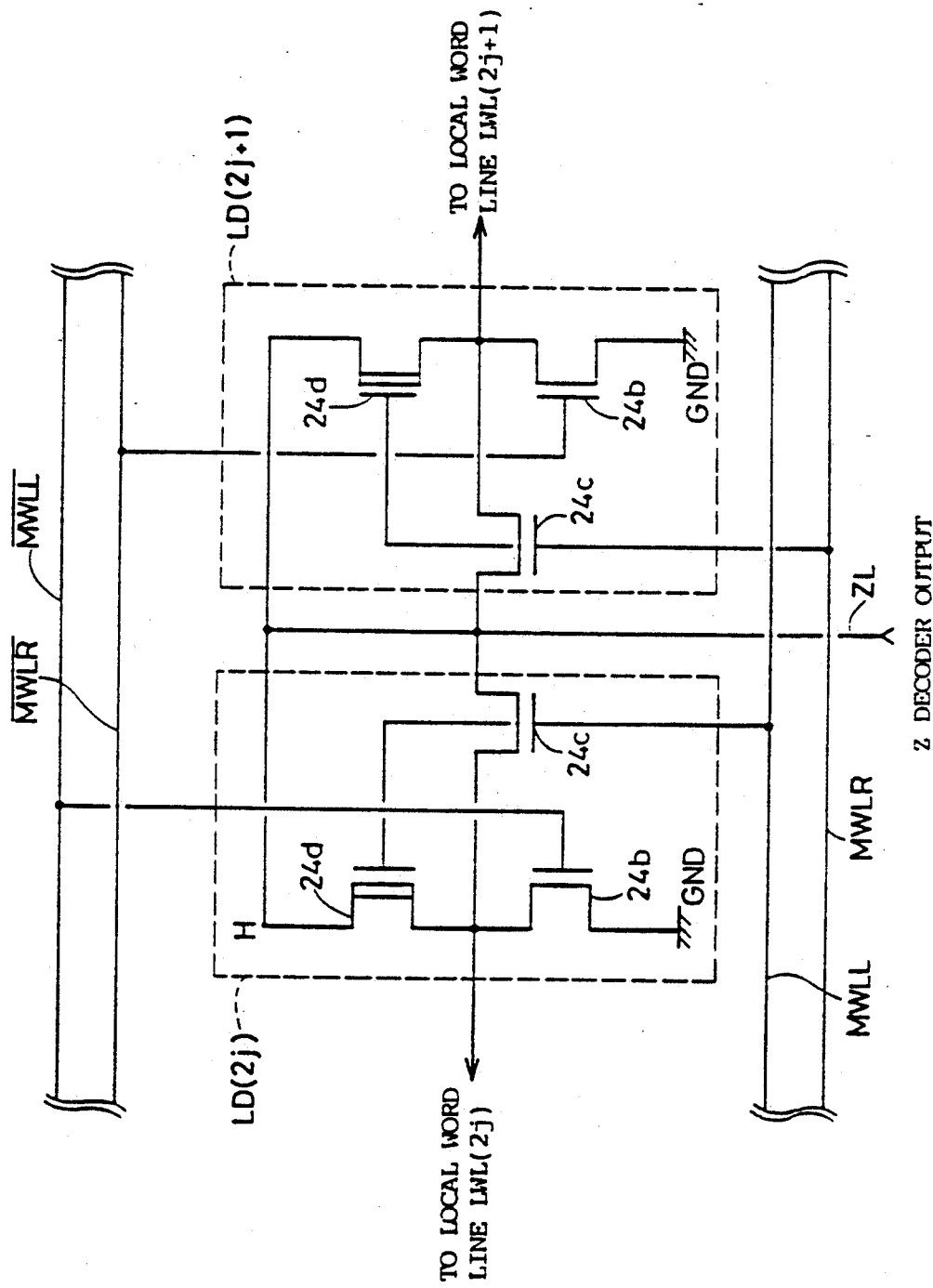
FIG. 14 is a circuit diagram showing another example of an arrangement of the local decoder shown in FIG. 11.
Figure 15:
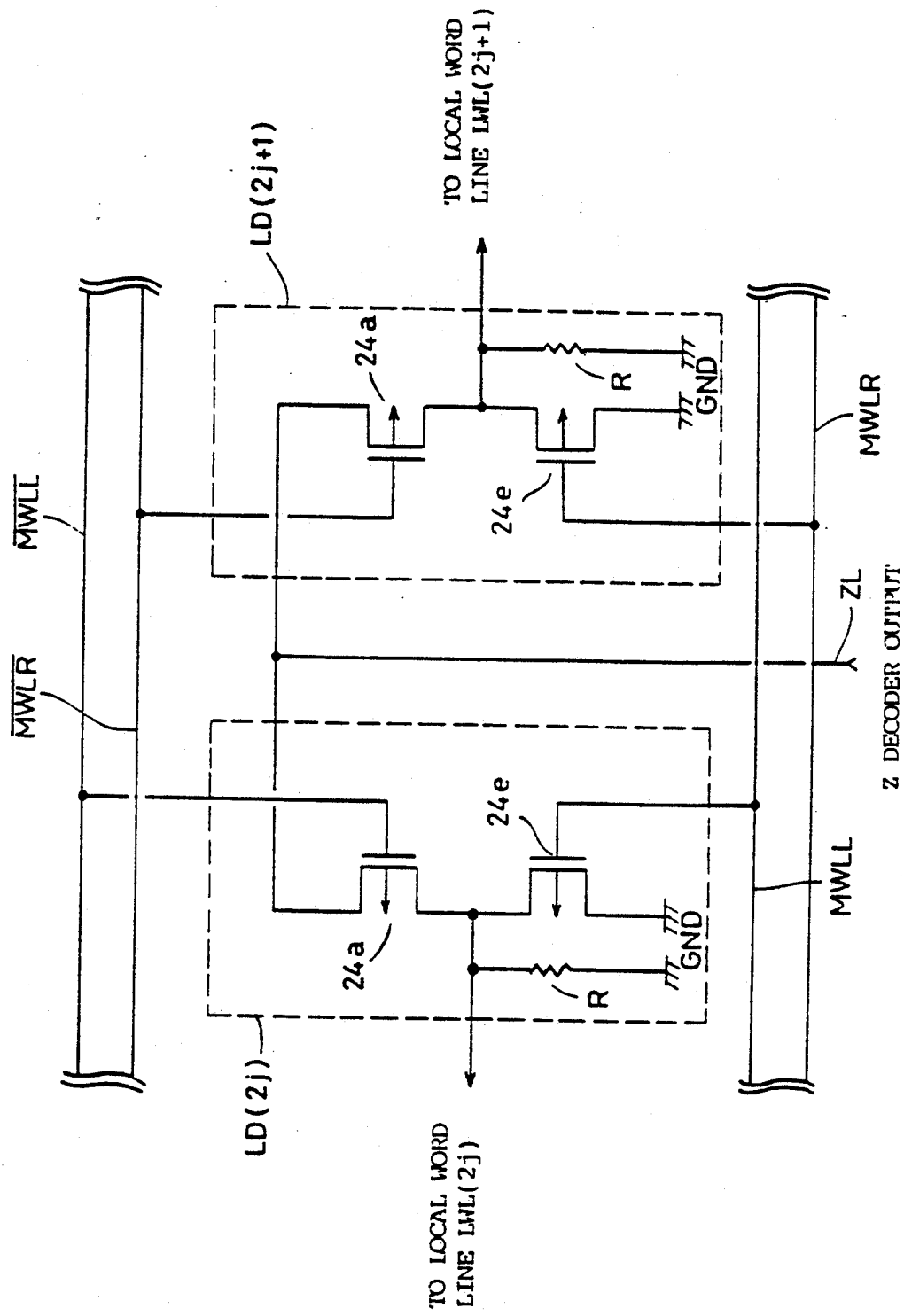
FIG. 15 is a circuit diagram showing a further example of an arrangement of the local decoder shown in FIG. 11.
Figure 16:
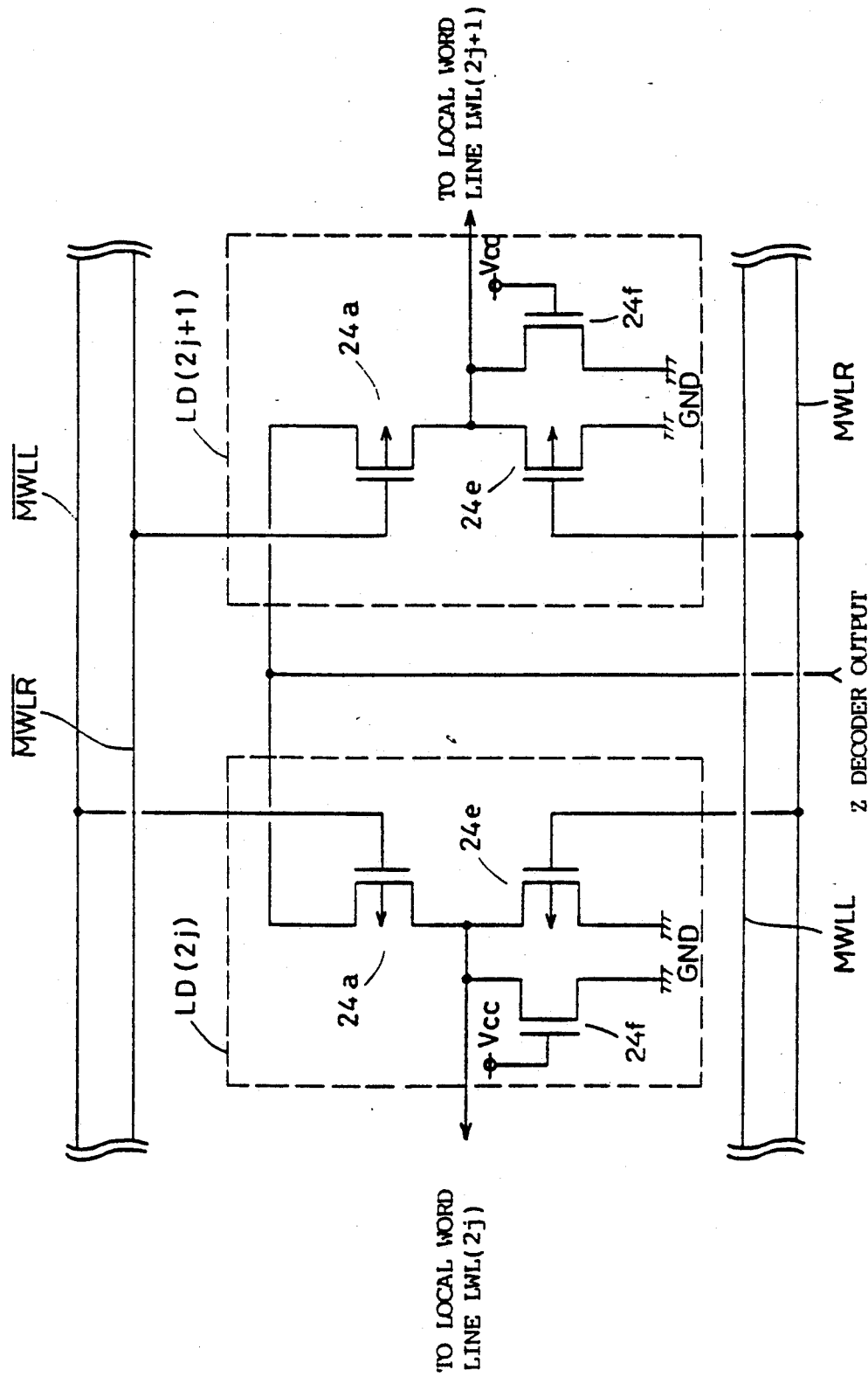
FIG. 16 is a circuit diagram showing a still further example of an arrangement of the local decoder shown in FIG. 11.

FIGS. 14 to 16 are circuit diagrams showing other examples of an arrangement of such a local decoder as can be arranged as shown in FIG. 11 and these drawings show a still further embodiments of the present invention.

Although the local decoder according to the embodiment shown in FIG. 13 includes both a P channel transistor and an N channel transistor, the local decoder may be comprised only of either N channel transistors or P channel transistors.

In a case of a local decoder only comprising N channel transistors as shown in FIG. 14, for example, P channel transistor 24a of FIG. 13 should be replaced by N channel MOS transistor 24d having a lower threshold voltage Vth. In this case, the gate of transistor 24d is connected to a main word line MWLL or MWLR of the corresponding main word line pair, high level potential of which line is regarded as being in an active state. As a result, the local decoders LD (2j) and LD (2j+1) are allowed to transmit the potential on the corresponding Z decoder signal line onto the corresponding local word lines LWL (2j) and LWL (2j+1), respectively, only when the corresponding even-numbered complementary main word line pair of /MWLR and MWLR and the corresponding odd-numbered complementary main word line pair of /MWLL and MWLL are activated.

The following is the reason for using an N channel transistor 24d with a low threshold voltage in place of transistor 24a.

It is now assumed that when the potential at the node between transistors 24d and 24b is 0 V, for example, the potentials on the Z decoder signal line ZL and the corresponding main word line /MWLR or /MWLL attain a high level and a low level, respectively, in FIG. 14. In such a case, the potential at the node starts increasing in response to the conduction of transistor 24d. However, being N channel transistor, transistor 24d is turned off at a time point when a difference voltage between the gate potential and source potential or drain potential reaches the threshold voltage Vth. Therefore, transistor 24d is turned off when the potential at the node increases to the potential (Vcc-Vth) which is lower than the gate potential of transistor 24d being equal to the active state potential (that is, power supply potential: high level) Vcc of the corresponding main word line MWLL or MWLR by the threshold voltage Vth of transistor 24d. As a result, the local word line LWL (2j) or LWL (2j+1) connected to the node is fixed to the potential (Vcc-Vth) slightly lower than the potential Vcc indicating a complete active state. Then, the use of transistor 24d with a small threshold voltage Vth enables the respective local word lines LWL (2j) and LWL (2j+1) to attain a potential more approximate to the original potential Vcc in an active state.

In case of a local decoder only comprising P channel transistors, N channel transistor 24b of FIG. 13 should be replaced by P channel MOS transistor 24e and a resistance shown in FIG. 15, for example. The resistance element R is provided between the node between the transistors 24a and 24e and ground GND. Out of the corresponding even-numbered complementary pair of main word lines /MWLL and MWLL, the gate of transistor 24e in the local decoder LD (2j) is connected to the main word line MWLL which high level potential is regarded as being in an active state, and out of the corresponding odd-numbered complementary pair of main word lines /MWLR and MWLR, the gate of transistor 24e in the local decoder LD (2j+1) is connected to the main word line MWLR which high level potential is regarded as being in an active state. Thus, the potential on each of the local word lines LWL (2j) and LWL (2j+1) attains a low level irrespective of the potential on the corresponding Z decoder signal line ZL when the corresponding complementary main word line pair of /MWLL and MWLL or /MWLR and MWLR is inactivated.

In the present embodiment, the resistance element R functions to reliably force, to 0 V, the potential on each of the local word lines LWL (2j) and LWL (2j+1) to be completely inactivated.

When the potential at the node between transistors 24a and 24e is at a high level in arbitrary local decoder LD (2j) or LD (2j+1) for example, if both the potential on the corresponding main word line /MWLR or /MWLL and the potential on the corresponding Z decoder signal line ZL attain a low level, the potential on the node lowers only to a potential higher than 0 V by the threshold voltage Vth of transistor 24a as described above without the resistance element R. However, the provision of the resistance element R causes the positive charge corresponding to the threshold voltage Vth stored at the node to be discharged to ground GND through the resistance element R, so that the potential at the node lowers to 0 V. Similarly, in a case where the corresponding main word line MWLL or MWLR attains a low level when the potential at the node is at a high level, the potential on the node lowers only to a potential higher than 0 V by the threshold voltage Vth of transistor 24e without the resistance element R. Provision of the resistance element R causes the charge to be discharged from the node to ground GND, whereby the potential at the node becomes 0 V. The resistance element R should have such a resistance value as enabling the potential on the corresponding local word line LWL (2j) or LWL (2j+1) to attain a sufficiently high level when the potential on the corresponding main word line /MWLL or /MWLR and the potential on the corresponding Z decoder signal line ZL are at a low level and a high level, respectively, in spite of discharging through the resistance element R. For example, the resistor R may have a resistance value as large as 10 kΩ in consideration of the current drivability of transistor 24a.

As described above, a local decoder comprising transistors of the same polarity requires less area on the semiconductor substrate. Such effects of the embodiments shown in FIGS. 14 and 15 will be described in more detail in the following.

In general, source/drain regions of a P channel transistor on a semiconductor substrate are formed by two P type regions formed in an N well and conversely, source/drain regions of an N channel transistor on a semiconductor substrate are formed by two N type regions provided in a P well. In general, on a semiconductor substrate having a P channel transistor and an N channel transistor provided thereon, one of the P well and the N well is formed as an island for the other. Therefore, when in forming a P channel transistor and an N channel transistor to be adjacent to each other on a semiconductor substrate, the P channel transistor and the N channel transistor are provided sufficiently spaced apart from each other in order to suppress generation of leakage current at an PN junction portion formed at a boundary portion between these transistors, thyristor operation so-called latch-up, and the like.

Local decoders each including transistors of different polarities require their elements to be disposed sufficiently spaced apart from each other on the semiconductor substrate.

On the other hand, when in forming two transistors of the same polarity connected in series on a semiconductor substrate, a source region or a drain region of one transistor and a source region or a drain region of the other transistor can be formed of a common P type region or a common N type region. Therefore, local decoders each comprising transistors of the same polarity allow their elements to be disposed spaced not so much apart from each other on the semiconductor substrate. As a result, a local decoder comprising only the transistors of the same polarity occupies further less area on the semiconductor substrate.

In the embodiment shown in FIG. 15, in order to reliably force each of the local word lines LWL (2j) and LWL (2j+1) to 0 V when both of the corresponding complementary main word line pair of /MWLL and MWLL or MWLR and MWLR, and the corresponding Z decoder signal line ZL are not activated, a resistance element R is provided as a discharging path from the local word line to ground GND. However, the discharging path is not necessarily formed by a resistance element but may be formed by any element having the same function as a resistance element. For example, as shown in FIG. 16, N channel MOS transistor 24f having a gate connected to power supply Vcc may be used for this discharging path. Transistor 24f should have approximately the same ON resistance value as that of resistance element 15 of FIG. 15.

Figure 17:
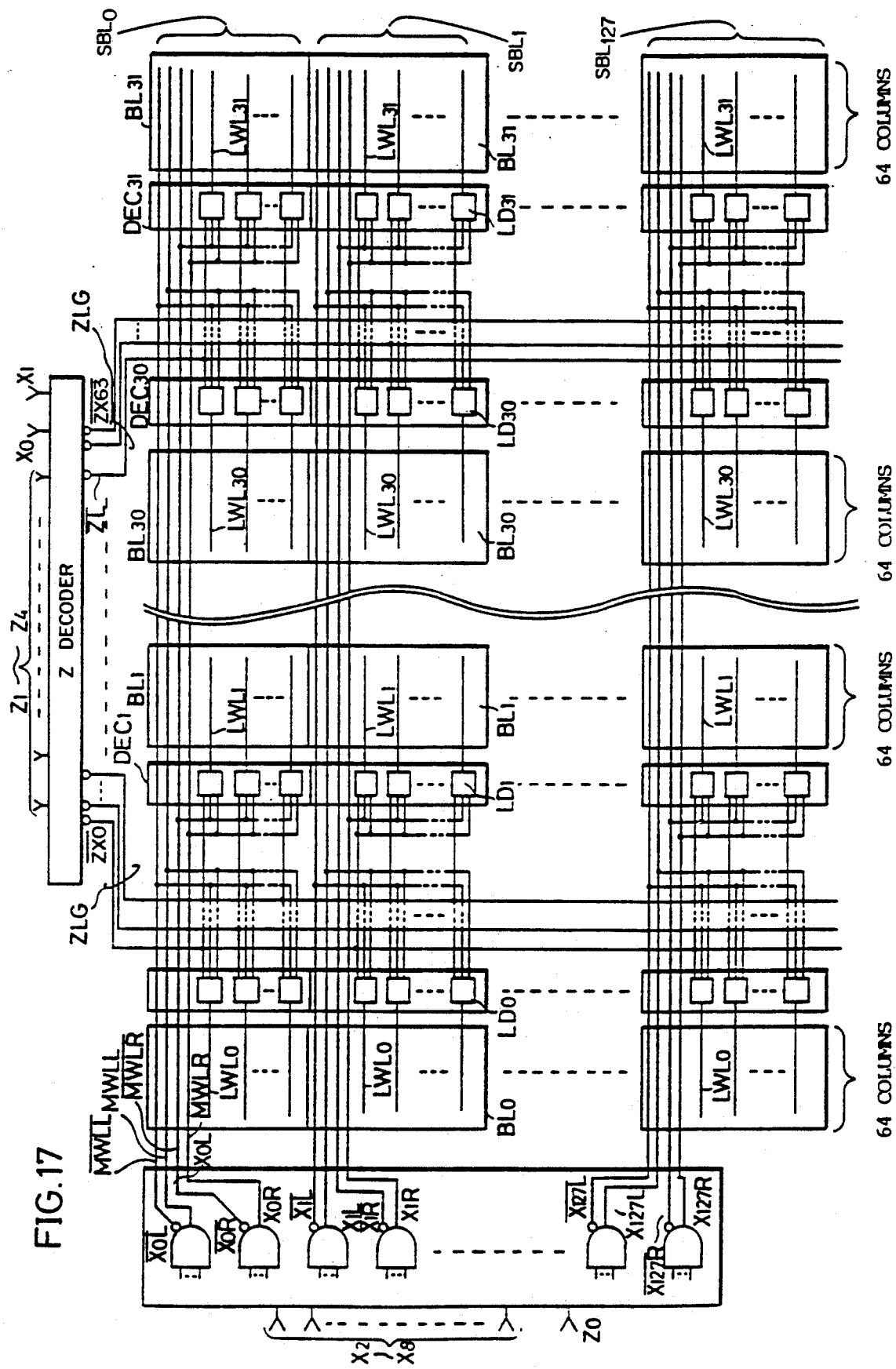
FIG. 17 is a circuit diagram showing a still further example of an arrangement of the main part of the SRAM of FIG. 1.

FIG. 17 is a circuit diagram showing a still further example of an arrangement of the main part of the SRAM of FIG. 1 according to a still further embodiment of the present invention.

With reference to FIG. 17, unlike the embodiment shown in FIG. 11, all the output signals from Z decoder 18 are inactive signals in the present embodiment. The arrangement of the other part shown in FIG. 17 is the same as that shown in FIG. 11.

Figure 18:
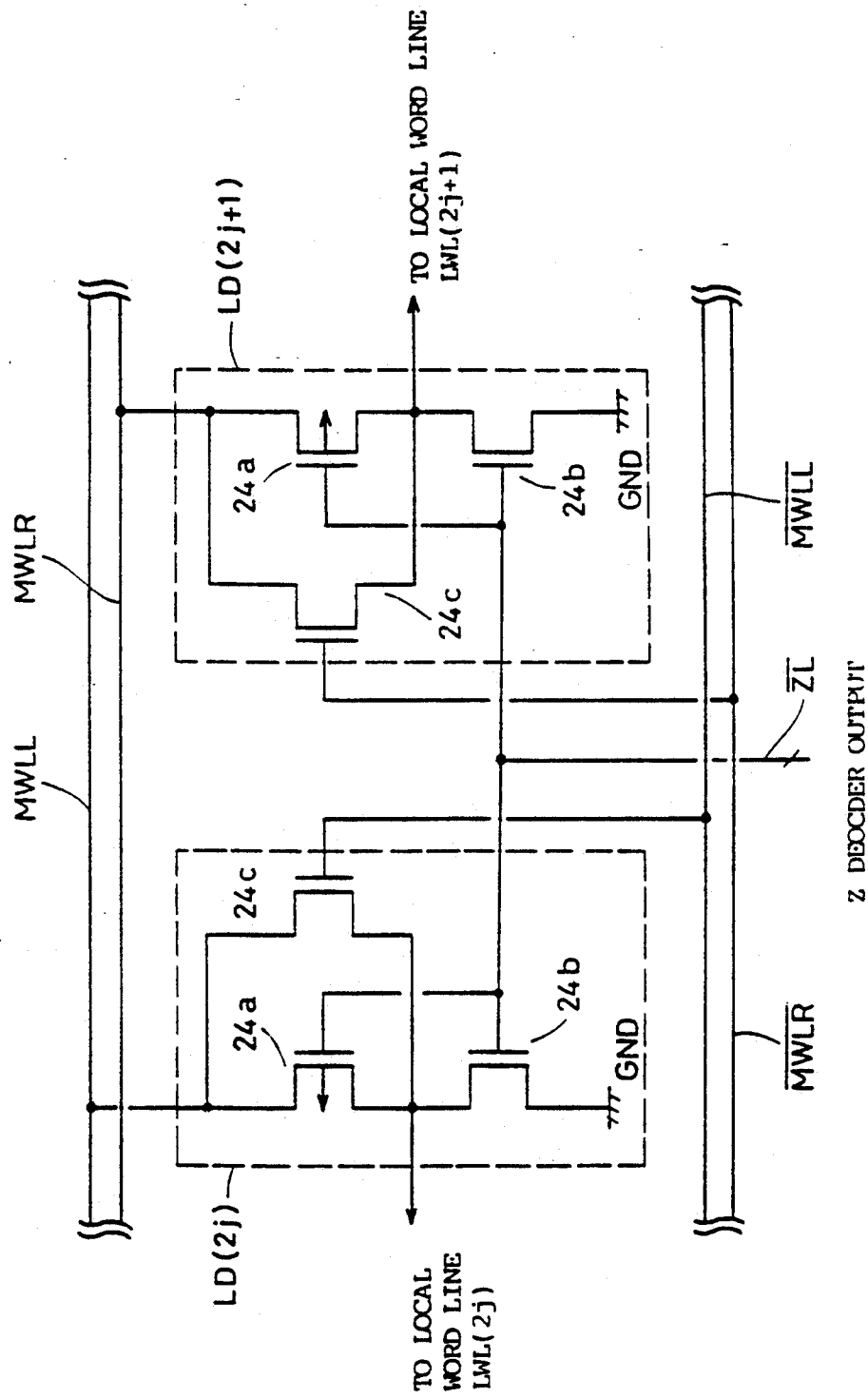
FIG. 18 is a circuit diagram showing an example of an arrangement of the local decoder shown in FIG. 17.

FIG. 18 is a circuit diagram showing one example of an arrangement of the respective local decoders LD (2j) and LD (2j+1) of FIG. 17. FIG. 18 shows, as a representative, two adjacent local decoders LD (2j) and LD (2j+1) connected to the same Z decoder signal line /ZL of FIG. 17.

With reference to FIG. 18, the arrangement of the respective local decoders LD (2j) and LD (2j+1) of the present embodiment is obtained by interchanging the even-numbered main word line /MWLL and the odd-numbered main word line /MWLR with the Z decoder signal line ZL in the local decoders shown in FIG. 13.

More specifically, in each local decoder LD (2j) provided corresponding to each even-numbered block BL (2j) of the present embodiment, the gates of transistors 24a and 24b are connected to the corresponding Z decoder signal line /ZL and the sources of transistors 24a and 24c are connected to the corresponding even-numbered main word line MWLL. Similarly, in each local decoder LD (2j+1) provided corresponding to each odd-numbered block BL (2j+1), the gates of transistors 24a and 24b are connected to the corresponding Z decoder signal line /ZL and the sources of transistors 24a and 24c are connected to the corresponding odd-numbered main word line MWLR.

In the present embodiment, the signal line connected to the gates of transistors 24a and 24b and the signal line connected to the sources of transistors 24a and 24c are signal lines a low level potential on which is regarded as being in an inactive state and a signal line a high level potential on which is regarded as being in an active state, respectively. Therefore, similarly to the local decoder arranged as shown in FIG. 13, each of the local decoders LD (2j) and LD (2j+1) of the present embodiment activates the corresponding local word line LWL (2j) or LWL (2j+1) only when the corresponding complementary main word line pair of /MWLL and MWLL or /MWLR and MWLR, and the corresponding Z decoder signal line /ZL are both activated.

As shown in FIGS. 15 and 16, each of the local decoders LD (2j) and LD (2j+1) structured without including elements (transistors 24c of FIGS. 3, 8, 13 and 14) for reliably forcing the potentials on the corresponding local word line LWL (2j) or LWL (2j+1) to 0 V when they are to be inactivated, requires no signal for controlling these switching elements, that is, requires no signal on one main word line of the corresponding complementary main word line pair. Then, it is also possible to reduce the number of main word lines by using a resistance element R or transistor 24f which is rendered conductive at a high ON resistance value at all times for the forcing elements.

Figure 19:
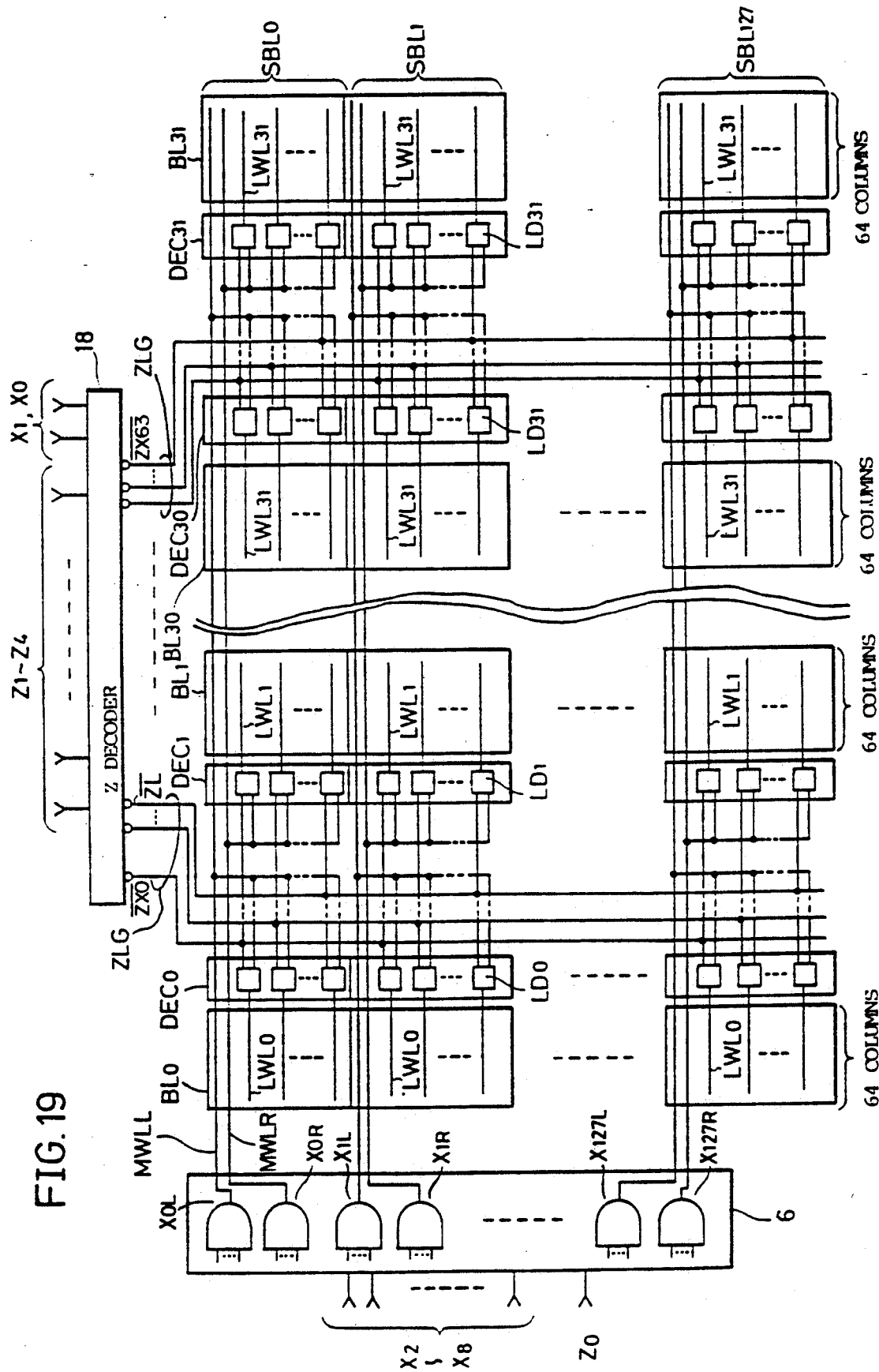
FIG. 19 is a circuit diagram showing a still further example of an arrangement of the main part of the SRAM shown in FIG. 1.

FIG. 19 is a circuit diagram showing a still further example of an arrangement of the main part of the SRAM of FIG. 1 with the number of main word lines half that in the embodiment shown in FIG. 11, which example shows a still further embodiment of the present invention.

With reference to FIG. 19, unlike the embodiment shown in FIG. 11, one even-numbered main word line MWLL and one odd-numbered main word line MWLR are provided corresponding to each of the sub-block groups SBL0-SBL127 in the present embodiment. Therefore, each local decoder LD (2j) is connected only to the corresponding even-numbered main word line MWLL and the corresponding Z decoder signal line /ZL. Similarly, each local decoder LD (2j+1) is connected only to the corresponding odd-numbered main word line MWLR and Z decoder signal line /ZL.

Similarly to the embodiment shown in FIG. 11, low address signals and column address signals are distributed and applied to low decoder 6 and Z decoder 18. In the present embodiment, low decoder 6 outputs 128 signals x0L, x0R, x1L, x1R, ..., x127L, x127R only one of which attains a high level. The arrangement of the other part of FIG. 19 is the same as that shown in FIG. 11.

Figure 20:
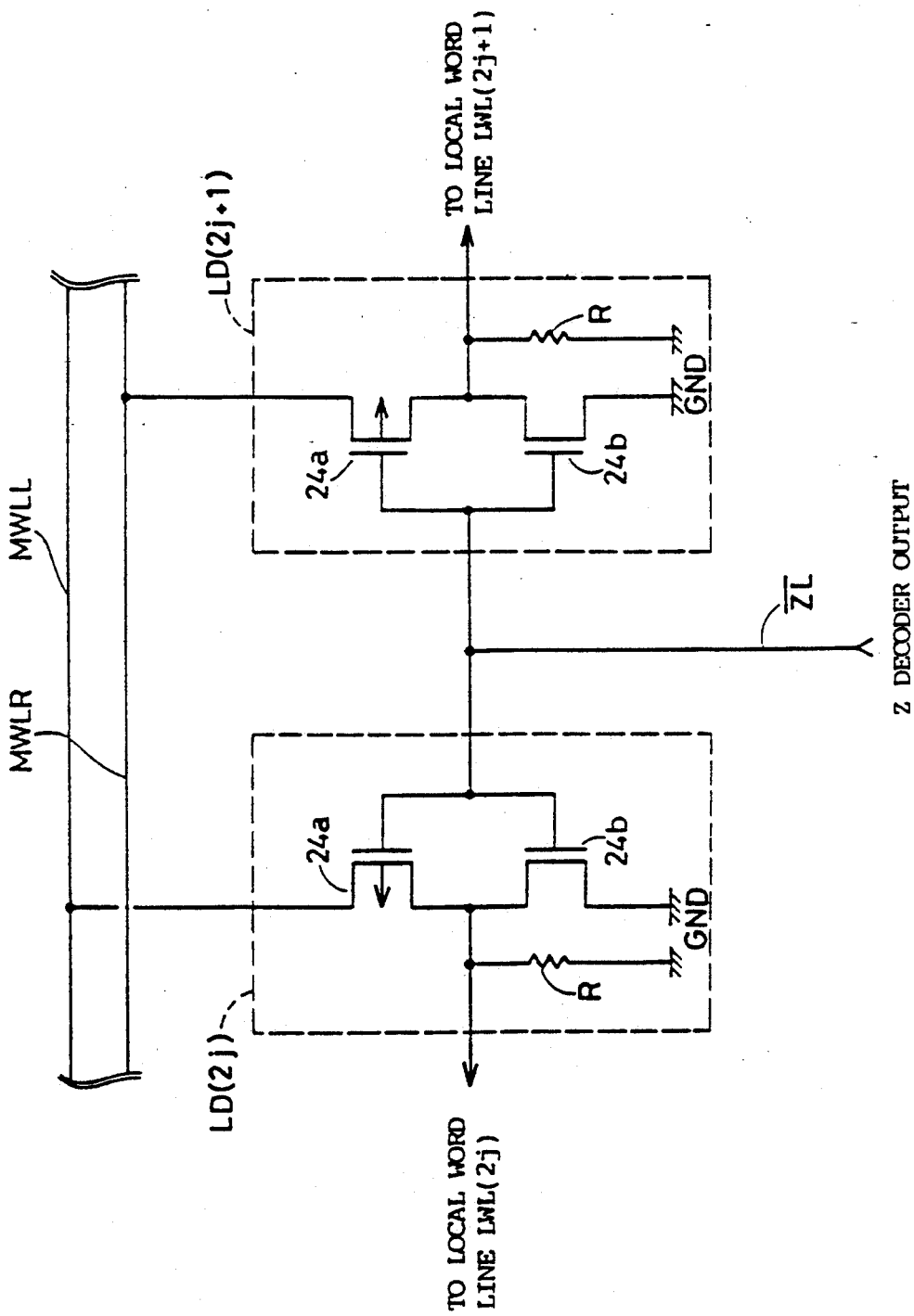
FIG. 20 is a circuit diagram showing an example of an arrangement of the local decoder show in FIG. 19.

FIG. 20 is a circuit diagram showing an arrangement of the local decoders LD0-LD31 of FIG. 19. FIG. 20 shows two adjacent local decoders LD (2j) and LD (2j+1) connected to one Z decoder signal line /ZL as a representative.

With reference to FIG. 20, the arrangement of the respective local decoders LD (2j) and LD (2j+1) is obtained by replacing transistor 24c with a resistance element R in the local decoder of FIG. 18. Therefore, an even-numbered main word line /MWLL and ah odd-numbered main word line /MWLR for controlling transistor 24c in FIG. 18 are unnecessary.

Operation of the local decoder structured as shown in FIG. 20 is obvious from the operation of the local decoder of FIG. 18 which has been already described and therefore, no description will be made on an operation of the local decoder of FIG. 20.

In the local decoders (2j) and LD (2j+1) shown in FIG. 20, the main word lines MWLR and MWLL are interchangeable with the Z decoder signal line /ZL. In this case, in order that each of the local decoders LD (2j) and LD (2j+1) activates the corresponding local word line LWL (2j) or LWL (2j+1) only when both of the corresponding main word line MWLL or MWLR and the corresponding Z decoder signal line /ZL are activated, a signal line connected to the gates of transistors 24a and 24b and a signal line connected to the source of transistor 24a should be a signal line a low level potential on which is regarded as being in an active state and a signal line a high level potential on which is regarded as being in an active state, respectively.

Figure 21:
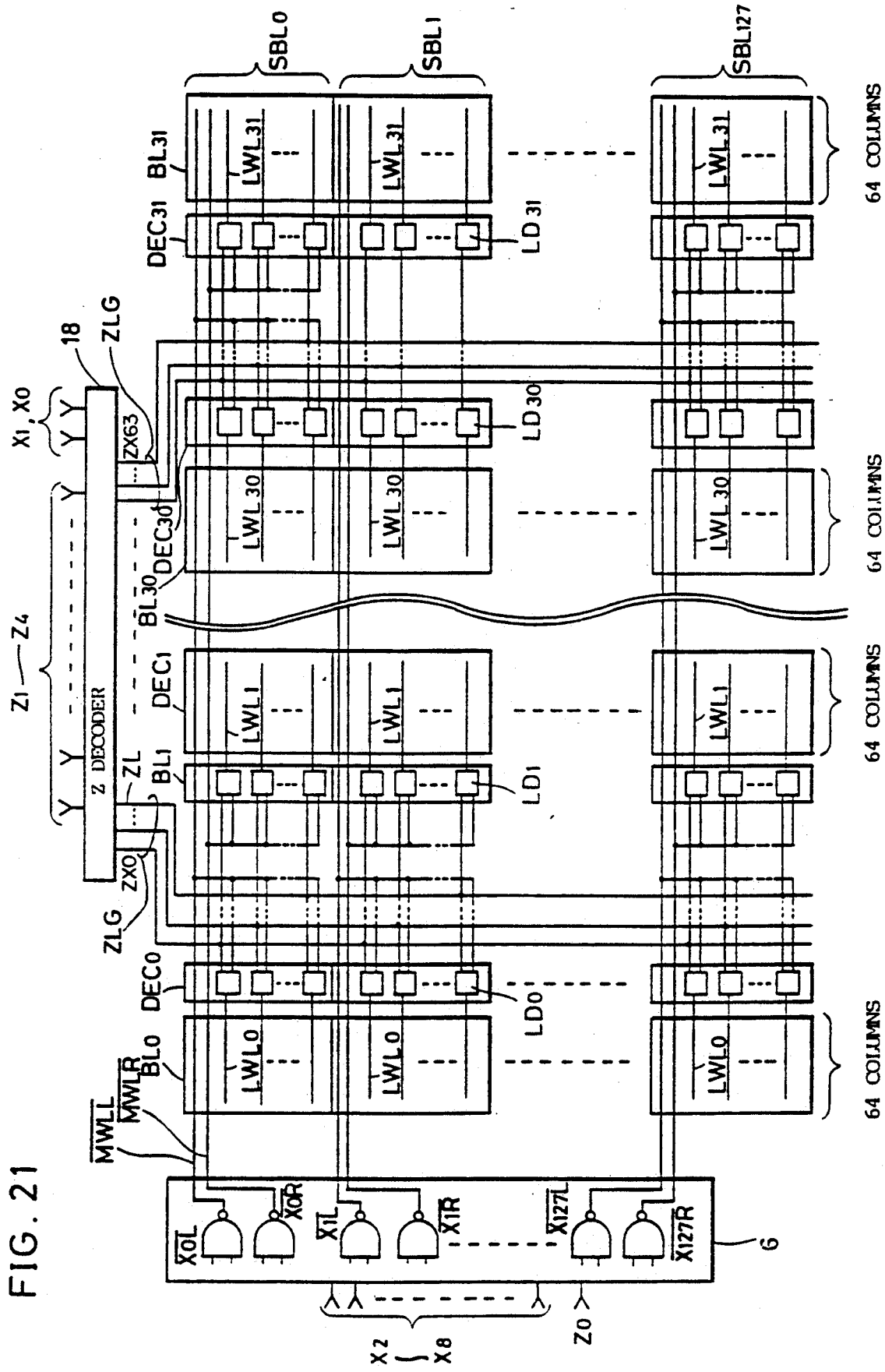
FIG. 21 is a circuit diagram showing a still further example of an arrangement of the main part of the SRAM shown in FIG. 1.

FIG. 21 is a circuit diagram showing a still further example of an arrangement of the main part of the SRAM of FIG. 1 according to still further embodiment of the present invention, wherein a main word line and a Z decoder signal line in each local decoder arranged in the embodiment shown in FIG. 20 are interchanged with each other.

With reference to FIG. 21, conversely to the embodiment shown in FIG. 19, all the output signals from low decoder 6 are inactive signals /x0L, /x0R, /x1L, /x1R, ..., /127L, /x127R and each of the output signals zx0-zx63 from Z decoder 18 is a signal a high level potential on which is regarded as an active level, in the present embodiment. The arrangement of the other part of FIG. 21 is the same as that shown in FIG. 19.

Figure 22:
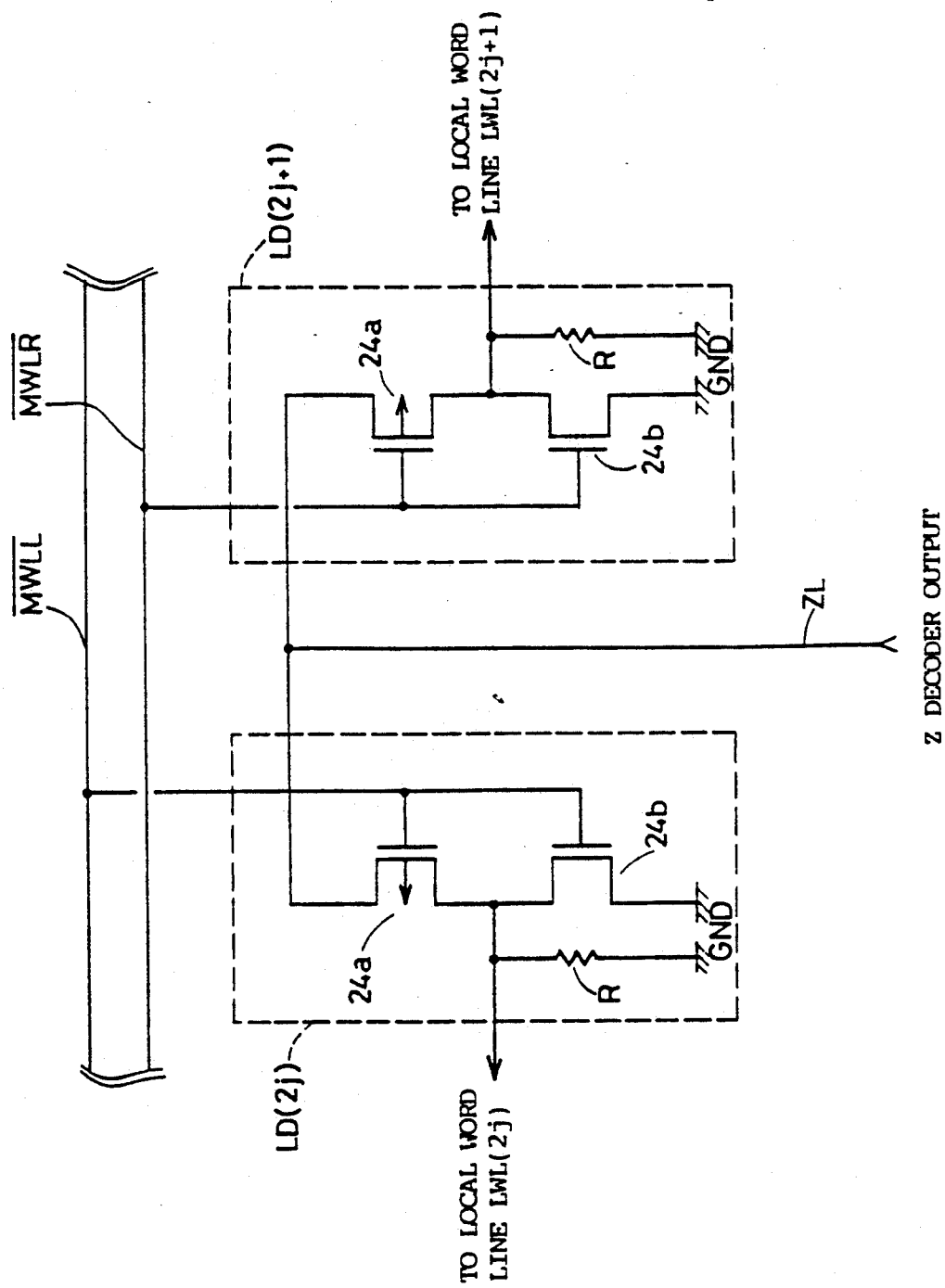
FIG. 22 is a circuit diagram showing an example of an arrangement of the local decoder shown in FIG. 21.

FIG. 22 is a circuit diagram showing one example of an arrangement of the local decoders LD0-LD31 of FIG. 21. FIG. 22 shows two adjacent local decoders LD (2j) and LD (2j+1) connected to one Z decoder signal line ZL of FIG. 21 as a representative.

With reference to FIG. 22, the arrangement of the respective local decoders LD (2j) and LD (2j+1) of the present embodiment is obtained by replacing transistor 24c by a resistance element R in the local decoder shown in FIG. 13.

Operation of the local decoders LD (2j) and LD (2j+1) shown in FIG. 22 is obvious understood from the operation of the local decoder shown in FIG. 13 which has been already described and therefore, no description of the local decoders shown in FIG. 22 will be made.

In general, a resistance element formed on a semiconductor substrate occupies more area with an increase of its resistance value. Therefore, provision of a resistance element having a large resistance value on the semiconductor substrate is not desirable for the purpose of increasing integration density of a semiconductor integrated circuit.

For further reducing an area occupied by a local decoder on a semiconductor substrate and reducing the number of main word lines, like in the embodiment shown in FIGS. 16, a transistor having a high ON resistance value and being rendered conductive at all times may be used in place of a resistance element R in the embodiment shown in FIGS. 20 and 22 as an element for reliably forcing, to 0 V, the potentials on the respective local word lines LWL (2j) and LWL (2j+1) which are to be inactivated.

Although in any of the above-described embodiments, a resistance element or a circuit element such as an MOS transistor is provided in each local decoder as a means for reliably forcing, to 0 V, each local word line which is to be inactivated, a method of controlling a logical level of an output signal from row decoder 6 or an output signal from Z decoder 18 may be used as such means.

This method can be achieved by inputting an output signal of ATD circuit 17 of FIG. 1 to row decoder 6 or Z decoder 18, for example.

Figure 23:
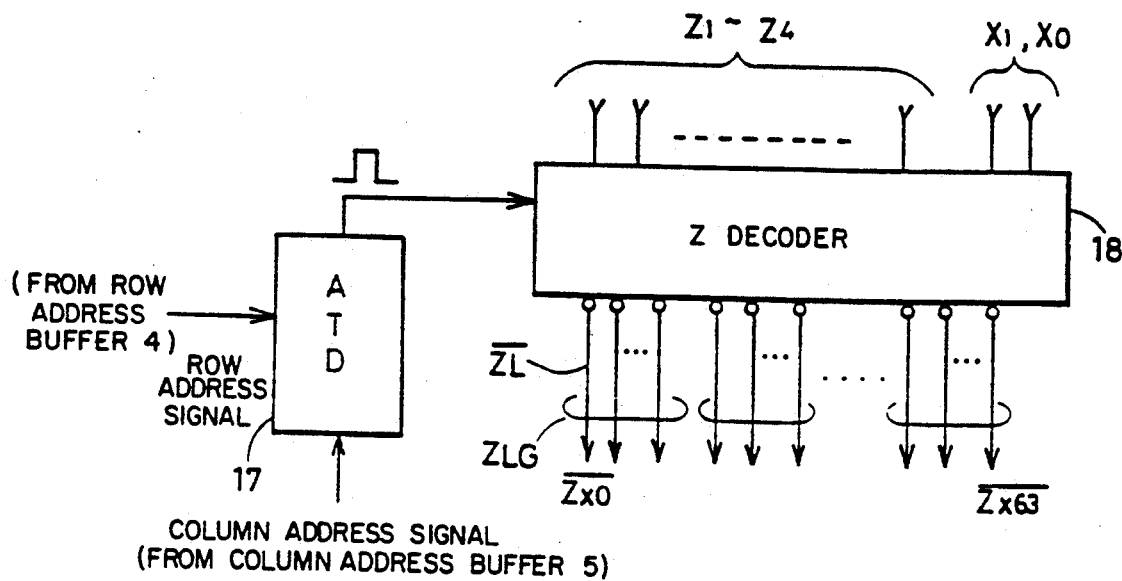
FIG. 23 is a block diagram explaining one example of a method of reliably forcing, to 0 V, a potential on a local word line which is to be inactivated.

FIG. 23 is a block diagram showing an arrangement of a portion related to this method when such method is applied to a SRAM in which a circuit arranged as shown in FIG. 20 is used as a local decoder.

Figure 24:
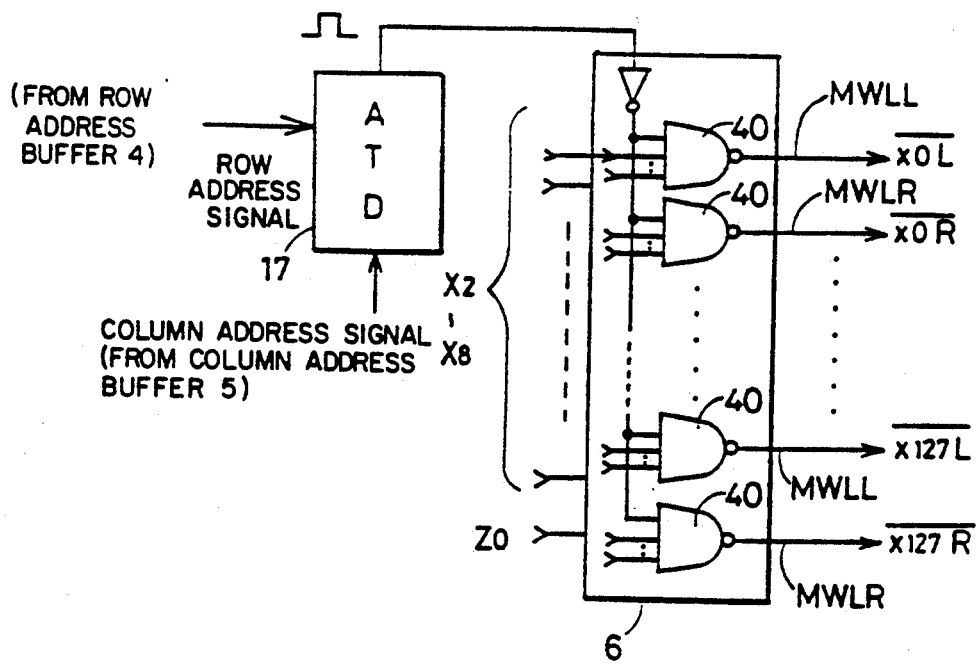
FIG. 24 is a block diagram explaining another example of a method of reliably forcing, to 0 V, a potential on a local word line which is to be inactivated.

FIG. 24 is a block diagram showing an arrangement of a portion related to this method when the method is applied to a SRAM in which a circuit structured as shown in FIG. 22 is used as a local decoder.

Figure 25:
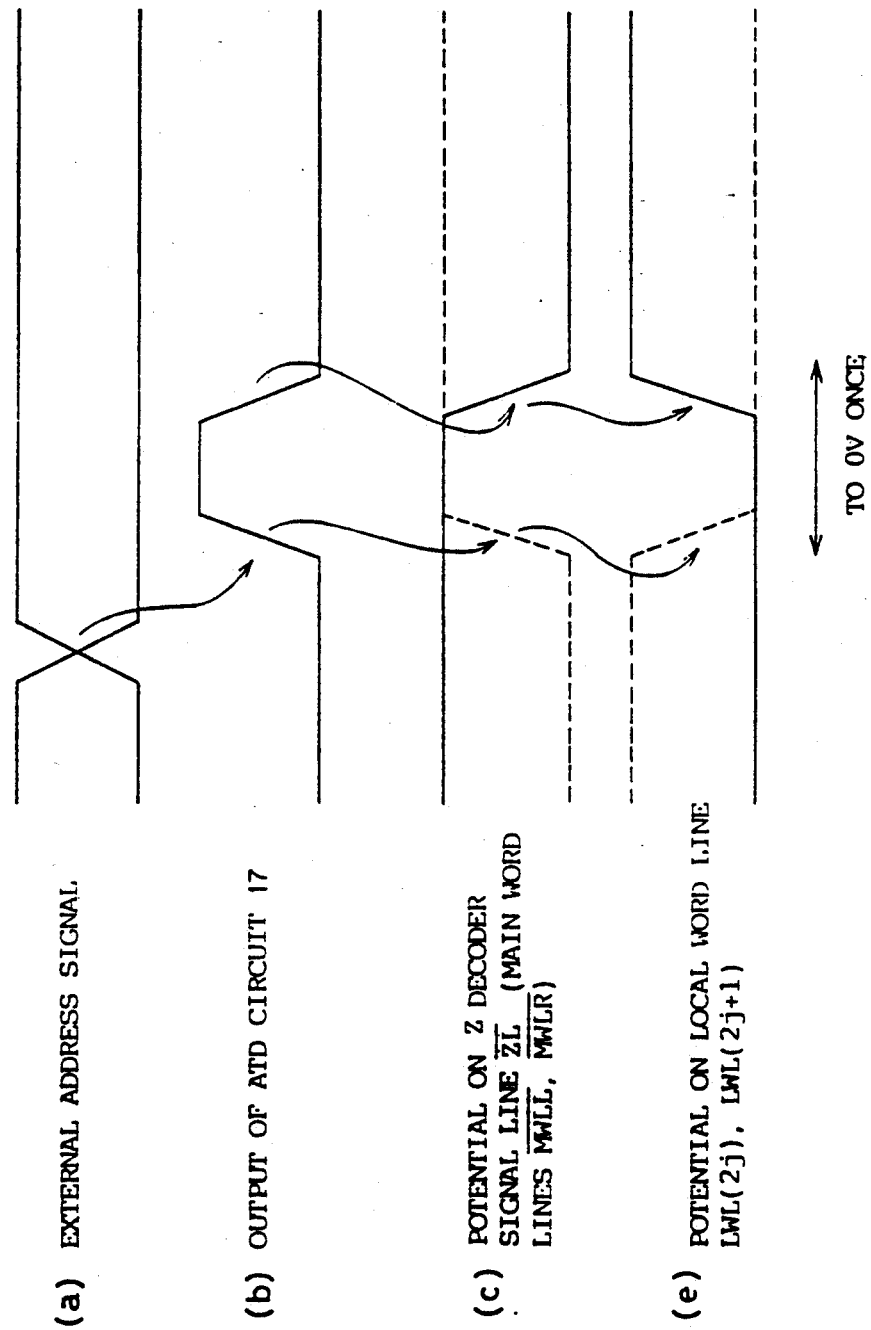
FIG. 25 is a timing chart explaining a potential change of a local word line in the methods shown in FIGS. 23 and 24.
Figure 26:
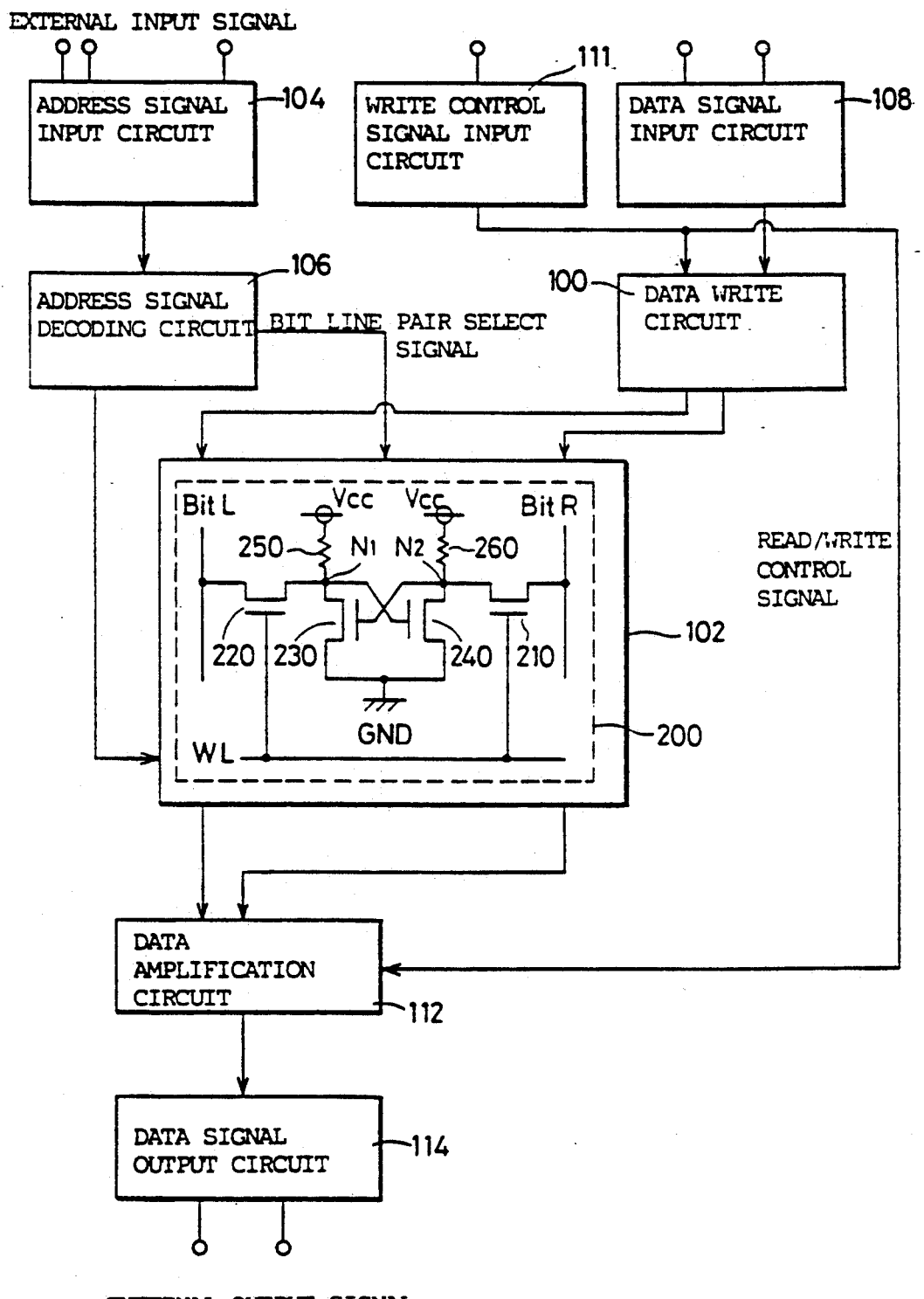
FIG. 26 is a schematic block diagram showing functions of the entire arrangement of a conventional SRAM.
Figure 27A:
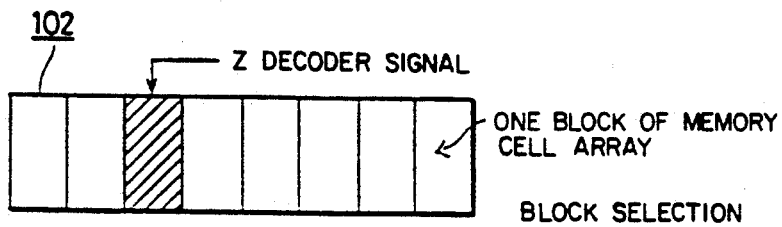
FIG. 27 is a diagram explaining the principle of memory selection in a SRAM of a divided-word line structure.
Figure 27B:
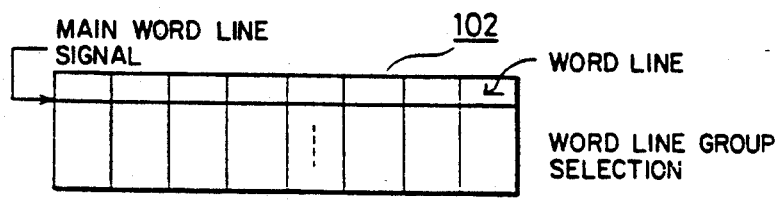
Figure 27C:
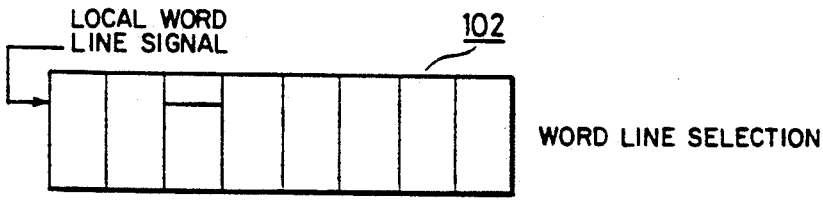
Figure 27D:
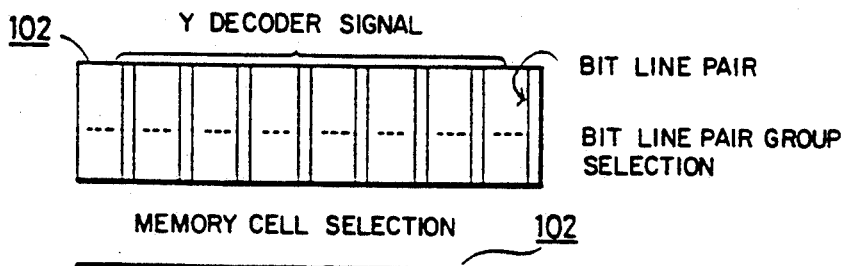
Figure 27E:
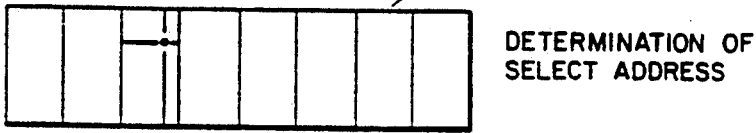
Figure 28:
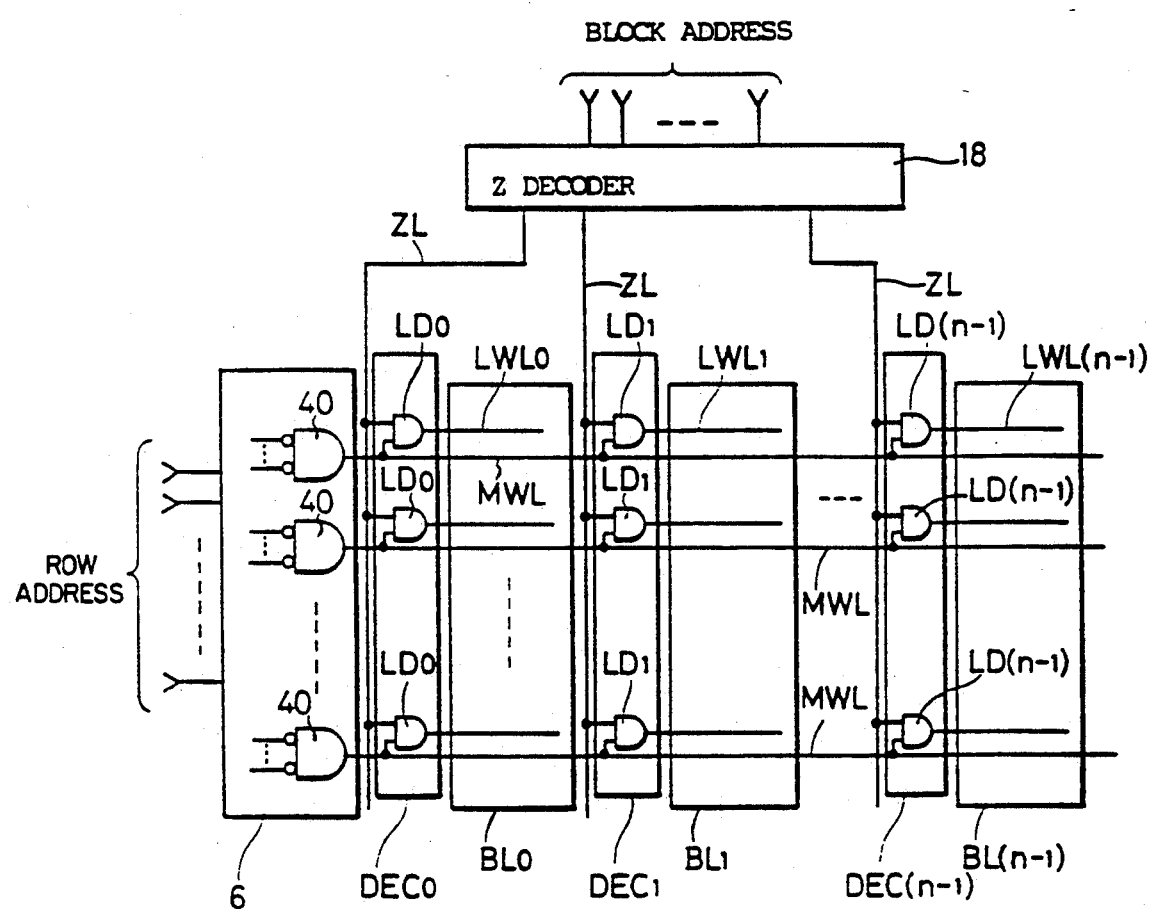
FIG. 28 is a block diagram showing one example of an arrangement of a main part of a conventional SRAM of a divided-word line structure.
Figure 29:
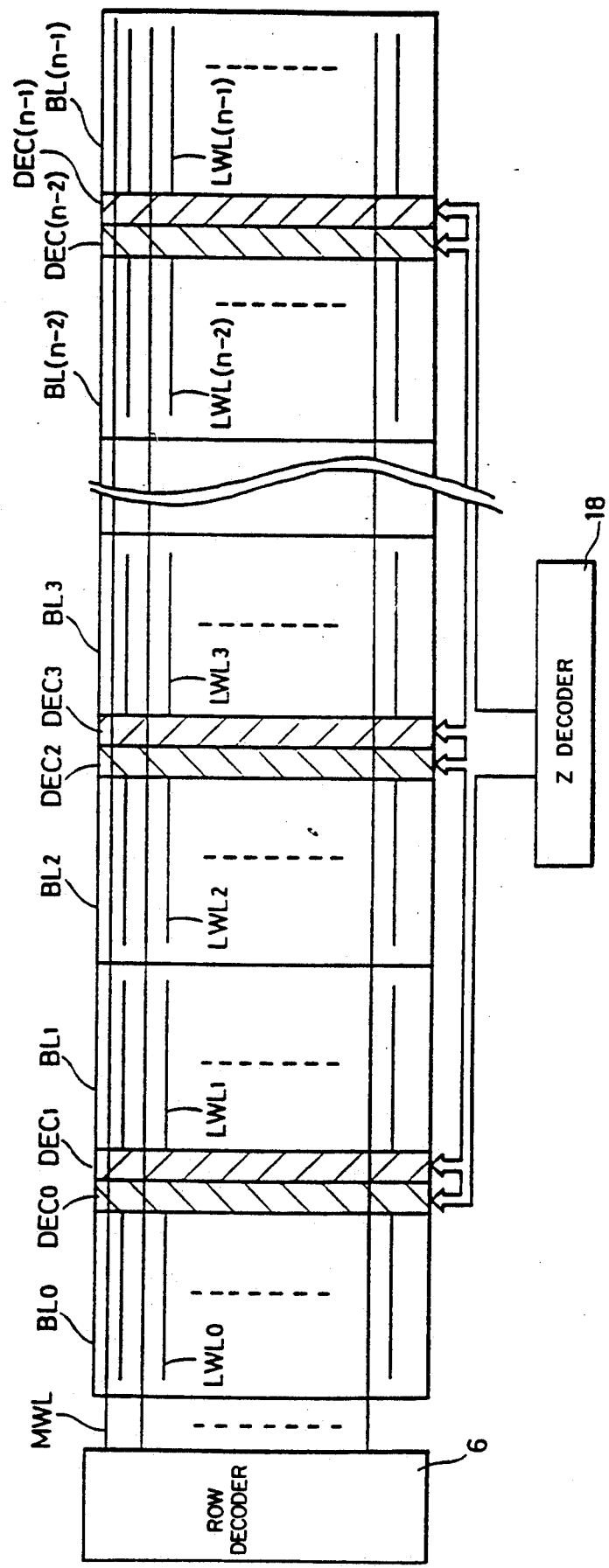
FIG. 29 is a plan view showing an arrangement of memory cell array blocks and local decoder groups of FIG. 28 on a semiconductor substrate.
Figure 30:
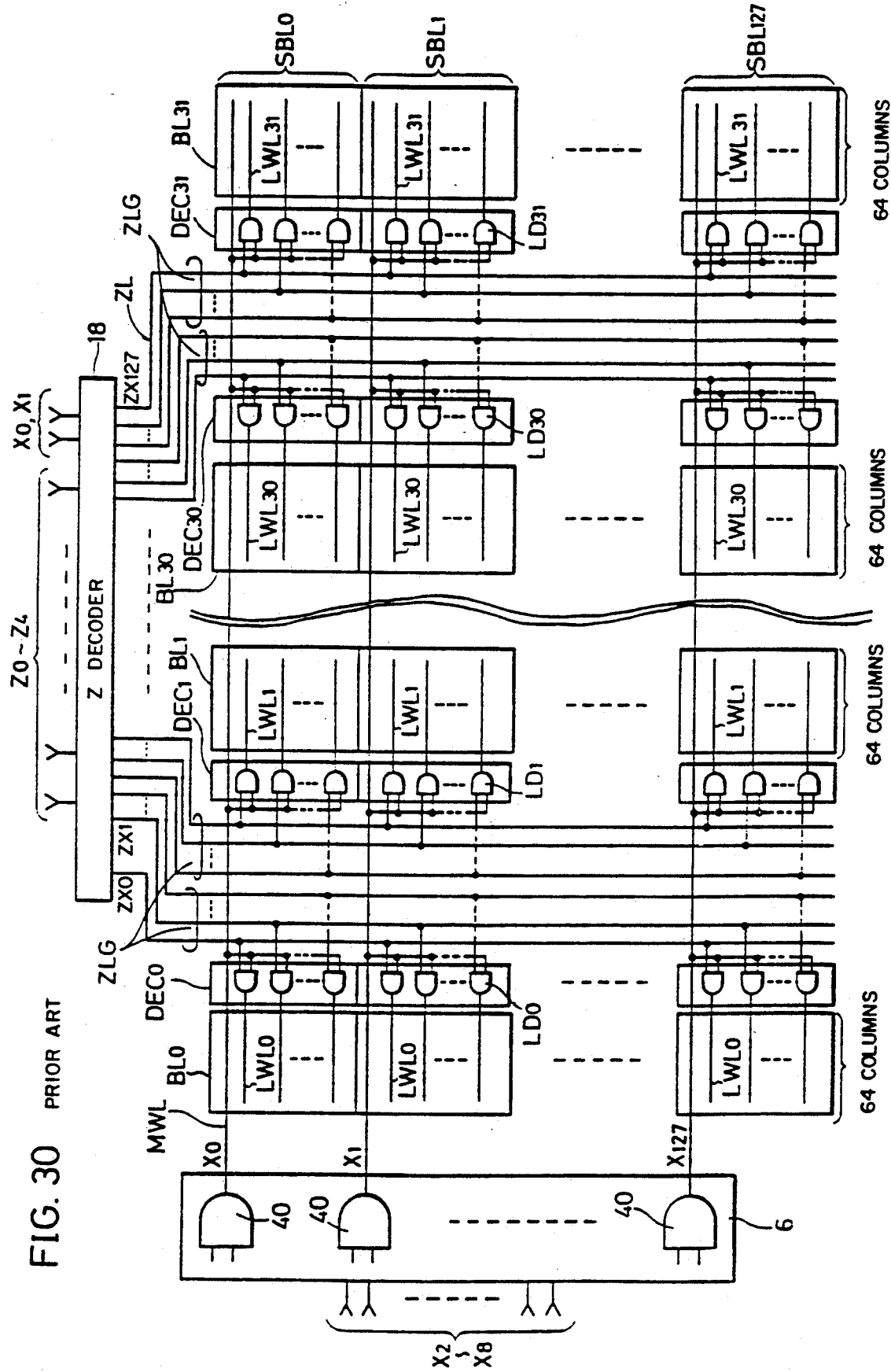
FIG. 30 is a circuit diagram showing another example of an arrangement of the main part of a conventional SRAM of a divided-word line structure.

FIG. 25 is a timing chart explaining a potential change of a local word line arranged as shown in FIGS. 23 and 24.

The method will be specifically described with reference to FIGS. 23 to 25.

In the case where local decoders LD (2j) and LD (2j+1) are structured as shown in FIG. 20, the output of ATD circuit 17 should be applied to Z decoder 18 as shown in FIG. 23. In this case, Z decoder 18 is structured such that all its output signals /zx0-/zx63 attain a high x1 and x0 when the output signal from ATD circuit 17 is at a high level. ATD circuit 17 outputs a high level pulse signal in response to a change of at least one of a row address signal from row address buffer 4 and a column address signal from column address buffer 5.

Therefore, as shown in FIG. 25, a change of an external address signal (FIG. 25(a)) is followed by the output (FIG. 25(b)) of ATD circuit 17 attaining a high level for a fixed time period and consequently, the potential on the Z decoder signal line /ZL (FIG. 25(c)) of FIG. 20 once attains a high level without fail in response to the change of the external address signal. As a result, all the transistors 24b in FIG. 20 are turned on. Therefore, the potentials on the local word lines LWL (2j) and LWL (2j+1) connected to the local decoders LD (2j) and fail in response to the change of the external address signal as shown in FIG. 25(e).

A change of an external address signal occurs at a start of data writing or data reading to or from a memory cell different from the memory cell which has been selected. Therefore, when the potential on each local word line is forced to 0 V at the change of the external address signal, in FIG. 20, even if both the gate potential and the drain potential of transistor 24a attain a low level in a local word line selecting operation by row decoder 6 and Z decoder 18 carried out in response to the external address signal which has been changed, it is not possible for the potentials on the local word lines LWL (2j) and LWL (2j+1) connected to the transistors 24a to start lowering from a high level. Therefore, even without a resistance element R, a potential on a local word line which is supposed to be inactivated is not fixed to a potential Vth higher than 0 V.

Similarly, in the case where the local decoders LD (2j) and LD (2j+1) structured as shown in FIG. 22, the output signal from ATD circuit 17 should be applied to low decoder 6 as shown in FIG. 24. In this case, row decoder 6 is structured as shown in the drawing such that all its output signals /x0L, x0R, ..., /x127L, /x127R all attain a high level irrespective of the input address signals X2-X8 and Z0 when the output signal from ATD circuit 17 is at a high level.

Therefore, as shown in FIG. 25(c), the potentials on the main word lines /MWLL and /MWLR are once forced to a high level in response to the change of the external address signal. Accordingly, the potentials on the respective local word lines LWL (2j) and LWL (2j+1) are once forced to 0 V. As a result, like the previous case, in FIG. 22, even if both of the gate potential and the drain potential of transistor 24a in the local decoder LD (2j) or LD (2j+1) connected to the local word line LWL (2j) or LWL (2j+1) which has been activated attain a low level in a local word line selecting operation by row decoder 6 and Z decoder 18 carried out in response to the address signal which has been changed, the potential on the local word line is not fixed to a potential higher than 0 V.

As described in the foregoing, such method enables a reduction of the number of elements of each local decoder to 2.

Since in any of the embodiments shown from FIG. 6 to FIG. 25, one of the two types of signal lines connected to each local decoder, that is, either a main word line or a Z decoder signal line is connected to a source or a drain of an MOS transistor, current consumption and operation speed for local word line selection can be improved as compared with a conventional device.

In any of FIGS. 2, 6, 7, 11, 17, 19 and 21, a symbol indicative of an output signal of Z decoder 18, numerical values indicative of the number of memory cell columns included in each block or the like are those for use in a case where memory cell array 1 include memory cells arranged in a matrix of 512 rows and 2048 columns.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a decoder responsive to a first select signal for row selection and a second select signal for block selection to activate or deactivate a predetermined select signal, said decoder comprising:

first, second, third and fourth lines carrying, respectively, the first select signal, the second select signal, the predetermined select signal and a ground potential;

a first field effect transistor of p-type polarity having source, drain and gate electrodes;

a second field effect transistor of n-type polarity having source, drain and gate electrodes;

the gates being connected to each other and to the second line for receiving said second select line;

the source of said second field effect transistor being connected to the fourth line for receiving the ground potential, said second field effect transistor being rendered conductive when said first select signal is inactivated;

the source of said first field effect transistor connected to said first line for receiving said first select signal, said first field effect transistor being rendered conductive when said first select signal is activated for applying said second select signal to said third line;

the drains of said first and second field effect transistors being connected to each other and to said third line for supplying said predetermined select signal; and forcing means for forcing the potential on said third select line to a potential corresponding to an inactivated state when at least one of said first select signal on said first signal line and said second select signal on said second signal line is inactivated.

2. The semiconductor memory device according to claim 1, wherein said forcing means includes third switching means of n-type polarity being rendered conductive when said first select signal is activated, for applying said second select signal to said predetermined select signal.

3. The semiconductor memory device according to claim 1, wherein said forcing means includes third switching means of n-type polarity being rendered conductive when said second select signal is inactivated, for applying said second select signal to said predetermined select signal.

4. The semiconductor memory device according to claim 1, wherein said forcing means includes resistance means coupled between said third signal line and said fourth signal line.

5. The semiconductor memory device according to claim 4, wherein said resistance means includes a resistance element having a large resistance value.

6. The semiconductor memory device according to claim 4, wherein said resistance means includes transistor means having a large on-resistance value.

7. The semiconductor memory device according to claim 2 wherein said first select signal includes first and second signals complementary to each other.

8. The semiconductor memory device according to claim 3, wherein said second select signal includes first and second signals complementary to each other.

9. A semiconductor memory device comprising a decoder responsive to first and second select signals for operating to activate or inactivate a predetermined select line; said decoder including first and second decoder circuit means, said predetermined select line including first and second select lines, and said first select signal including first and second sub-select signals, said first decoder circuit means including:

first switching means being rendered conductive when said first sub-select signal is activated, for applying said second select signal to said first select line, and second switching means coupled between said first select line and a potential corresponding to said inactivated state and being rendered conductive when said first sub-select signal is inactivated, said second decoder circuit means including:

third switching means being rendered conductive when said second sub-select signal is activated, for applying said second select signal to said second select line, and fourth switching means coupled between said second select line and said potential corresponding to an inactivated state and being rendered conductive when said second sub-select signal is inactivated.

10. The semiconductor memory device according to claim 9 further comprising forcing means for forcing the potential on said first select line to said potential corresponding to an inactivated state when at least one of said first sub-select signal and said second select signal is inactivated and for forcing the potential on said second select line to said potential corresponding to an inactivated state when at least one of said second sub-select signal and said second select signal is inactivated.

11. The semiconductor memory device according to claim 10, wherein said forcing means includes:

fifth switching means being rendered conductive when said first sub-select signal is activated, for applying said second select signal to said first select line, and sixth switching means being rendered conductive when said second sub-select signal is activated, for applying said second select signal to said second select line.

12. The semiconductor memory device according to claim 10, wherein said forcing means includes first resistance means coupled between said first select line and said potential corresponding to an inactivated state, and second resistance means coupled between said second select line and said potential corresponding to an inactivated state.

13. The semiconductor memory device according to claim 10, wherein said forcing means includes signal generating means for generating a signal for once simultaneously rendering said second and fourth switching means conductive prior to said operation of said decoder.

14. The semiconductor memory device according to claim 11, wherein
said first sub-select signal includes first and second signals complementary to each other, and
said second sub-select signal includes third and fourth signals complementary to each other.

15. The semiconductor memory device according to claim 14, wherein
said first switching means includes first conductivity type first transistor means being responsive to said first signal,
said second switching means includes second conductivity type second transistor means being responsive to said first signal,
said third switching means includes third transistor means of said first conductivity type being responsive to said third signal,
said fourth switching means includes fourth transistor means of said second conductivity type being responsive to said third signal,
said fifth switching means includes fifth transistor means of said second conductivity type being responsive to said second signal, and
said sixth switching means includes sixth transistor means of said second conductivity type being responsive to said fourth signal.

16. The semiconductor memory device according to claim 14, wherein
said first switching means includes first transistor means being responsive to said second signal,
said second switching means includes second transistor means having the same conductivity type as that of said first transistor means and being responsive to said first signal,
said third switching means includes third transistor means being responsive to said fourth signal,
said fourth switching means includes fourth transistor means having the same conductivity type as that of said third transistor means and being responsive to said third signal,
said fifth switching means includes fifth transistor means having the same conductivity type as those of said first and second transistor means and being responsive to said second signal, and
said sixth switching means includes sixth transistor means having the same conductivity type as those of said first and second transistor means and being responsive to said fourth signal.

17. The semiconductor memory device according to claim 14, wherein
said first switching means includes first conductivity type first transistor means being responsive to said first signal,
said second switching means includes second transistor means of said first conductivity type being responsive to said second signal,
said third switching means includes third transistor means of said first conductivity type being responsive to said third signal,
said fourth switching means includes fourth transistor means of said first conductivity type being responsive to said fourth signal,
said fifth switching means includes fifth transistor means of a second conductivity type being responsive to said second signal, and
said sixth switching means includes sixth transistor means of said second conductivity type being responsive to said fourth signal.

18. The semiconductor memory device according to claim 12, wherein
said first switching means includes first conductivity type first transistor means being responsive to said first sub-select signal,
said second switching means includes second conductivity type second transistor means being responsive to said first sub-select signal,
said third switching means includes third transistor means of said first conductivity type being responsive to said second sub-select signal, and
said fourth switching means includes fourth transistor means of said second conductivity type responsive to said second sub-select signal.

19. The semiconductor memory device according to claim 12, wherein
said first sub-select signal includes first and second signals complementary to each other,
said first switching means includes first transistor means being responsive to said first signal,
said second switching means includes second transistor means having the same conductivity type as that of said first transistor means and being responsive to said second signal,
said second sub-select signal includes third and fourth signals complementary to each other,
said third switching means includes third transistor means being responsive to said third signal, and
said fourth switching means includes fourth transistor means having the same conductivity type as that of said third transistor means and being responsive to said fourth signal.

20. The semiconductor memory device according to claim 13, wherein
said first switching means includes first conductivity type first transistor means being responsive to said first sub-select signal,
said second switching means includes second conductivity type second transistor means being responsive to said first sub-select signal,
said third switching means includes third transistor means of said first conductivity type being responsive to said second sub-select signal, and
said fourth switching means includes fourth transistor means of said second conductivity type responsive to said second sub-select signal.

21. The semiconductor memory device according to claim 13, wherein
said first sub-select signal includes first and second signals complementary to each other,
said first switching means includes first transistor means being responsive to said first signal,
said second switching means includes second transistor means having the same conductivity type as that of said first transistor means and being responsive to said second signal,
said second sub-select signal includes third and fourth signals complementary to each other,
said third switching means includes third transistor means being responsive to said third signal, and
said fourth switching means includes fourth transistor means having the same conductivity type as that of said third transistor means and being responsive to said fourth signal.

22. A semiconductor memory device comprising:
a plurality of memory cell array blocks each including a plurality of memory cells and a plurality of local word lines arranged in a plurality of rows, comprising:
a main word line pair provided in common for said plurality of memory cell array blocks,
first selecting means for applying first and second signals complementary to each other to said main word line pair as a first select signal,
a plurality of select line groups provided corresponding to said plurality of memory cell array blocks, each of said plurality of select line groups including a plurality of select lines corresponding to said plurality of local word lines in the corresponding memory cell array block,
second selecting means for applying a second select signal to one of said plurality of select lines included in one of said plurality of select line groups, and
a plurality of decoder groups provided corresponding to said plurality of memory cell array blocks, each of said plurality of decoder groups including a plurality of decoder means corresponding to said plurality of local word lines in the corresponding memory cell array block, each of said plurality of decoder means being responsive to said first select signal applied to said main word line pair and said second select signal applied to the corresponding one of said select lines for operating to activate the corresponding one of said local word lines.

23. The semiconductor memory device according to claim 22, wherein each of said plurality of decoder means includes:
first switching means being rendered conductive when said first select signal is activated for applying the signal on the corresponding one of said select lines to the corresponding one of said local word lines, and
second switching means coupled between said corresponding local word line and a potential corresponding to an inactivated state and being rendered conductive when said first select signal is inactivated.

24. The semiconductor memory device according to claim 23, wherein each of said plurality of decoder means further includes forcing means for forcing the potential on the corresponding one of said local word lines to said potential corresponding to an inactivated state when at least one of said first select signal and said second select signal applied to the corresponding one of said select lines is inactivated.

25. The semiconductor memory device according to claim 24, wherein each of said forcing means includes third switching means being rendered conductive when said first select signal is activated, for applying the signal on the corresponding one of said select lines to the corresponding one of said local word lines.

26. The semiconductor memory device according to claim 24, wherein each of said forcing means includes resistance means coupled between the corresponding one of said local word lines and said potential corresponding to an inactivated state.

27. The semiconductor memory device according to claim 23, further comprising signal generating means for generating a signal for once simultaneously rendering all of said second switching means included in said plurality of decoder means conductive prior to said operation of said plurality of decoder means.

28. The semiconductor memory device according to claim 25, wherein
said main word line pair includes first and second main word lines, said first main word line receiving said first signal and said second main word line receiving said second signal.

29. The semiconductor memory device according to claim 28, wherein
each of said first switching means includes first conductivity type first transistor means being responsive to said first signal,
each of said second switching means includes second conductivity type second transistor means being responsive to said first signal, and
each of said third switching means includes third transistor means of said second conductivity type being responsive to said second signal.

30. The semiconductor memory device according to claim 28, wherein
each of said first switching means includes first transistor means being responsive to said first signal,
each of said second switching means includes second transistor means having the same conductivity type as that of said first transistor means and being responsive to said second signal, and
each of said third switching means includes third transistor means having the same conductivity type as those of said first and second transistor means and being responsive to said first signal.

31. The semiconductor memory device according to claim 28, wherein
each of said first switching means includes first conductivity type first transistor means being responsive to said first signal,
each of said second switching means having the same conductivity type as that of said first transistor means and being responsive to said second signal, and
each of said third switching means includes third transistor means being responsive to said second signal.

32. The semiconductor memory device according to claim 22, wherein each of said plurality of decoder means includes:
first switching means being rendered conductive when the signal on the corresponding one of said select lines is activated, for applying said first select signal to the corresponding one of said local word lines, and
second switching means coupled between said corresponding local word line and a potential corresponding to an inactivated state and being rendered conductive when the signal on said corresponding select line is inactivated.

33. The semiconductor memory device according to claim 32, each of said plurality of decoder means includes forcing means for forcing the corresponding one of said local word lines to said potential corresponding to an inactivated state when at least one of said corresponding select line and said first select line is inactivated state.

34. The semiconductor memory device according to claim 33, wherein each of said forcing means is rendered conductive when said first select signal is inactivated, for applying said first select signal to the corresponding one of said local word lines.

35. The semiconductor memory device according to claim 34, wherein said main word line pair includes first and second main word lines, said main word line receiving said first signal and said second main word line receiving said second signal.

36. The semiconductor memory device according to claim 35, wherein
each of said first switching means includes first conductivity type first transistor means being responsive to the signal on the corresponding one of said select lines and being coupled between said first signal and the corresponding one of said local word lines,
each of said second switching means includes second conductivity type second transistor means being responsive to the signal on the corresponding one of said select lines, and
each of said third switching means includes third transistor means of said second conductivity type being responsive to said second signal.

37. The semiconductor memory device according to claim 26, wherein
each of said first switching means includes first transistor means being responsive to said second signal, and
each of said second switching means includes second transistor means having the same conductivity type as that of said first transistor means and being responsive to said first signal.

38. The semiconductor memory device according to claim 27, wherein
each of said first switching means includes first transistor means being responsive to said first signal, and
each of said second switching means includes second transistor means having the same conductivity type as that of said first transistor means and being responsive to said second signal.

39. A semiconductor memory device comprising:
a first memory cell array block including a plurality of memory cells and a plurality of local word lines arranged in a plurality of rows,
a second memory cell array block including a plurality of memory cells and a plurality of local word lines arranged in a plurality of rows,
said plurality of local word lines in said first memory cell array block and said plurality of local word lines in said second memory cell array corresponding to each other to constitute a plurality of local word line pairs,
a first main word line provided corresponding to said first memory cell array block,
a second main word line provided corresponding to said second memory cell array block,
first selecting means for applying a first select signal to one of said first and second main word lines,
a plurality of select lines provided corresponding to said plurality of local word line pairs,
second selecting means for applying a second select signal to one of said plurality of select lines,
a plurality of first decoder means provided corresponding to said plurality of local word lines in said first memory cell array block,
a plurality of second decoder means provided corresponding to said plurality of local word lines in said second memory cell array block,
each of said first decoder means activating the corresponding one of said local word lines in said first memory cell array block in response to said first select signal applied to said first main word line and said second select signal applied to said corresponding select lines,
each of said plurality of second decoder means activating the corresponding one of said local word lines in the said second memory cell array block in response to said first select signal applied to the said second main word line and said second select signal applied to said corresponding select line.

40. The semiconductor memory device according to claim 39, wherein
each of said plurality of first decoder means includes:
first switching means being rendered conductive when said first main word line is activated, for applying the signal on the corresponding one of said select lines to the corresponding one of said local word lines in said first block, and
second switching means coupled between said corresponding local word line and a potential corresponding to an inactivated state and being rendered conductive when said first main word line is inactivated,
each of said plurality of second decoder means includes:
third switching means being rendered conductive when said second main word line is activated, for applying the signal on the corresponding one of said select lines to the corresponding one of said local word lines in said second block, and
fourth switching means coupled between said corresponding local word line and said potential corresponding to an inactivated state and being rendered conductive when said second main word line is inactivated.

41. A semiconductor memory device according to claim 40, wherein
each of said plurality of first decoder means further includes first forcing means for forcing the potential on said corresponding local word line to said potential corresponding to an inactivated state when at least one of said first main word line and the corresponding one of said select lines is inactivated, and
each of said plurality of second decoder means further includes second forcing means for forcing the potential on said corresponding local word line to said potential corresponding to an inactivated state when at least one of said second main word line and the corresponding one of said select lines is inactivated.

42. The semiconductor memory device according to claim 41, wherein
each of said first forcing means includes fifth switching means being rendered conductive when said first main word line is activated, for applying the signal on the corresponding one of said select lines to said corresponding local word line, and
each of said second forcing means includes sixth switching means being rendered conductive when said second main word line is activated, for applying the signal on the corresponding one of said select lines to said corresponding local word line.

43. The semiconductor memory device according to claim 41, wherein each of said first forcing means includes first resistance means coupled between said corresponding local word line and said potential corresponding to an inactivated state, and each of said second forcing means includes second resistance means coupled between said corresponding local word line and said potential corresponding to an inactivated state.

44. The semiconductor memory device according to claim 40, further comprising signal generating means for generating a signal for once simultaneously rendering conductive all of said second switching means included in said plurality of first decoder means and all of said fourth switching means included in said plurality of second decoder means prior to said operations of said plurality of first decoder means and said plurality of second decoder means.

45. The semiconductor memory device according to claim 42, wherein said first select signal includes first and second signals complementary to each other, said first main word line includes a first signal line receiving said first signal and a second signal line receiving said second signal, and said second main word line includes a third signal line receiving said first signal and a fourth signal line receiving said second signal.

46. The semiconductor memory device according to claim 45, wherein each of said first switching means includes first conductivity type first transistor means being responsive to the signal on said first signal line, each of said second switching means includes second conductivity type second transistor means being responsive to the signal on said first signal line, each of said third switching means includes third transistor means of said first conductivity type being responsive to the signal on said third signal line, each of said fourth switching means includes fourth transistor means of said second conductivity type being responsive to the signal on said third signal line, each of said fifth switching means includes fifth transistor means of said second conductivity type being responsive to the signal on said second signal line, and each of said sixth switching means includes sixth transistor means of said second conductivity type being responsive to the signal on said fourth signal line.

47. The semiconductor memory device according to claim 45, wherein each of said first switching means includes first transistor means being responsive to the signal on said second signal line, each of said second switching means includes second transistor means having the same conductivity type as that of said first transistor means and being responsive to the signal on said first signal line, each of said third switching means includes third transistor means being responsive to the signal on said fourth signal line, each of said fourth switching means includes fourth transistor means having the same conductivity type as that of said third transistor means and being responsive to the signal on said third signal line, each of said fifth switching means includes fifth transistor means having the same conductivity type as those of said first and second transistor means and being responsive to the signal on said second signal line, and each of said sixth switching means includes sixth transistor means having the same conductivity type as those of said first and second transistor means and being responsive to the signal on said fourth signal line.

48. The semiconductor memory device according to claim 45, wherein each of said first switching means includes first conductivity type first transistor means being responsive to the signal on said first signal line, each of said second switching means includes second transistor means of said first conductivity type being responsive to the signal on said second signal line, each of said third switching means includes third transistor means of said first conductivity type being responsive to the signal on said third signal line, each of said fourth switching means includes fourth transistor means of said first conductivity type being responsive to the signal on said fourth signal line, each of said fifth switching means includes second conductivity type fifth transistor means being responsive to the signal on said second signal line, and each of said sixth switching means includes sixth transistor means of said second conductivity type being responsive to the signal on said fourth signal line.

49. The semiconductor memory device according to claim 39, wherein each of said plurality of first decoder means includes:
first switching means being rendered conductive when the corresponding one of said select lines is activated, for applying the signal on said first main word line to the corresponding one of said local word lines in said first block, and
second switching means coupled between said corresponding local word line and a potential corresponding to an inactivated state and being rendered conductive when the corresponding one of said select lines is inactive, each of said plurality of second decoder means includes:
third switching means being rendered conductive when the corresponding one of said select lines is activated, for applying the signal on said second main word line to the corresponding one of said local word lines in said second block, and
fourth switching means coupled between said corresponding local word line and said potential corresponding to an inactivated state and being rendered conductive when the corresponding one of said select lines is inactivated.

50. The semiconductor memory device according to claim 49, wherein each of said plurality of first decoder means further includes first forcing means for forcing the potential on said corresponding local word line to said potential corresponding to an inactivated state when at least one of the corresponding one of said select lines and said first main word line is inactivated, and each of said plurality of second decoder means includes second forcing means for forcing the potential on said corresponding local word line to said potential corresponding to an inactivated state when at least one of the corresponding one of said select lines and said second main word line is inactivated.

51. The semiconductor memory device according to claim 50, wherein each of said first forcing means includes fifth switching means being rendered conductive when the corresponding one of said select lines is inactivated, for applying the signal on said corresponding select line to said corresponding local word line, and each of said second forcing means includes sixth switching means being rendered conductive when the corresponding one of said select lines is inactivated, for applying the signal on said corresponding select line to said corresponding local word line.

52. The semiconductor memory device according to claim 50, wherein each of said first forcing means includes first resistance means coupled between said corresponding local word line and said potential corresponding to an inactivated state, and each of said second forcing means includes second resistance means coupled between said corresponding local word line and said potential corresponding to an inactivated state.

53. The semiconductor memory device according to claim 50, further comprising signal generating means for generating a signal for once simultaneously rendering conductive all of said second switching means included in said plurality of first decoder means and all of said fourth switching means included in said plurality of second decoder means prior to said operations of said plurality of first decoder means and said plurality of second decoder means.

54. The semiconductor memory device according to claim 51, wherein said first select signal includes first and second signals complementary to each other, said first main word line includes a first signal line receiving said first signal and a second signal line receiving said second signal, and said second main word line includes a third signal line receiving said first signal and a fourth signal line receiving said second signal.

55. The semiconductor memory device according to claim 54, wherein each of said first switching means includes first conductivity type first transistor means being responsive to the signal on the corresponding one of said select lines and coupled between said first signal line and the corresponding one of said local word lines, each of said second switching means includes second conductivity type second transistor means being responsive to the signal on the corresponding one of said select lines, each of said third switching means includes third transistor means of said first conductivity type being responsive to the signal on the corresponding one of said select lines and connected between said third signal line and the corresponding one of said local word lines, each of said fourth switching means includes fourth transistor means of said second conductivity type being responsive to the signal on the corresponding one of said select lines, each of said fifth switching means includes fifth transistor means of said second conductivity type being responsive to the signal on said second signal line, and each of said sixth switching means includes sixth transistor means of said second conductivity type being responsive to the signal on said fourth signal line.

56. The semiconductor memory device according to claim 43, wherein each of said first switching means includes first conductivity type first transistor means being responsive to the signal on said first main word line, each of said second switching means includes second conductivity type second transistor means being responsive to the signal on said first main word line, each of said third switching means includes third transistor means of said first conductivity type being responsive to the signal on said second main word line, and each of said fourth switching means includes fourth transistor means of said second conductivity type being responsive to the signal on said second main word line.

57. The semiconductor memory device according to claim 43, wherein said first select signal includes first and second signals complementary to each other, said first main word line includes a first signal line receiving said first signal and a second signal line receiving said second signal, said second main word line includes a third signal line receiving said first signal and a fourth signal line receiving said second signal, each of said first switching means includes first transistor means being responsive to the signal on said first signal line, each of said second switching means includes second transistor means having the same conductivity type as that of said first transistor means and being responsive to the signal on said second signal line, each of said third switching means includes third transistor means being responsive to the signal on said third signal line, and each of said fourth switching means includes fourth transistor means having the same conductivity type as that of said third transistor means and being responsive to the signal on said fourth signal line.

58. The semiconductor memory device according to claim 44, wherein each of said first switching means includes first conductivity type first transistor means being responsive to the signal on said first main word line, each of said second switching means includes second conductivity type second transistor means being responsive to the signal on said first main word line, each of said third switching means includes third transistor means of said first conductivity type being responsive to the signal on said second main word line, and each of said fourth switching means includes fourth transistor means of said second conductivity type being responsive to the signal on said second main word line.

59. The semiconductor memory device according to claim 44, wherein
    said first select signal includes first and second signals complementary to each other,
    said first main word line includes a first signal line receiving said first signal and a second signal line receiving said second signal,
    said second main word line includes a third signal line receiving said first signal and a fourth signal line receiving said second signal,
    each of said first switching means includes first transistor means being responsive to the signal on said first signal line,
    each of said second switching means includes second transistor means having the same conductivity type as that of said first transistor means and being responsive to the signal on said second signal line,
    each of said third switching means includes third transistor means being responsive to the signal on said third signal line, and
    each of said fourth switching means includes fourth transistor means having the same conductivity type as that of said third transistor means and being responsive to the signal on said fourth signal line.

60. The semiconductor memory device according to claim 52, wherein
    each of said first switching means includes first conductivity type first transistor means being responsive to the signal on the corresponding one of said select lines and connected between said first main word line and the corresponding one of said local word lines,
    each of said second switching means includes second conductivity type second transistor means being responsive to the signal on the corresponding one of said select signals,
    each of said third switching means includes third transistor means of said first conductivity type being responsive to the signal on the corresponding one of said select lines and connected between said second main word line and the corresponding one of said local word lines, and
    each of said fourth switching means includes fourth transistor means of said second conductivity type being responsive to the signal on the corresponding one of said select lines.

61. The semiconductor memory device according to claim 53, wherein
    each of said first switching means includes first conductivity type first transistor means being responsive to the signal on the corresponding one of said select lines and connected between said first main word line and the corresponding one of said local word lines,
    each of said second switching means includes second conductivity type second transistor means being responsive to the signal on the corresponding one of said select signals,
    each of said third switching means includes third transistor means of said first conductivity type being responsive to the signal on the corresponding one of said select lines and connected between said second main word line and the corresponding one of said local word lines, and
    each of said fourth switching means includes fourth transistor means of said second conductivity type being responsive to the signal on the corresponding one of said select lines.

62. A semiconductor memory device having a decoder responsive to first and second select signals to activate or deactivate a predetermined select signal, said decoder comprising:
    first, second, third and fourth lines carrying, respectively, the first select signal, the second select signal, the predetermined select signal and a ground potential;
    first field effect transistor of p-type polarity having source, drain and gate electrodes
    a second field effect transistor of n-type polarity having source, drain and gate electrodes;
    the gates being connected to each other and to the second line for receiving said second select line;
    the source of said second field effect transistor being connected to the fourth line for receiving the ground potential;
    the source of said first field effect transistor connected to said first line for receiving said first select signal;
    the drains of said first and second field effect transistors being connected to each other and to said third line for supplying said predetermined select signal; and
    forcing means for rendering the said second select signal inactive before the first select signal becomes active for decoder operation.

* * * * *